US012225680B2

(12) United States Patent
Linares et al.

(10) Patent No.: US 12,225,680 B2
(45) Date of Patent: Feb. 11, 2025

(54) FUNCTIONAL UNIT FOR ELECTRICAL CONNECTION ENCLOSURE, AND ELECTRICAL CONNECTION ENCLOSURE COMPRISING SUCH A FUNCTIONAL UNIT

(71) Applicant: Schneider Electric Industries SAS, Rueil-Malmaison (FR)

(72) Inventors: Louis Linares, La Terrasse (FR); Olivier Wasner, Eybens (FR); Charles Gailla, Meylan (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 171 days.

(21) Appl. No.: 17/699,575

(22) Filed: Mar. 21, 2022

(65) Prior Publication Data

US 2022/0312632 A1     Sep. 29, 2022

(30) Foreign Application Priority Data

Mar. 26, 2021    (FR) ...................................... 2103083

(51) Int. Cl.
*H05K 7/20* (2006.01)
*H02B 1/56* (2006.01)
*H05K 5/02* (2006.01)

(52) U.S. Cl.
CPC ......... *H05K 7/20145* (2013.01); *H02B 1/565* (2013.01); *H05K 5/0213* (2013.01); *H05K 7/20154* (2013.01)

(58) Field of Classification Search
CPC ........ H02B 1/56–565; H05K 7/20136–20154; H05K 7/20572–20581; H05K 7/20736; H05K 5/0213
See application file for complete search history.

(56) References Cited

U.S. PATENT DOCUMENTS 6,643,123 B2 * 11/2003 Hartel .................... H02B 1/565
                                                                    361/678
7,106,586 B2 *  9/2006 Yu ............................ G06F 1/20
                                                                    361/679.48

(Continued)

FOREIGN PATENT DOCUMENTS

| CN | 209046103 U | 6/2019 |
| JP | S5373428 U  | 6/1978 |
| JP | H08289422 A | 11/1996 |

OTHER PUBLICATIONS

French Search Report dated Nov. 11, 2021 for corresponding French Patent Application No. 2103083, 2 pages.

*Primary Examiner* — Robert J Hoffberg
(74) *Attorney, Agent, or Firm* — Troutman Pepper Locke

(57) ABSTRACT

A monitoring-and-control drawer (138) for an electrical connection enclosure comprises a front part (300) comprising a ventilation grille (326), a back portion (348) at which a back ventilation region is provided and functional elements (362). The heat generated by the functional elements is removed by an air flow (FL1) which enters the functional unit via each air grating in the front part and re-emerges from the functional unit via the back ventilation region, having passed right through the functional unit. The back portion belongs to a base of the drawer to which the functional elements are attached and comprises a group of upstream connectors (354) connected to an electricity source, a group of downstream connectors (356) connected to an electrical load and a ventilation orifice (358) which is part of to the back ventilation region and which is located between the group of upstream connectors and the group of downstream connectors.

9 Claims, 43 Drawing Sheets

(56) References Cited

U.S. PATENT DOCUMENTS

| | | | |
|---|---|---|---|
| 7,180,739 B2* | 2/2007 | Kajiura | H05K 7/20918 |
| | | | 174/16.3 |
| 7,508,663 B2* | 3/2009 | Coglitore | H05K 7/20736 |
| | | | 165/122 |
| 8,842,432 B2* | 9/2014 | Ehlen | H05K 7/20563 |
| | | | 165/122 |
| 9,007,746 B2* | 4/2015 | Rajvanshi | H02B 1/565 |
| | | | 165/122 |
| 10,356,961 B2 | 7/2019 | Pluszczyk | |
| 10,986,752 B1* | 4/2021 | Beall | H05K 7/20181 |
| 11,683,902 B2* | 6/2023 | Comtois | H02B 11/10 |
| | | | 361/679.02 |
| 11,690,192 B2* | 6/2023 | Linares | H05K 7/1465 |
| | | | 361/679.02 |
| 2003/0035264 A1 | 2/2003 | Hartel et al. | |
| 2020/0091688 A1 | 3/2020 | Shindo | |
| 2022/0308642 A1* | 9/2022 | Comtois | H02B 11/10 |
| 2022/0311221 A1* | 9/2022 | Linares | H02B 1/30 |
| 2022/0312609 A1* | 9/2022 | Comtois | H05K 5/0247 |
| 2022/0312616 A1* | 9/2022 | Comtois | H02B 11/133 |
| 2022/0312620 A1* | 9/2022 | Linares | H05K 7/1475 |

* cited by examiner

FUNCTIONAL UNIT FOR ELECTRICAL CONNECTION ENCLOSURE, AND ELECTRICAL CONNECTION ENCLOSURE COMPRISING SUCH A FUNCTIONAL UNIT

TECHNICAL FIELD

The present invention relates to a monitoring-and-control drawer for an electrical connection enclosure and to an electrical connection enclosure comprising at least one such monitoring-and-control drawer.

BACKGROUND

In the field of electrical enclosures, it is known practice to install in an electrical connection enclosure one or more functional units, such as monitoring-and-control drawers. These functional units comprise, for example, electrical components which allow external electrical loads to be connected or the electrical enclosure to be controlled. During operation, these electrical components generate heat. It is known practice to equip the front face of such functional units with ventilation grilles and potentially with fans, allowing the air inside the functional unit to be replenished and thereby remove the heat produced by electrical components. However, the flow of air through such a functional unit is not optimized and does not allow the heat produced to be removed effectively. Air enters and exits these units via their front face, which is not very effective in terms of cooling because the route followed by the air is complex, and it is therefore slowed down.

JP-U-S53 73428 describes an electrical enclosure comprising a functional unit cooled by a flow of air entering through its front face and leaving through its rear face. This air flow passes through the functional unit in an upward direction, so that turning the functional unit over is not possible without degrading the circulation of the air flow, which naturally tends to rise as it heats up. The functional unit is then not modular, as it is not possible to adapt its spatial orientation to the specific needs of each enclosure.

SUMMARY

It is these drawbacks that the invention more particularly aims to overcome by proposing a monitoring-and-control drawer of which the heat management is improved while remaining modular.

To that end, the invention relates to a monitoring-and-control drawer for an electrical connection enclosure comprising a frontal portion, a back portion and functional elements, the functional elements generating heat. The frontal portion of the monitoring-and-control drawer comprises at least one ventilation grille; the monitoring-and-control drawer comprises a back ventilation region formed at the level of the back portion; the heat generated by the functional elements of the monitoring-and-control drawer is removed by the air flow flowing through the monitoring-and-control drawer; and the air flow enters into the monitoring-and-control drawer via each ventilation grille in the frontal portion and exits from the monitoring-and-control drawer via the back ventilation region, going through the monitoring-and-control drawer from one side to the other. The monitoring-and-control drawer is configured to be connected on the one hand to an electricity source and on the other hand to an electrical load, the functional elements being configured to control the electrical load. The monitoring-and-control drawer is configured to be able to be inserted into and removed from the electrical connection enclosure by sliding.

According to the invention, the monitoring-and-control drawer comprises a horizontal base on which the functional elements are attached, and a cover, the back portion of the monitoring-and-control drawer is part of the base and comprises a group of upstream connectors, a group of downstream connectors and a ventilation orifice which is part of the back ventilation region, the upstream connectors and the downstream connectors allows the monitoring-and-control drawer to be connected to the electricity source and to the electrical load respectively, and the ventilation orifice is located between the group of upstream connectors and the group of downstream connectors.

By virtue of the invention, an air flow passes through the functional unit from one side to the other which allows the heat produced by the functional elements to be removed effectively. In addition, the control drawer is easily flipped over without reducing the cooling performance of the airflow, making the control drawer particularly modular.

According to some advantageous but non-mandatory aspects of the invention, the monitoring-and-control drawer incorporates one or more of the following features, either alone or in any technically permissible combination:

- The monitoring-and-control drawer is configured so that the air flow passes through the monitoring-and-control drawer without significant change in direction.
- The monitoring-and-control drawer comprises at least one fan installed in order to force the air flow through the monitoring-and-control drawer and arranged in the back ventilation region and/or on the ventilation grille of the frontal portion.
- The monitoring-and-control drawer comprises a control circuit board and the one or more fans are controlled by the control circuit board.
- The monitoring-and-control drawer comprises at least one radiator arranged on at least one functional element and configured to improve the exchange of heat with the air flow and, preferably, comprises at least one deflector configured to direct the air flow towards the one or more radiators.

According to another aspect, the invention relates to an electrical connection enclosure. According to the invention, the electrical enclosure comprises at least one monitoring-and-control drawer as described above, a back face of the electrical enclosure comprises ventilation grilles and the air flow exiting from each monitoring-and-control drawer exits from the electrical enclosure via the ventilation grilles.

This electrical connection enclosure has the same advantages as those mentioned above with respect to the monitoring-and-control drawer of the invention.

According to another aspect, the invention also relates to an electrical connection enclosure. According to the invention, the electrical enclosure comprises at least one monitoring-and-control drawer as described above, the electrical enclosure comprises at least one chimney for the escape of hot air, the air flow from each monitoring-and-control drawer exits into the chimney for the escape of hot air and the hot air from each monitoring-and-control drawer escapes via an upper face of the escape chimney.

Advantageously, this electrical connection enclosure comprises at least one extraction fan, each extraction fan being arranged on the upper face of an escape chimney.

This electrical connection enclosure has the same advantages as those mentioned above with respect to the monitoring-and-control drawer of the invention.

BRIEF DESCRIPTION OF THE DRAWINGS

The invention will be better understood and other advantages thereof will become more clearly apparent in the light of the following description of one embodiment of an electrical connection enclosure and of a monitoring-and-control drawer in accordance with its principle, given solely by way of example and with reference to the appended drawings, in which.

DETAILED DESCRIPTION

Figure 1:
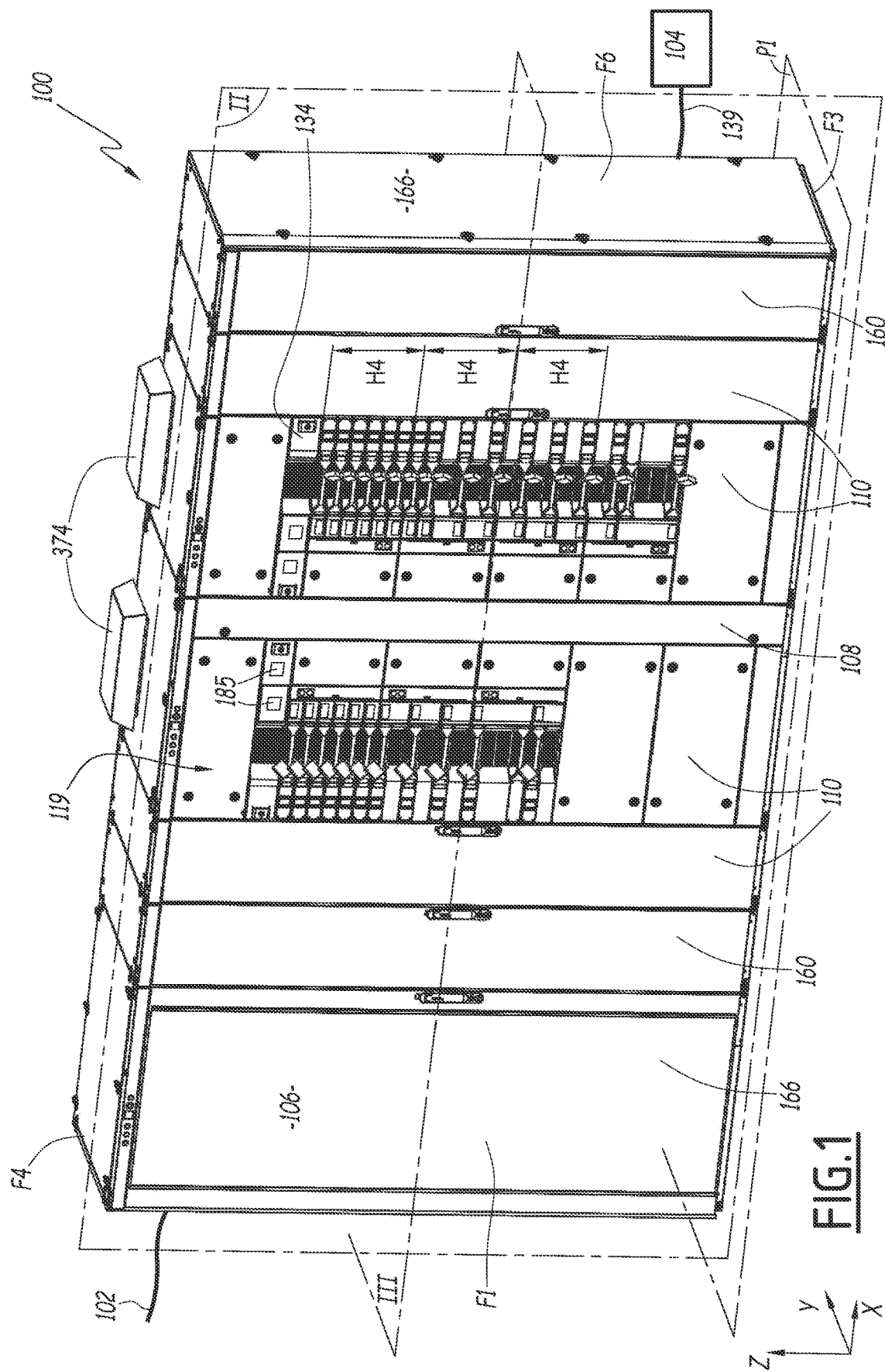
FIG. 1 is a perspective view of an electrical enclosure in accordance with the invention.

An electrical enclosure 100 is shown in FIGS. 1 to 5. This electrical enclosure is intended to be integrated into an electrical network (partially shown). This electrical network comprises, on the one hand, upstream of the electrical enclosure 100, power supply cables 102 coming for example from a transformer station and, on the other hand, downstream of the electrical enclosure, one or more electrical loads 104.

The electrical enclosure 100 is a connection enclosure configured to connect the electrical loads 104 to the power supply cables 102.

In the installed configuration of the electrical enclosure 100, the enclosure rests on a horizontal surface represented by a plane P1. In practice, the plane P1 is for example the floor of a building in which the electrical enclosure 100 is installed.

A longitudinal X-axis of the electrical enclosure 100 is defined as being the axis of the largest dimension of the electrical enclosure 100, in practice its length, a transverse Y-axis as being the axis of the smallest dimension of the electrical enclosure 100 and perpendicular to the X-axis, in practice its width, and a vertical Z-axis as being the third axis of an orthogonal coordinate system comprising the X- and Y-axes.

The orientation of the X-, Y- and Z-axes is rigidly linked to the orientation of the electrical enclosure 100. The orientation of the electrical enclosure 100 described in the present disclosure corresponds to its installed configuration. It is therefore understood that the orientation of the X-, Y- and Z-axes varies when the orientation of the electrical enclosure 100 varies. For example, the Z-axis might not be vertical when the enclosure 100 is not in the installed configuration, for example when it is being transported. The modifiers "top", "bottom" and "vertical" used throughout the rest of the disclosure are meant relative to the Z-axis.

In the installed configuration described here, the plane formed by the X- and Y-axes is horizontal and parallel to the plane P1, while the Z-axis is perpendicular to this plane. The modifier "horizontal" used throughout the rest of the disclosure applies to any element contained in a plane parallel to the plane formed by the X- and Y-axes, in the installed configuration of the electrical enclosure 100. The modifiers "left" and "right" are meant relative to the X-axis and the modifiers "front" and "back" are meant relative to the Y-axis.

The relative positioning of the parts and their orientation described below are given by way of example only and are not limiting. Unless explicitly mentioned otherwise, they are meant in the mounted and installed configuration of the electrical enclosure 100. Thus, when mention is made of the orientation of a part in relation to the X-, Y- and/or Z-axes, it is meant in the mounted configuration of the enclosure. When the enclosure 100 is stored, transported, unassembled or being assembled, among other examples, the orientation of the parts and their relative positioning may vary.

"F1" denotes the front face of the enclosure 100, "F2" denotes its back face, "F3" denotes its lower face, "F4" denotes its upper face, "F5" denotes its left face and "F6" denotes its right face. These faces F1 to F6 are overall planar. In practice, the face F3 of the enclosure is therefore arranged on the plane P1.

The power supply cable 102 delivers to the electrical enclosure 100 a main electrical power supply, preferably with a voltage of 400 V and which is three-phase with neutral, preferably at a frequency of 50 Hz. As a variant, the power supply cable 102 delivers a three-phase current without neutral, or a single-phase current.

The electrical loads 104 may for example be electric motors, such as three-phase motors, electricity distribution networks, or drivable electrical loads, such as batteries or photovoltaic panels.

As can be seen in FIG. 1, the electrical enclosure 100 comprises a power supply column 106, at least one electrical distributing column 108 and at least one connection column 110.

The power supply 106, distribution 108 and connection 110 columns are juxtaposed along the X-axis.

In the example shown, the electrical enclosure 100 comprises an electrical distributing column 108 and two connection columns 110, arranged on either side of the electrical distributing column 108. In practice, a connection column 110 is always juxtaposed with an electrical distributing column 108. An electrical distributing column 108 is always juxtaposed with one or with two connection columns 110.

Figure 3:
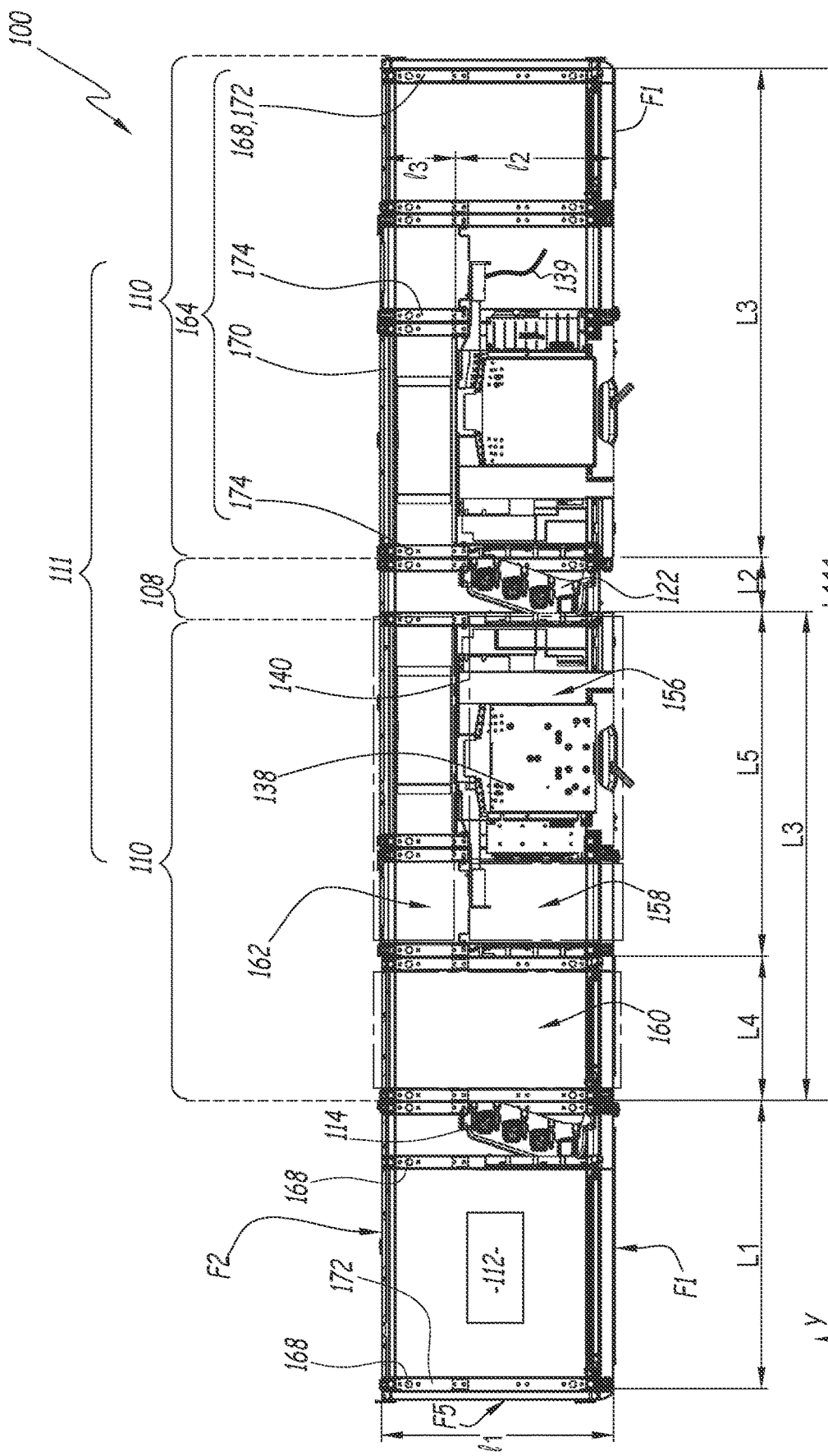
FIG. 3 is a horizontal section of a portion of the electrical enclosure of FIG. 1 along the plane III.

As can be seen in FIG. 3, the association of an electrical distributing column 108 and of one or of two connection columns 110 forms a functional column 111.

When a functional column 111 comprises two connection columns 110, these two columns are located respectively on either side, namely to the left and to the right in FIGS. 1 to 5, of the electrical distributing column 108. When a functional column 111 comprises just one connection column 110, this column is located indiscriminately, on one side or on the other, namely to the left or to the right in FIGS. 1 to 5, of the electrical distributing column 108.

Two other embodiments of a functional column 111 are visible in FIGS. 4 and 5 and are described below.

Figure 2:
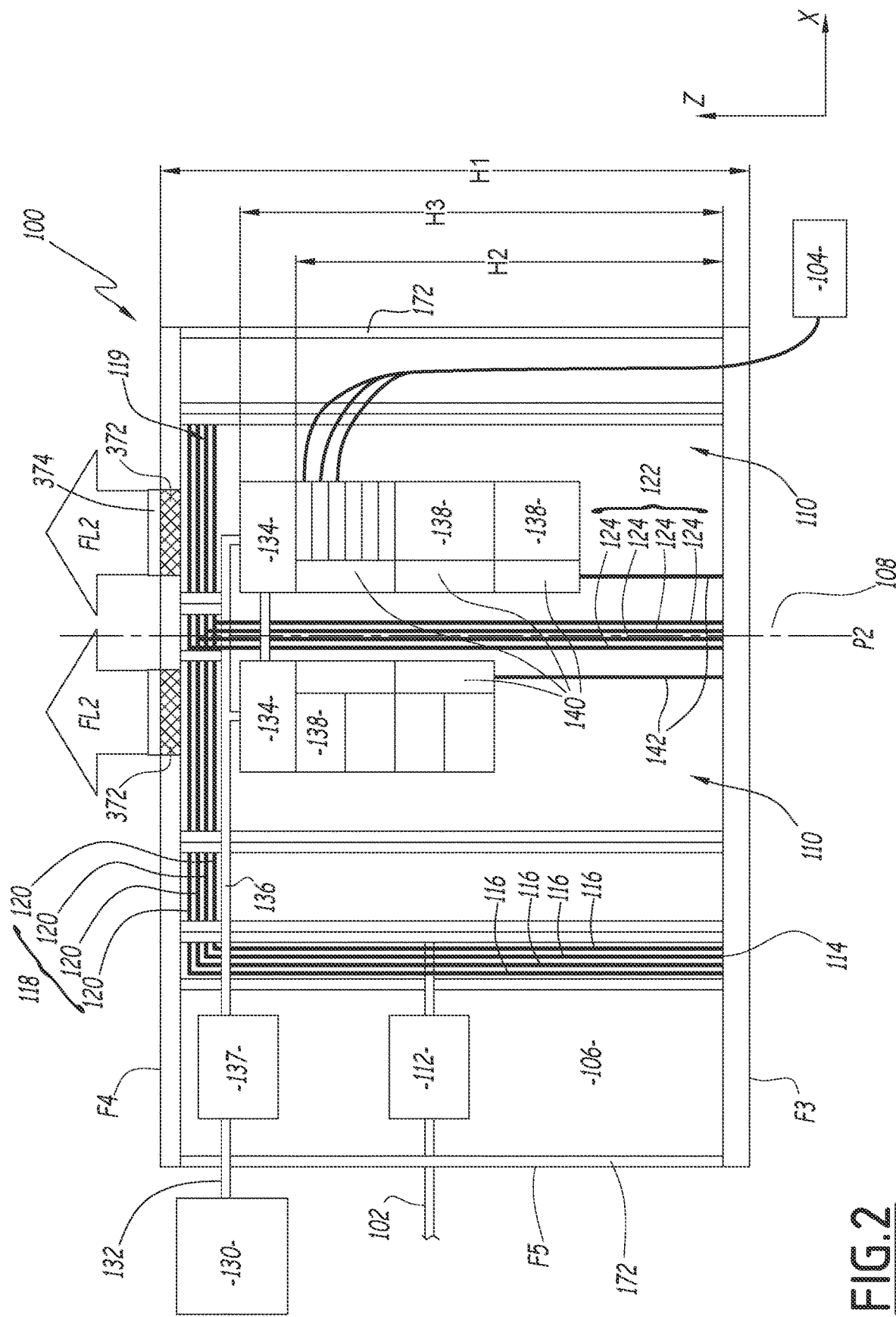
FIG. 2 is a longitudinal section of the electrical enclosure of FIG. 1 along the plane II.

In the example shown in FIGS. 1 to 3, the electrical enclosure 100 comprises one functional column 111.

As a variant (not shown) of the invention, the electrical enclosure 100 comprises a plurality of functional columns 111, juxtaposed along the X-axis.

In the example shown, a functional column 111 has a height H1, measured along the Z-axis, of 2000 mm. As a variant, this height is different, for example 1500 mm or 2500 mm.

The height H1 also corresponds to the height of the electrical enclosure 100.

The power supply column 106 makes it possible to supply all of the electrical enclosure 100 with electrical power from the power supply cable 102. Preferably, the power supply column is arranged at one longitudinal end of the enclosure 100, like in the example shown, where the power supply column is to the left of the enclosure 100.

As can be seen in FIG. 2, in the power supply column 106, each phase and the neutral of the power supply cable 102 are connected to an input of a circuit breaker 112.

As can be seen in FIGS. 2 and 3, the power supply column 106 also comprises a set of power supply busbars 114 comprising a plurality of power supply busbars 116. Each output of the circuit breaker 112 is connected to a power supply busbar 116. Thus, in the example of an electrical enclosure 100 supplied with three-phase current with neutral, the set of busbars 114 of the column 106 comprises four power supply busbars 116, corresponding to the three phases and to the neutral of the supply current.

The set of power supply busbars 114 is connected to a horizontal set of busbars 118. The horizontal set of busbars 118 comprises a plurality of horizontal busbars 120, in practice the same number of horizontal busbars 120 and of busbars 116. Thus, each busbar 116 of the set of power supply busbars 114 is connected to a busbar 120 of the horizontal set of busbars 118.

The horizontal set of busbars 118 extends along the longitudinal X-axis of the electrical enclosure 100 and makes it possible to supply power to each electrical distributing column 108 of the enclosure. A horizontal duct 119 is produced along the entire length of the electrical enclosure 100 and accommodates the horizontal set of busbars 118.

In the example of FIGS. 1 to 3, the horizontal duct 119 is positioned at the top end of the electrical enclosure 100. As a variant (not shown) of the invention, the horizontal duct 119 is positioned at the bottom end of the electrical enclosure 100.

Each electrical distributing column 108 comprises a vertical set of busbars 122 which makes it possible to supply power to the or each connection column 110 adjacent to each electrical distributing column 108. In the example shown, the enclosure 100 therefore comprises a vertical set of busbars which makes it possible to supply power to the two connection columns 110.

Each vertical set of busbars 122 comprises a plurality of vertical busbars 124, in practice the same number of vertical busbars 124 and of horizontal busbars 120. Each vertical busbar 124 is connected to a horizontal busbar 120. The connection of the vertical set of busbars 122 to the horizontal set of busbars 118 takes place in the horizontal duct 119.

The power supply busbars 116, the horizontal busbars 120 and the vertical busbars 124 are made of an electrically conductive material, for example of copper, and are preferably flat busbars. Preferably, they have a cross section of between 250 and 3000 mm².

The assembly of a power supply busbar 116, of a horizontal busbar 120 and of a vertical busbar 124 per electrical distributing column 108 forms an electrical power supply line.

In the example shown, the enclosure 100 comprises four electrical power supply lines, corresponding to the three phases and to the neutral of the supply current coming from the cable 102. Other variants are conceivable, for example an electrical enclosure 100 supplied with single-phase current or with three-phase current without neutral, comprising two busbars and three busbars per set of busbars, respectively.

The circuit breaker 112 is connected between the power supply cable 102 and the electrical power supply lines and therefore makes it possible to cut the supply of power to each electrical power supply line. The circuit breaker 112 is therefore a protection member for protecting the electrical enclosure 100.

Each connection column 110 allows the electrical connection of one or more electrical loads 104 to the electrical enclosure 100 and makes it possible to monitor the electrical loads 104 which are connected thereto.

Each connection column 110 comprises a portion of the horizontal duct 119. This portion of the horizontal duct 119 extends over the entire length of the connection column 110, along the X-axis, and accommodates a portion of the horizontal set of busbars 118.

The electrical enclosure 100 is monitored by an industrial computer 130, shown only in FIG. 2 for clarity of the drawing, which is connected to the electrical enclosure by communication cables 132. This industrial computer makes it possible to control the connection columns 110.

In practice, the industrial computer 130 comprises a computing unit (not shown) which executes software for managing the electrical enclosure 100.

As a variant, the industrial computer 130 is replaced with a real-time supervisory control and data acquisition or "SCADA" system, which supervises the operation of the electrical enclosure 100, or the computer is integrated into such a system.

Each connection column 110 comprises a communication module 134. As can be seen in FIG. 2, the communication module 134 is positioned close to the top end of the connection column 110, and close to the horizontal duct 119.

As a variant (not shown) of the invention, the communication module 134 is positioned at the bottom end of the column.

As a variant (not shown) of the invention, when the horizontal duct 119 is positioned at the bottom end of the electrical enclosure 100, the communication module 134 may be positioned either at the top end of the connection column 110, or close to the bottom end of the column, above the horizontal duct.

The communication module 134 makes it possible to centralize all of the information coming from the connection column 110 and to control the connection column. The content and the role of this information are described in detail below.

The communication module 134 communicates with the industrial computer 130 via communication cables 132, on the one hand to transmit information on the operation of the connection column 110 and on the other hand to receive the commands from the industrial computer that have to be transmitted to the connection column.

The communication module 134 of a connection column 110 therefore acts as intermediary between the industrial computer 130 and this connection column 110 and makes it possible to centralize the exchanges between the computer and the column.

Figure 6:
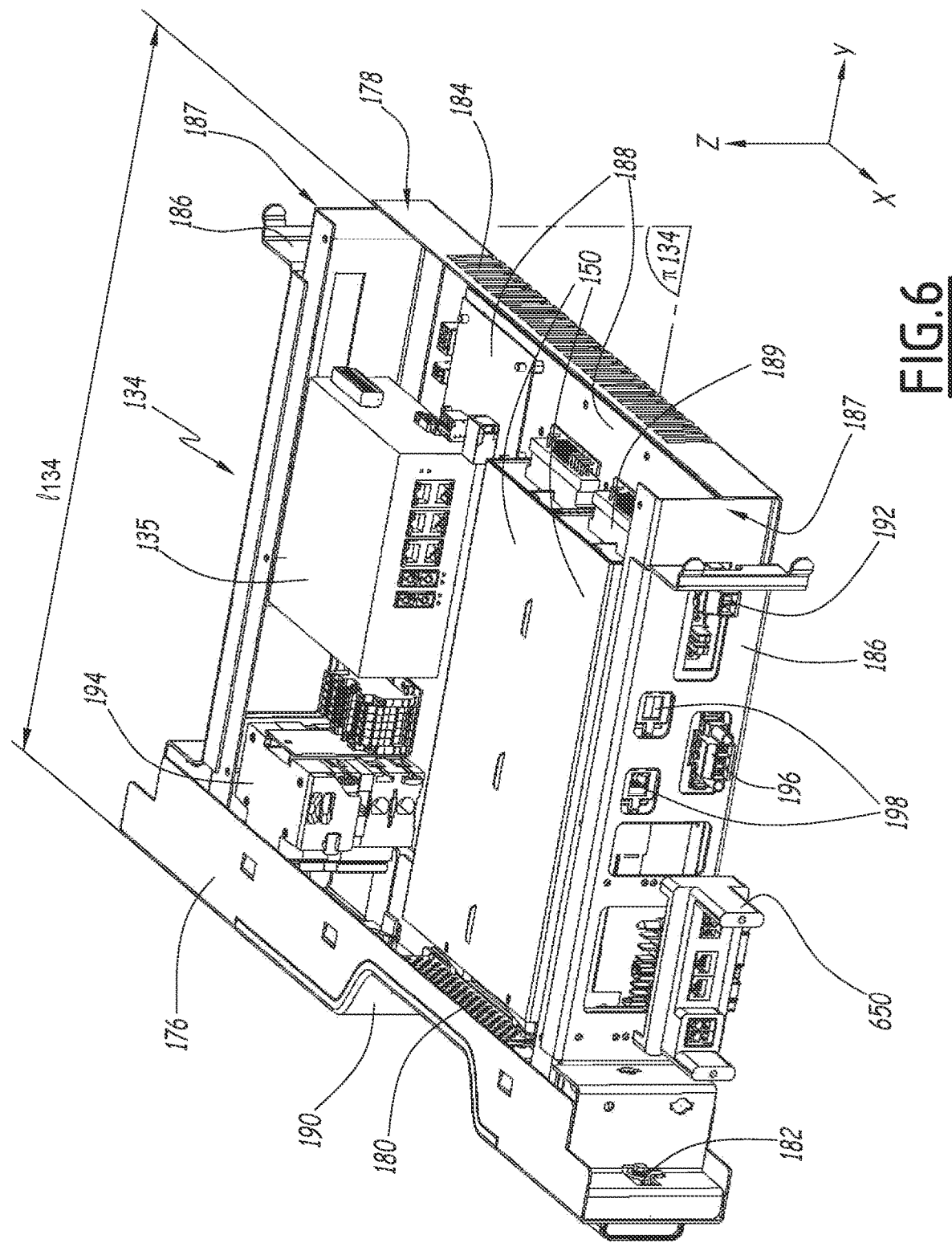
FIG. 6 is a perspective view of a communication module belonging to an enclosure according to one of FIGS. 1 to 5, this module being in accordance with the invention.

As can be seen in FIG. 6, each communication module 134 comprises in practice a controlled network switch 135, called a "managed switch".

When the electrical enclosure 100 comprises a plurality of connection columns 110, like in the example shown in FIGS. 1 to 3, the communication modules 134 of each connection column are connected to one another in series by internal communication cables 136. In practice, it is the managed switches 135 of the communication modules which are connected to one another by the internal communication cables 136.

In addition, in such a configuration, the managed switches of the communication modules 134 are all connected to a central switch 137 by the internal communication cables 136, the central switch 137 preferably being arranged in the power supply column 106. This central switch 137 acts as intermediary between the communication modules 134 and the industrial computer 130, i.e. the information from the industrial computer 130, for example commands, is distributed between the communication modules by the central switch 137 and the information from the communication modules 134 is aggregated by the central switch before being transmitted to the industrial computer.

Thus, each managed switch 135 is connected to the industrial computer 130, independently of the other managed switches 135.

Such a configuration has the advantage of making the operation of the electrical enclosure 100 more reliable. Specifically, in the event of failure of a communication module 134, only the operation of the connection column 110 comprising this module will be affected since, the other fault-free modules being interconnected and connected to the central switch 137, their connection to the industrial computer 130 will not be interrupted by the faulty module.

As a variant, when the electrical enclosure 100 comprises a plurality of connection columns 110, the managed switch 135 of each communication module 134 is directly connected to the industrial computer, without going through a switch of the type of switch 137.

Optionally, when the electrical enclosure 100 comprises just one connection column 110, a central switch 137 is arranged between the communication module and the industrial computer.

In the example shown, the internal communication cables 136 are cables using the Ethernet protocol. As a variant, the internal communication cables 136 use another local area network protocol, such as for example the MODBUS or PROFINET protocol.

To allow the connection of the electrical loads 104, each connection column 110 comprises one or more monitoring-and-control units 138.

Since the electrical loads 104 are remote from the enclosure 100, their connection to the monitoring-and-control units 138 takes place via connection cables 139.

In the example shown, the monitoring-and-control units 138 are monitoring-and-control drawers which may therefore be installed in, and removed from, the connection column 110 simply and quickly. As a variant (not shown) of the invention, the monitoring-and-control units 138 are fixed units of the enclosure, which are assembled during the installation of the enclosure, for example by screwing into the one or more columns 110.

In practice, a monitoring-and-control unit 138 allows the electrical connection of an electrical load 104.

In the example shown, a connection column 110 comprises up to thirty monitoring-and-control units 138 and therefore allows the connection of a maximum of thirty electrical loads 104. A connection column 110 is modular, i.e. it is possible to install therein as many monitoring-and-control units as desired, between one unit and thirty units. The monitoring-and-control units 138 are vertically juxtaposed in the connection column 110.

As a variant, a connection column 110 may comprise more than thirty monitoring-and-control units 138, for example if the height of a monitoring-and-control unit is decreased or if the height of the connection column 110 is increased.

The monitoring-and-control units 138 also allow the electrical loads 104 to which they are connected to be controlled. This control, also called driving, consists, for example, when the electrical load is a motor, in driving this motor, i.e. in starting it up, stopping it and potentially in controlling its speed, or, when the electrical load is a distribution network, in delivering the voltage and the current required for the proper functioning of this distribution network.

Additionally, the monitoring-and-control units 138 also allow the surveillance of the electrical loads 104 to which they are connected. This surveillance consists for example in measuring the voltage and the current delivered to the load 104, or in retrieving information from sensors such as for example position or rotational speed sensors, or temperature sensors when the load 104 is a motor.

Thus, each monitoring-and-control unit 138 may have a role of connecting an electrical load 104, of controlling this load and of monitoring this load. However, depending on the type of electrical load 104 connected to a monitoring-and-control unit 138, this monitoring-and-control unit might not have a role of driving this load, or might not have a role of controlling the load.

As can be seen in FIGS. 2 and 3, each connection column 110 comprises one or more protection units 140. Each protection unit 140 is configured to electrically protect one or more monitoring-and-control units 138 and the electrical loads 104 which are connected to these monitoring-and-control units, in particular in the event of failure of an electrical load 104, such as for example a short circuit.

The protection units 140 are, for example, circuit breakers arranged upstream of the monitoring-and-control units 138 and make it possible to interrupt the electric current supplying the loads 104 via the monitoring-and-control units 138 in the event of an incident, for example in the event of a short circuit. In other words, the protection units 140 control the supply of electricity to the monitoring-and-control units 138.

Thus, the protection units 140 of a functional column 111 are arranged between the monitoring-and-control units 138 and the vertical set of busbars 122 of the electrical distributing column 108 of this functional column 111 and make it possible to supply power to these monitoring-and-control units 138, from said vertical set of busbars 122. The electrical connection of the protection units 140 to the vertical set of busbars 122 takes place, in a known manner, for example via sets of horizontal rigid busbars, sets of flexible busbars or via electrical cables (not shown).

In other words, the vertical set of busbars 122 is a source of electricity for each protection unit 140.

In the case that a protection unit 140 is a circuit breaker, its electrical connection and its operation are identical to those of the circuit breaker 112.

Each protection unit 140 protects one or more monitoring-and-control units 138.

As can be seen in FIG. 2, each connection column 110 comprises a computer bus 142, which connects the communication module 134 of a connection column to all of the monitoring-and-control units 138 of this column. Each monitoring-and-control unit 138 is therefore connected to a communication module 134.

In the example shown, the computer bus 142 is a housing comprising a circuit board, i.e. a printed circuit board, of elongate shape, arranged vertically in the connection column 110. This circuit board comprises electronic circuits 144, or tracks, visible in FIG. 25, allowing the communication, i.e. the exchange of data, in the column for example using the Ethernet protocol, from each monitoring-and-control unit 138 to the managed switch 135 of the communication module 134 and from the managed switch of the communication module to each monitoring-and-control unit. In other words, these data travel through the electronic circuits 144 of the computer bus 142.

By virtue of the computer bus 142, the managed switch 135 of each connection column 110 controls each monitoring-and-control unit 138 of this connection column and aggregates the data from the monitoring-and-control units.

The monitoring-and-control units 138 are connected to the computer bus 142.

Each computer bus 142 also comprises electrical power supply tracks 148, visible in FIG. 25, configured to conduct a first auxiliary voltage, which makes it possible to supply the monitoring-and-control units 138 with the first auxiliary voltage, this first auxiliary voltage being required for the operation of certain components of the monitoring-and-control units 138, described in detail below. This first auxiliary voltage comes from the communication module 134 of each connection column 110. This first auxiliary voltage is for example a DC voltage of 48 V.

As a variant, the first auxiliary voltage is a voltage of another value, such as for example 12 V, 24 V, 110 V DC or 110 VAC.

To deliver this first auxiliary voltage, the communication module 134 comprises at least one power supply block 150.

When the electrical enclosure 100 comprises a plurality of connection columns 110, each communication module 134 comprises at least one power supply block 150.

Figure 7:
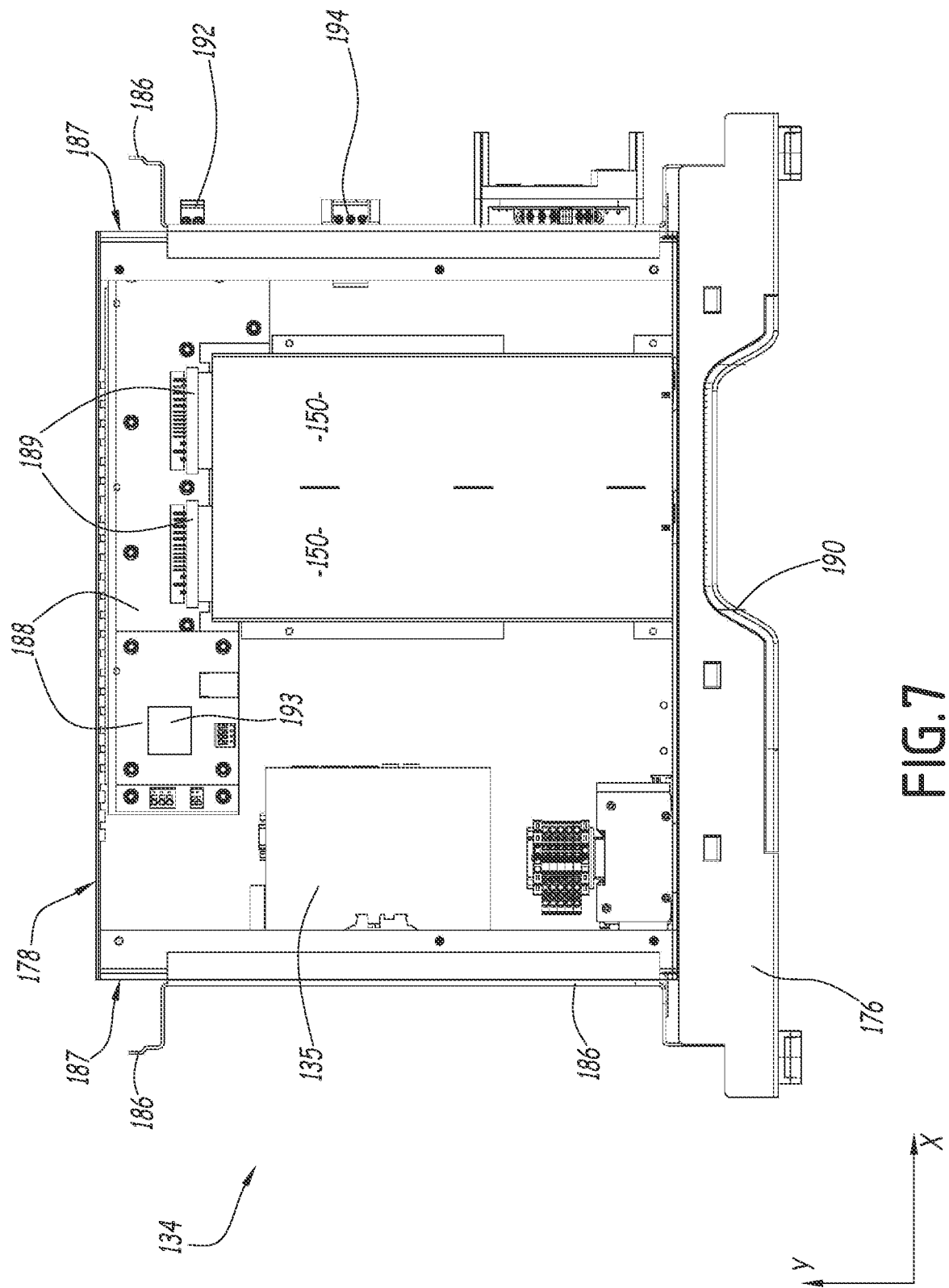
FIG. 7 is a view from above of the communication module of FIG. 6.

Optionally, each communication module 134 comprises two power supply blocks 150 which have redundancy, like in the example shown in FIGS. 6 and 7.

Such a configuration is advantageous since in the event of failure of a power supply block 150, the operation of the communication module 134 containing this block and the operation of the connection column 110 containing this module are not interrupted.

Figure 25:
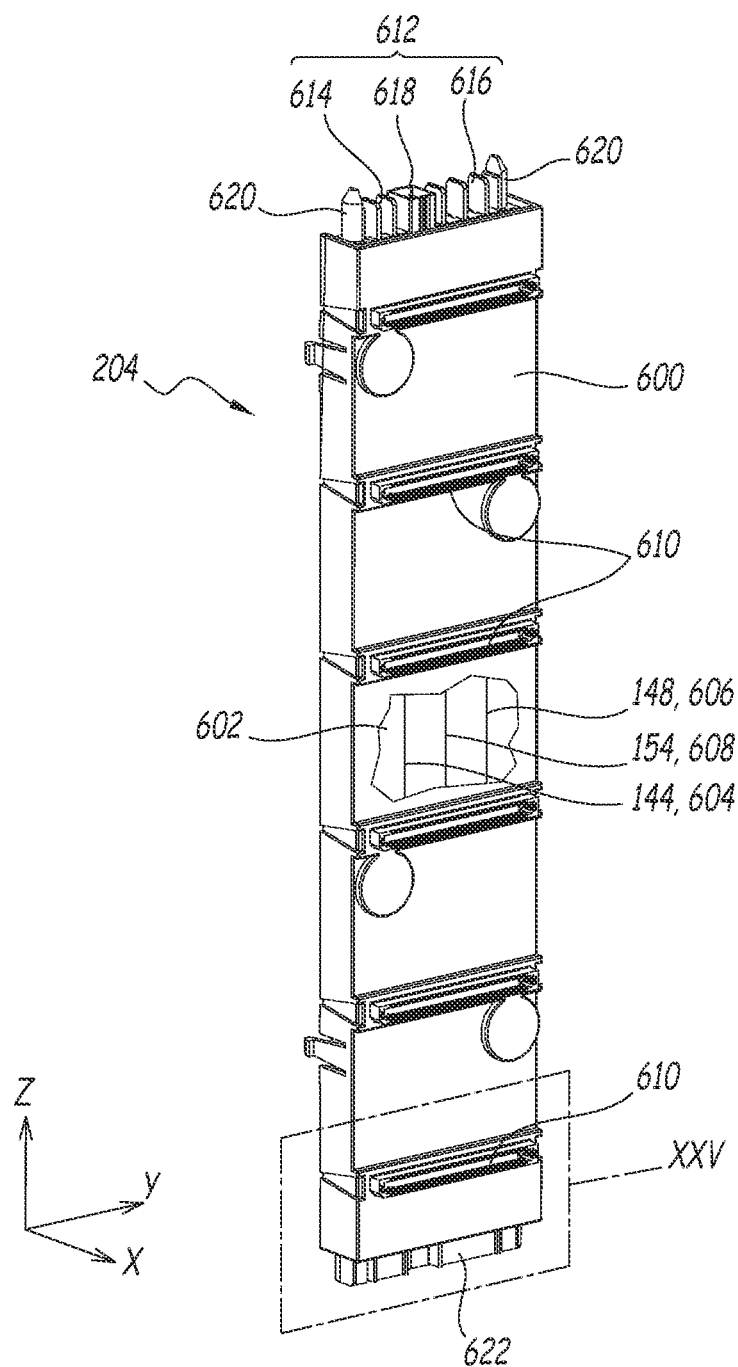
FIG. 25 is a perspective view of a segment of computer bus belonging to an enclosure according to one of FIGS. 1 to 5.

Each computer bus 142 also comprises electrical power supply tracks 154, visible in FIG. 25, configured to conduct a second auxiliary voltage, which is preferably an AC voltage of 230 V. This second auxiliary voltage supplies power to electrical loads 104. This second auxiliary voltage comes from the communication module 134 of each connection column 110.

In one exemplary embodiment, the computer bus 142 is a printed circuit board with six layers, the electrical power supply tracks 148 and 154 and the electronic circuits 144 being distributed between these six layers. As a variant, the computer bus 142 comprises a different number of layers.

As a variant, the electrical power supply tracks 148 and 154 of the computer bus 142 are replaced with electrical cables attached to the computer bus.

By virtue of the computer bus 142, it is possible to centralize on a physical single support the first and second auxiliary electrical circuits and the communication circuits connecting a communication module 134 of a connection column 110 to the monitoring-and-control units 138 of this column.

FIG. 3 illustrates the interior arrangement of a functional column 111 of the electrical enclosure 100 of FIGS. 1 and 2. In particular, FIG. 3 illustrates the different regions that each connection column 110 comprises, namely:
- a functional region 156, which comprises the monitoring-and-control units 138 and the protection units 140 and which is adjacent to the electrical distributing column 108 such that the protection units 140 are arranged between the electrical distributing column and the monitoring-and-control units;
- a connection region 158, in which the connection of the electrical loads 104 to the monitoring-and-control units 138 takes place and which is adjacent to the functional region 156;
- a cabling region 160, in which all of the connection cables 139 are arranged and which is adjacent to the connection region 158; and
- a heat management region 162, the role of which is specified below.

In practice, the functional region 156 and the connection region 158 are located at the front of the connection column 110, i.e. in the vicinity of the face F1 of the enclosure, and the cabling region 160 occupies the entire width of the connection column, which corresponds to the width of the enclosure 100, i.e. from its front face F1 to its back face F2.

In practice, the heat management region 162 is located at the back of the connection column 110, in the vicinity of the back face F2, and extends, lengthwise, i.e. along the X-axis, from the electrical distributing column 108 up to the cabling region 160.

As a variant, the functional column 111 does not comprise a cabling region 160 and all of the connection cables 139 are arranged in the connection region 158.

It is understood that the interior arrangement of the left-hand connection column 110 and the interior arrangement of the right-hand connection column 110 are symmetrical in relation to a plane of symmetry P2 parallel to the vertical plane formed by the Y- and Z-axes and passing through the centre of the electrical distributing column 108.

The functional region 156 extends over a height H2 shorter than the height H1, which makes it possible to install the communication module 134 above the functional region 156, like in the example shown in FIGS. 1 to 3, or below this region.

When a connection column 110 comprises the maximum number of monitoring-and-control units 138, for example thirty units in the example shown, then these monitoring-and-control units occupy most of the functional region 156.

When a connection column 110 does not comprise the maximum number of monitoring-and-control units 138, the functional region 156 is not fully occupied by monitoring-and-control units and comprises a free space. In such a configuration, the communication module 134 may also be installed in the free space of the functional region 156.

In the example shown, the height H2 is 1500 mm; it could be different as a variant.

The connection region 158 extends over a height H3 shorter than the height H1 and greater than the height H2. In practice, the height H3 is equal to the sum of the height H2 and of the height of the communication module 134. Additionally, the height of the computer bus 142 is equal to the height H3.

In the example shown, the height H3 is 1600 mm.

The cabling 160 and heat management 162 regions extend over the entire height H1 of the functional column 111. In practice, the horizontal duct 119 therefore passes through the cabling region 160.

Additionally, the horizontal duct 119 preferably passes above or below the functional 156 and connection 158 regions, so as not to pass through the heat management region 162.

In this configuration, the connection of the connection cables 139 to the monitoring-and-control units 138 takes place via the front face F1 of the enclosure 100.

Preferably, in this configuration, the width of the functional column 111, and therefore of the enclosure 100, denoted by "l1", is 600 mm. The width of the cabling region 160 is therefore also 600 mm. In addition, the width of the functional regions 156 and of the connection regions 158, denoted by "l2", is preferably 400 mm. In such a configuration, the width of the heat management region 162, denoted by "l3", is therefore 200 mm.

Figure 4:
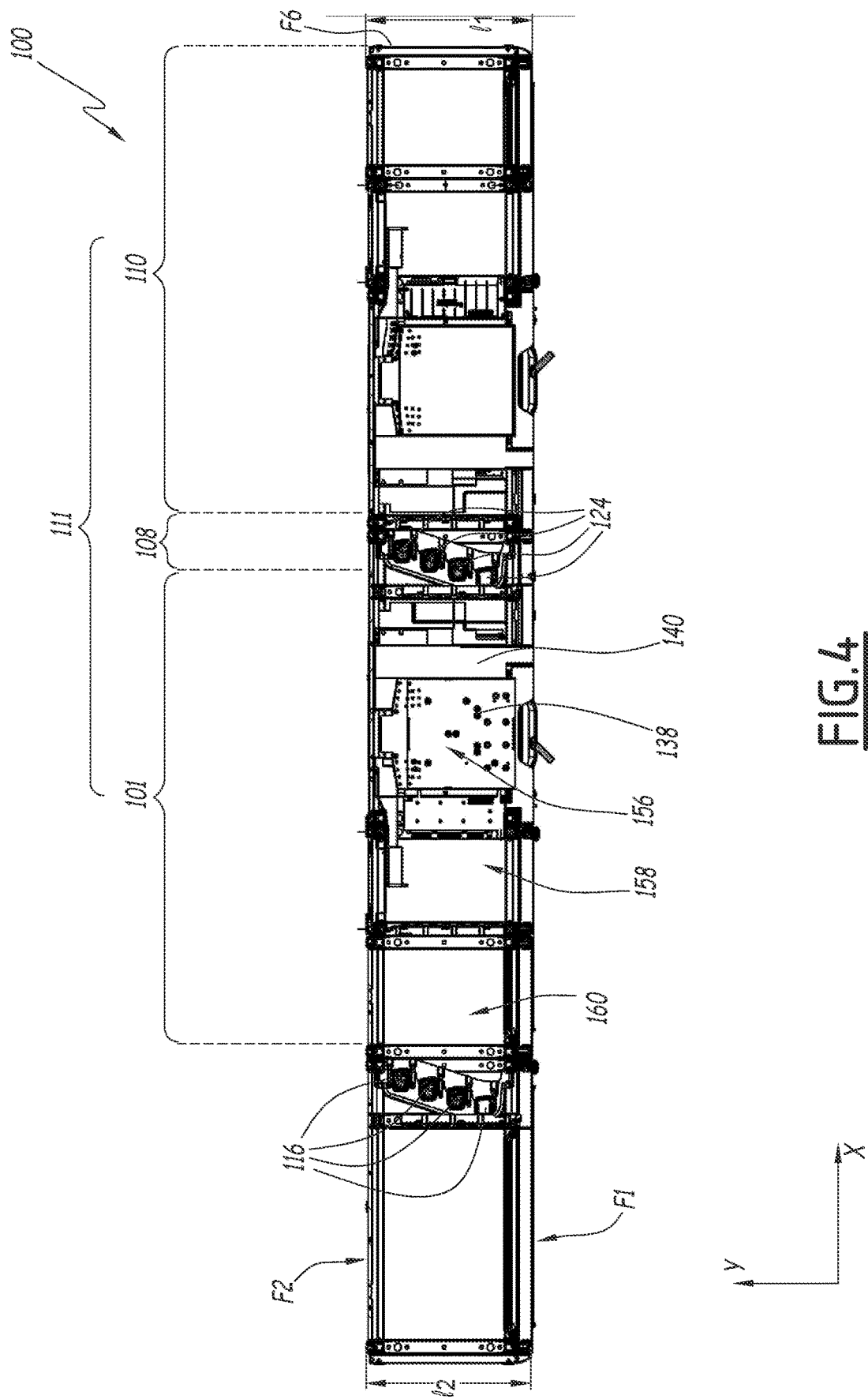
FIG. 4 is a horizontal section, analogous to FIG. 3, of a second electrical enclosure in accordance with the invention.

FIG. 4 illustrates the interior arrangement of a second embodiment of an enclosure 100 with a functional column 111. This second embodiment differs from the embodiment of FIGS. 1 to 3 in that the width l1 of the functional column 111 is equal to the width l2 and in that the connection columns 110 do not comprise a heat management region 162. The arrangement of the functional 156, connection 158 and cabling 160 regions is identical to the arrangement of these regions in the first configuration of the functional column 111, apart from the width of the cabling region 160, which is equal to the width l2. As a variant, the functional column 111 of the second embodiment does not comprise a cabling region 160 and all of the connection cables 139 are arranged in the connection region 158.

Figure 5:
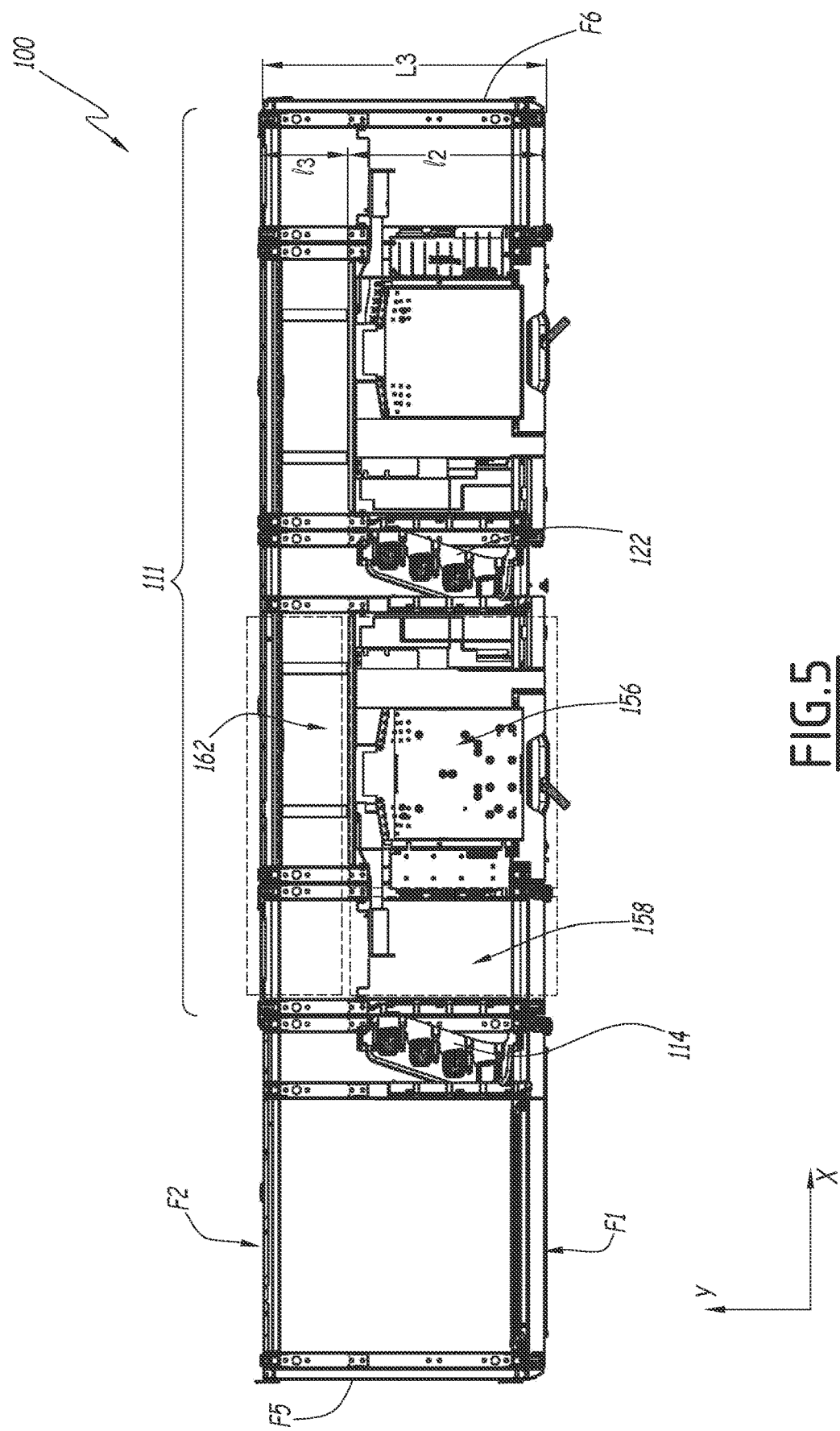
FIG. 5 is a horizontal section, analogous to FIG. 3, of a third electrical enclosure in accordance with the invention.

FIG. 5 illustrates the interior arrangement of a third embodiment of an enclosure 100 with a functional column 111. This third embodiment differs from the embodiment of FIGS. 1 to 3 in that the connection of the connection cables 139 to the monitoring-and-control units 138 takes place via the back face F2 of the enclosure 100. Thus, the functional column 111 does not comprise a dedicated cabling region 160 and the connections are made in the heat management region 162. The widths l1, l2 and n are the same as in the embodiment of FIGS. 1 to 3.

As apparent from the comparison of FIGS. 3 to 5, the interior arrangement of a functional column 111 is adaptable, which confers greater modularity on the electrical enclosure 100.

In particular, the arrangement of a functional column 111 makes it possible to choose to connect the connection cables 139 either via the front of the enclosure 100, or via the back of the enclosure 100.

Preferably, in an enclosure 100, the width of all of the functional columns 111 is equal either to l1, or to l2, and the width of the power supply column 106 is chosen to be equal to the width of the functional columns.

As a variant, it is possible that, in an electrical enclosure 100, some functional columns 111 have a width equal to l1 and other functional columns have a width equal to l2.

The internal communication cables 136 are preferably positioned, depending on the height of the enclosure 100, opposite the horizontal set of busbars 118 in order to avoid any electromagnetic interference. In practice, this means that, preferably, the cables 136 are positioned at the top of the enclosure 100 when the horizontal duct 119 is located at the bottom of the enclosure and these cables are positioned at the bottom of the enclosure when this horizontal duct is located at the top of the enclosure.

As a variant, when the width l1 of a connection column 110 is equal to 600 mm, the internal communication cables 136 may be positioned as close as possible to the back face F2 of the enclosure 100, therefore of the connection column 110, so as to pass through the heat management region 162. In such a configuration, the cables 136 are sufficiently far from the horizontal set of busbars 118 to avoid any electromagnetic interference, even when the cables and the set of busbars are positioned at the top, or at the bottom, of the connection column.

Preferably, as can be seen in FIG. 3, the length L1 of a power supply column 106 is 650 mm, the length L2 of an electrical distributing column 108 is 150 mm, the length L4 of a cabling region 160 is 300 mm and the length L5 of a functional region 156 and of a connection region 158 is 650 mm. Thus, the length L3 is 950 mm.

Thus, the length L111 of a functional column 111 comprising two connection columns 110 is, preferably, equal to 2650 mm in a configuration in which each connection column comprises a cabling region. As a variant, when no connection column comprises a cabling region 160, the length L5 is equal to the length L3 and the length L111 of a functional column 111 is, preferably, equal to 2050 mm.

As a variant, the lengths L1, L2, L3, L4, L5 and L111 are different.

The enclosure 100 comprises in practice a framework 164 and cladding sheets 166.

In the example shown, the framework 164 comprises a plurality of frames 168 and cross members 170, the cross members 170 connecting the frames to one another and each frame being formed by four bars 172.

Among the four bars 172 of a frame 168, two are arranged along the Y-axis and two are arranged along the Z-axis, so as to form a rectangle. Thus, each frame 168 is a rectangle parallel to the plane formed by the Y- and Z-axes.

The cross members 170 extend along the X-axis and make it possible to join the frames 168 to one another. Advantageously, the cross members 170 are arranged at the top end and at the bottom end of the enclosure 100 and thus form top and bottom strips, respectively, which is aesthetically pleasing.

The cladding sheets 166 are attached to the framework 164 so as to close the front F1, back F2, upper F4, left F5 and right F6 faces of the enclosure 100. Thus, the interior of the enclosure 100 is protected.

In the example of FIG. 1, the enclosure 100 does not comprise any cladding sheets 166 over the entire front face F1 of the connection columns 110 of the enclosure 100, such that one face of each communication module 134, of each monitoring-and-control unit 138 and of each protection unit 140 is accessible from the exterior. As a variant, the communication modules and the protection and connection units are protected by cladding sheets 166.

Each cladding sheet 166 may additionally be a door, which allows access to the interior of the enclosure 100. The cladding sheets 166 may be opaque or transparent. FIG. 1 shows the case in which the cladding sheets 166 located at the level of the power supply column 106 and of the cabling regions 160 are opaque.

Additionally, when the enclosure 100 has a width l1 of 600 mm, the framework 164 also comprises reinforcements 174, which extend from the back face F2 of the enclosure over a distance of 200 mm. Thus, the reinforcements 174 extend over the entire width of the heat management region 162, up to the interface between this heat management region and the functional 156 and connection 158 regions.

In practice, each column—power supply, electrical distribution and connection column—of the enclosure 100 comprises an independent framework and the frameworks of two adjacent columns are connected to one another, for example using screws, which allows great modularity in the design and in the assembly of an enclosure 100.

As a variant, each functional column 111 comprises a framework 164 common to the electrical distributing column 108 and to the one or more connection columns 110 of this functional column 111.

As a variant, the design of the framework 164 of the enclosure 100 is different, for example the frames 168 form rectangles parallel to the plane formed by the X- and Z-axes and the cross members 170 extend along the Y-axis.

The detail of a communication module 134 is visible in FIGS. 6 and 7.

The communication module 134 comprises a front face 176 and a back face 178.

In the example shown, between the front face 176 and the back face 178, the communication module extends over a width l134 of 400 mm.

When the communication module is installed on the connection column 110, the front face 176 of the module is at the level of the front face F1 of the column and of the enclosure and the back face 178 of the module is either at the level of the back face of the enclosure, when the enclosure has a width l2 of 400 mm like in the embodiment of FIG. 4, or at the level of the reinforcements 174, when the enclosure 100 has a width l1 of 600 mm, like in the embodiments of FIGS. 1 to 3 and 5.

A front ventilation grille 180 and two locks 182, just one of which is visible in FIG. 6, are made on the front face 176. The locks 182 are arranged symmetrically in relation to a median plane 7134 of the drawer 134 and make it possible to keep the communication module 134 installed in the connection column 110 by cooperating with the framework 164. They are actuable from the exterior of the enclosure 100, via its front face F1.

A back ventilation grille 184 is made on the back face 178. When the enclosure 100 has a width l2 of 400 mm like in the embodiment of FIG. 4, the ventilation grille 184 connects the interior of the communication module to the exterior of the enclosure. When the enclosure 100 has a width n of 600 mm like in the embodiments of FIGS. 1 to 3 and 5, the ventilation grille 184 connects the interior of the communication module to the heat management region 162.

By virtue of the front 180 and back 184 ventilation grilles, the air inside the communication module 134 is continually replenished by natural convection, which makes it possible to cool the communication module and to maintain a temperature inside this module that is compatible with its operation, by removing the heat produced by the electronic components contained in the communication module, and in particular by the power supply blocks 150.

In practice, the air enters via the front ventilation grille 180, is heated by the electronic components of the communication module, which makes it possible to cool these components, and then exits via the back ventilation grille 184.

As a variant, a fan is installed in the communication module 134 in order to force the air to flow from the front to the back of the module. This fan is, for example, installed on the front ventilation grille, or on the back ventilation grille, or borne by a power supply block 150.

The front face 176 of the communication module 134 comprises indicators 185 of the operation of the communication module, visible in FIG. 1. These indicators 185 are for example lights which signal the correct operation of the power supply blocks 150 or a fault, i.e. an interruption in the provision of the first auxiliary voltage.

Each connection column 110 comprises two lateral rails 186, attached to the framework 164. The lateral rails 186 are shown in FIGS. 6 and 7.

The communication module 134 comprises two lateral faces 187, which extend from the front face 176 to the back face 178. These lateral faces 187 cooperate with the lateral rails 186 of the connection column 110, and make it possible to put the communication module 134 in place in the connection column and to remove it by sliding it like a drawer, in a direction parallel to the Y-axis. The installation and the removal of the communication module 134 are therefore quick and easy.

The two power supply blocks 150 with redundancy are connected to a circuit board 188. In practice, the circuit board 188 comprises two connectors 189, onto which the power supply blocks 150 are plugged.

The circuit board 188 makes it possible to control the two power supply blocks 150 and to manage the first auxiliary voltage.

The circuit board 188 is configured to, in the event of one of the two power supply blocks 150 being faulty, warn of this failure, for example by means of an indicator 185, but continue to manage the first auxiliary voltage, delivered by the second, non-faulty power supply block.

The front face 176 of the communication module comprises a cover 190. This cover 190 is removable from the front face 176 and it is arranged facing the two power supply blocks 150. Thus, when the circuit board 188 signals that a power supply block 150 is faulty, it is possible to remove the cover 190 to directly access the faulty power supply block, extract it from the communication module 134 and then replace it with a functional power supply block. This replacement operation therefore takes place without requiring the removal of the communication module 134 from the connection column 110, which makes it possible to carry it out without interrupting the operation of the communication module, the other power supply block of which remains active. This replacement of a power supply block during operation is advantageous since it makes it possible to avoid stopping the operation of the connection column 110.

Additionally, the circuit board 188 supplies first auxiliary voltage to the managed switch 135 to allow the operation of this switch.

The circuit board 188 also supplies first auxiliary voltage to a first connector 192, arranged on a lateral face 187, which makes it possible to connect the first auxiliary voltage to another column of the enclosure 100, for example to the first connector 192 of the communication module 134 of another connection column 110. Thus, in the event of failure of both power supply blocks 150, a communication module 134 is still supplied with first auxiliary voltage by the communication module 134 of another connection column.

As a variant, this connection also makes it possible to avoid installing a power supply block 150 in every communication module 134 of an enclosure 100.

Additionally, the first connector 192 supplies first auxiliary voltage to the computer bus 142.

The circuit board 188 comprises a computing unit 193 which executes software making it possible to control the managed switch 135 and the power supply blocks 150. In practice, the circuit board 188 and the managed switch 135 are connected by an internal communication cable (not shown), for example an Ethernet cable.

The power supply blocks 150 are themselves supplied with the second auxiliary voltage. The second auxiliary voltage therefore makes it possible to supply the power supply blocks 150 and the electrical loads 104 with power.

The communication module 134 comprises a protection housing 194, which is for example a circuit breaker. The protection housing 194 supplies the communication module 134 with second auxiliary voltage. For that, the protection housing 194 is itself supplied with power by being connected to a power source external or internal to the electrical enclosure 100.

In practice, the housing 194 is connected to a second connector 196, arranged on the same lateral face 187 as the first connector 192, which makes it possible to connect the protection housing to the external or internal power source.

As a variant, the protection housing 194 is connected to one vertical busbar 124 of the set of vertical busbars 122 and to a neutral. By connecting to just one vertical busbar of a set of busbars and to a neutral, the housing 194 is supplied with power at a voltage lower than the voltage delivered by the main electrical power supply. For example, when the main electrical power supply is a three-phase power supply which delivers a voltage of 400 V, the auxiliary voltage obtained by connecting to one phase and to a neutral is 230 V.

Advantageously, the protection housing 194 also supplies the computer bus 142 with second auxiliary voltage.

The lateral face 187 which bears the first and second connectors also comprises two communication connectors 198 connected to the managed switch 135. Of these two communication connectors 198, a first connector allows the connection of an internal communication cable 136 connected to the communication module of another connection column 110, in the case that the enclosure 100 comprises a plurality of connection columns 110, and a second connector allows the connection of an internal communication cable 136 connected to the central switch 137. As a variant, the first and the second connectors are each connected to a communication module of another connection column 110, so as to connect three connection columns to one another. As a variant, the communication module 134 comprises a number of communication connectors 198 other than two, for example one or three.

Openings are made in the lateral rails 186, so as to allow access to the connectors 192, 196 and 198 when the communication module is installed on the lateral rails.

A connection column 110 may be configured for a plurality of different uses:

A first configuration in which the connection column allows connection to electric motors, such as for example three-phase motors. Each electric motor is connected to a monitoring-and-control unit. The connection column 110 then makes it possible to supply power to these electric motors and to drive them. In this first configuration, the connection column 110 is then called "motor start-up column".

A second configuration in which the connection column allows connection to downstream electrical distribution circuits, such as for example electrical switchboards or electrical distribution enclosures. The connection column 110 then makes it possible to distribute the power from the power supply cables 102 to a plurality of downstream circuits, each downstream circuit being connected to a monitoring-and-control unit, and to protect these downstream circuits. In this second configuration, the connection column 110 is then called "current distribution column".

A third configuration in which the connection column allows connection to drivable electrical loads, such as for example photovoltaic panels or batteries. Each electrical load is connected to a monitoring-and-control unit 138. The connection column 110 then makes it possible to supply power to these electrical circuits and to drive them. In this third configuration, the connection column 110C is then called "load driving column".

In practice, the configuration and the architecture of the functional region 156, and more particularly of the monitoring-and-control units 138, differ between the three configurations listed above. Additionally, other configurations associated with other uses are conceivable.

The following disclosure details the configuration and the architecture of a motor start-up column 110.

Certain elements mentioned below are described in the context of the motor start-up column, but their application is not limited exclusively to their use in a motor start-up column. Thus, certain elements introduced below could also be applied to elements used in a current distribution column or in a load driving column, for example.

Thus, the following description details the configuration and the architecture of a motor start-up module 200.

The configuration and the architecture of this module are transposable to other configurations, such as for example in the case of a current distribution column, where the motor start-up module then corresponds to a distribution module which makes it possible to distribute an electric current to one or more downstream circuits and to protect these circuits, or in the case of a load driving column, where the motor start-up module then corresponds to a driving module which makes it possible to supply power to electrical loads and to drive them. Other uses are conceivable.

What is meant by "functional module" is any module whose architecture is transposable from the architecture described below of a motor start-up module 200, such as for example a distribution module or a driving module.

Figure 8:
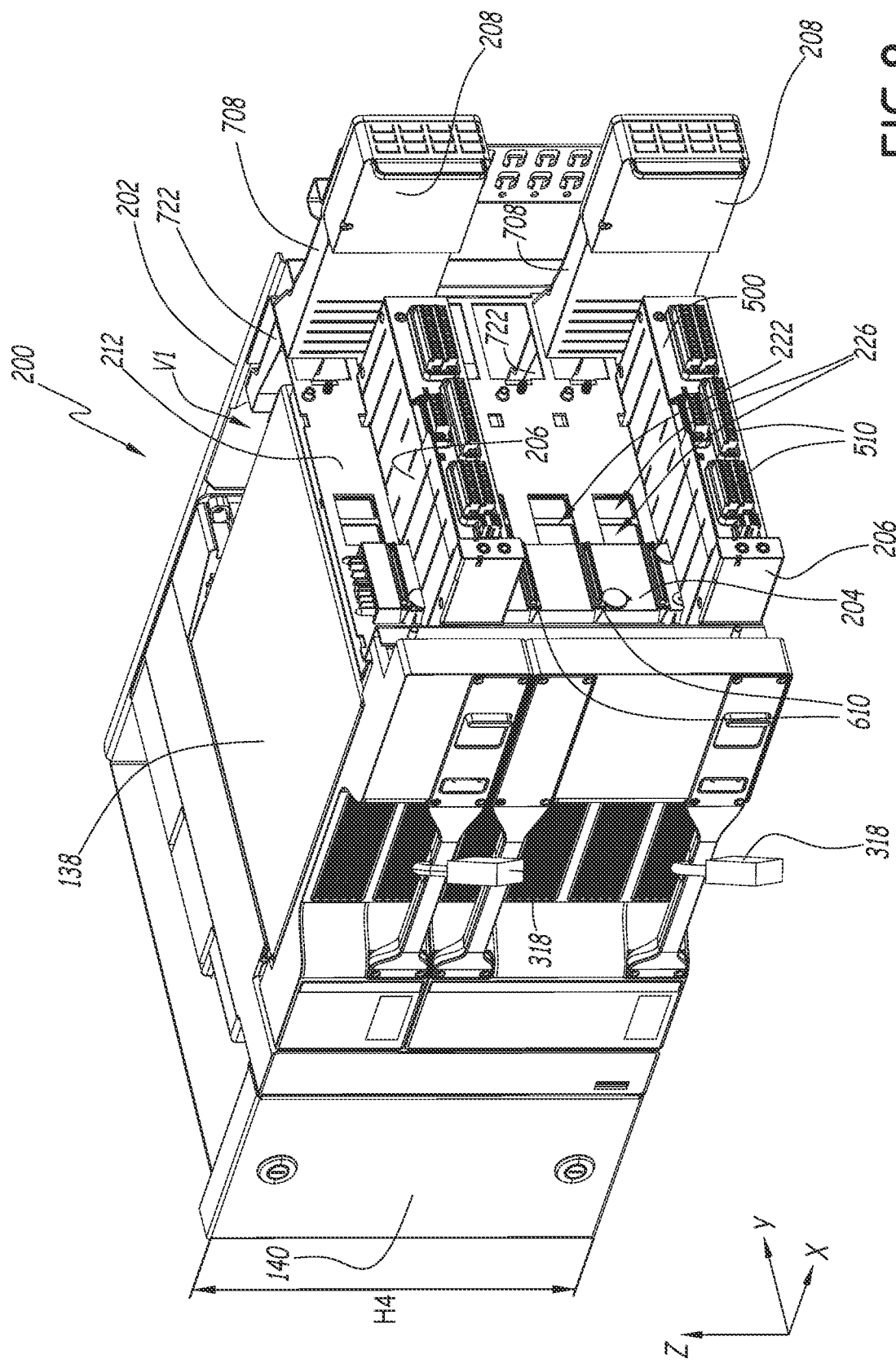
FIG. 8 is a perspective view of one motor start-up module belonging to an enclosure according to one of FIGS. 1 to 5.
Figure 9:
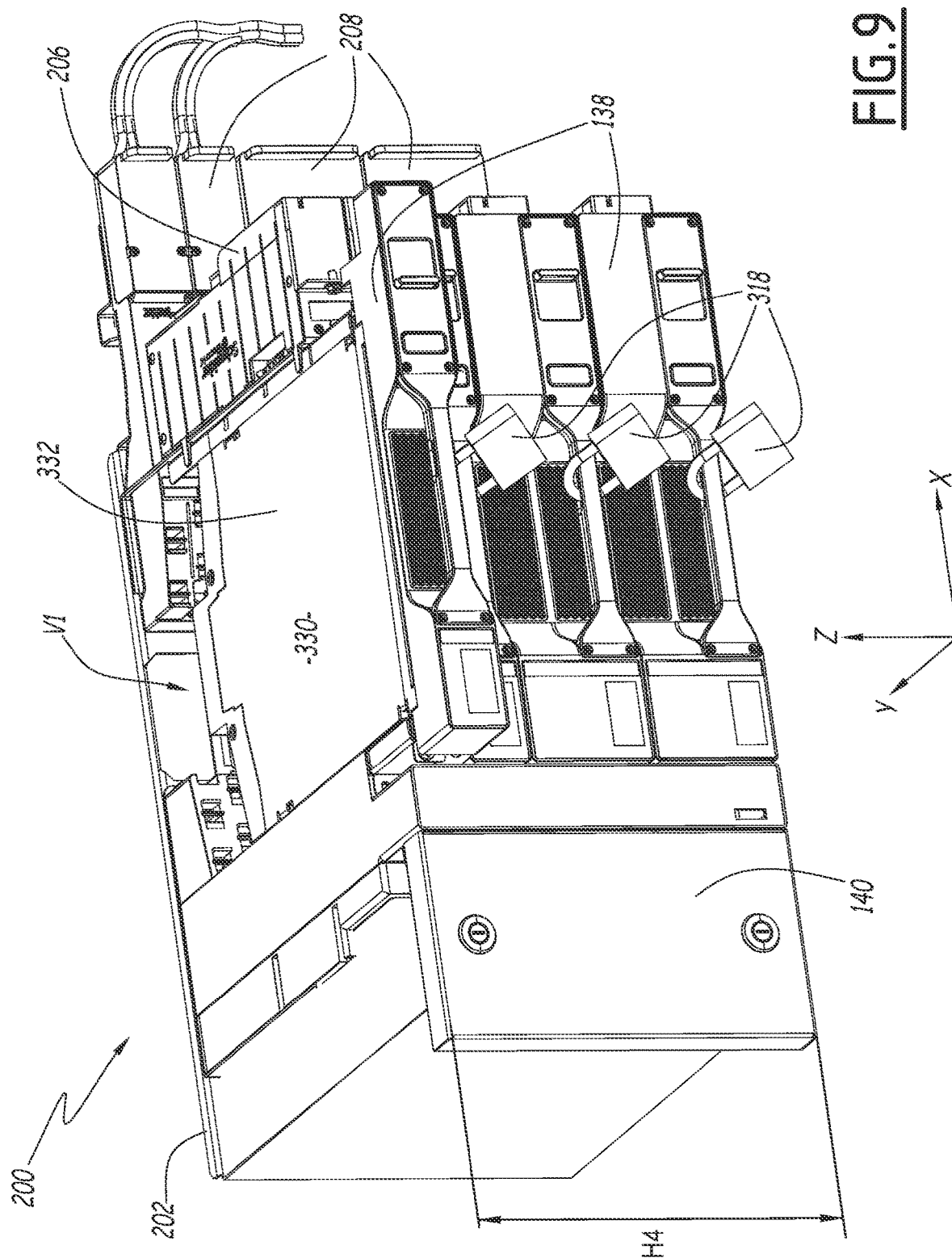
FIG. 9 is a perspective view of another motor start-up module, viewed from another angle.

The motor start-up column 110 comprises one or more motor start-up modules 200, one of which is visible in FIGS. 8 and 9.

Each motor start-up module 200 of a motor start-up column 110 is mainly located in the functional region 156 and partially located in the connection region 158 of this motor start-up column.

When a motor start-up column 110 comprises a plurality of motor start-up modules 200, the motor start-up modules are juxtaposed vertically.

In practice, each motor start-up module 200 comprises a protection unit 140 and at least one monitoring-and-control unit 138. Each monitoring-and-control unit 138 of a motor start-up module is electrically protected by the protection unit 140 of this motor start-up module.

Additionally, each monitoring-and-control unit 138 is connected to the protection unit 140 protecting this monitoring-and-control unit, so as to be able to communicate information on the operation of this monitoring-and-control unit to this protection unit.

In the example shown, the monitoring-and-control units 138 are drawers, the height of which may take a plurality of defined values. Throughout the rest of the description, the monitoring-and-control units 138 are therefore called "drawer 138". A base height of a drawer is therefore defined as a unit height, denoted by "U". The height of a drawer may be equal to an integer multiple of this base height, up to a limit of six times the unit height U.

Thus, a drawer 138 may occupy a height of 1U, 2U, 3U, 4U, 5U or 6U.

Preferably, the unit height U is equal to 50 mm. Thus, a drawer 138 of height 6U will have, in this example, a height of 300 mm.

Each motor start-up module 200 has a main height, denoted by "H4", equal to 6U. In the example shown, the functional region 156 has a height H2 of 1500 mm and may therefore comprise up to five motor start-up modules 200.

Additionally, the width of a motor start-up module, measured along the Y-axis, is equal to the width l2 of the functional region in which the module is installed.

Each motor start-up module 200 is configured to accommodate any technically permissible combination of drawers, depending on the height of these drawers. For example, a motor start-up module may accommodate six drawers of height 1U, or three drawers of height 2U, or one drawer of height 6U.

As can be seen in FIGS. 8 and 9, each motor start-up module 200 comprises the following elements:
- a support structure 202;
- a protection unit 140;
- a segment of computer bus 204, which corresponds to a portion of the computer bus 142;
- at least one drawer 138, in practice between one and six drawers 138;
- at least one input-output module 206, in practice the same number of input-output modules 206 and drawers 138, i.e. between one and six input-output modules; and
- at least one external connection module 208, in practice the same number of connection modules 208 and drawers 138, i.e. between one and six external connection modules. Each external connection module 208 is configured for an electrical load 104 to be connected thereto and to supply power to this electrical load. In practice, in the case of a motor start-up module 200, each load 104 is an electric motor.

In the example shown in FIG. 8, the motor start-up module 200 shown accommodates one drawer of height 2U and one drawer of height 4U.

In the example shown in FIG. 9, the motor start-up module 200 shown accommodates two drawers of height 1U and two drawers of height 2U.

Three main positions of the drawer 138 in the motor start-up module are defined:
- An operating position of the drawer, in which the drawer is fully inserted into the motor start-up module 200. This position corresponds to the normal operating position of the drawer 138, i.e., on the one hand, the drawer 138 supplies electrical power to an external connection module 208 and the electrical load 104 which is connected thereto, and on the other hand, the drawer 138 is connected to the communication module 134 and to the protection unit 140. Both of the drawers of FIG. 8 and the three lower drawers of FIG. 9 are shown in operating position.

A test position of the drawer, in which the drawer is partially inserted into the motor start-up module 200. This position corresponds to an intermediate position in which the drawer 138 is operating, i.e. the elements that it contains are supplied with electrical power and it communicates but the drawer does not supply power to any electrical load 104. The upper drawer of height 1U is shown in test position in FIG. 9.

A disconnected position of the drawer, in which the drawer is partially or completely out of the motor start-up module 200 and in which the drawer is not supplied with electrical power and does not supply power to any electrical load 104.

The drawer 138 is configured to be able to be moved between these three positions.

Figure 10:
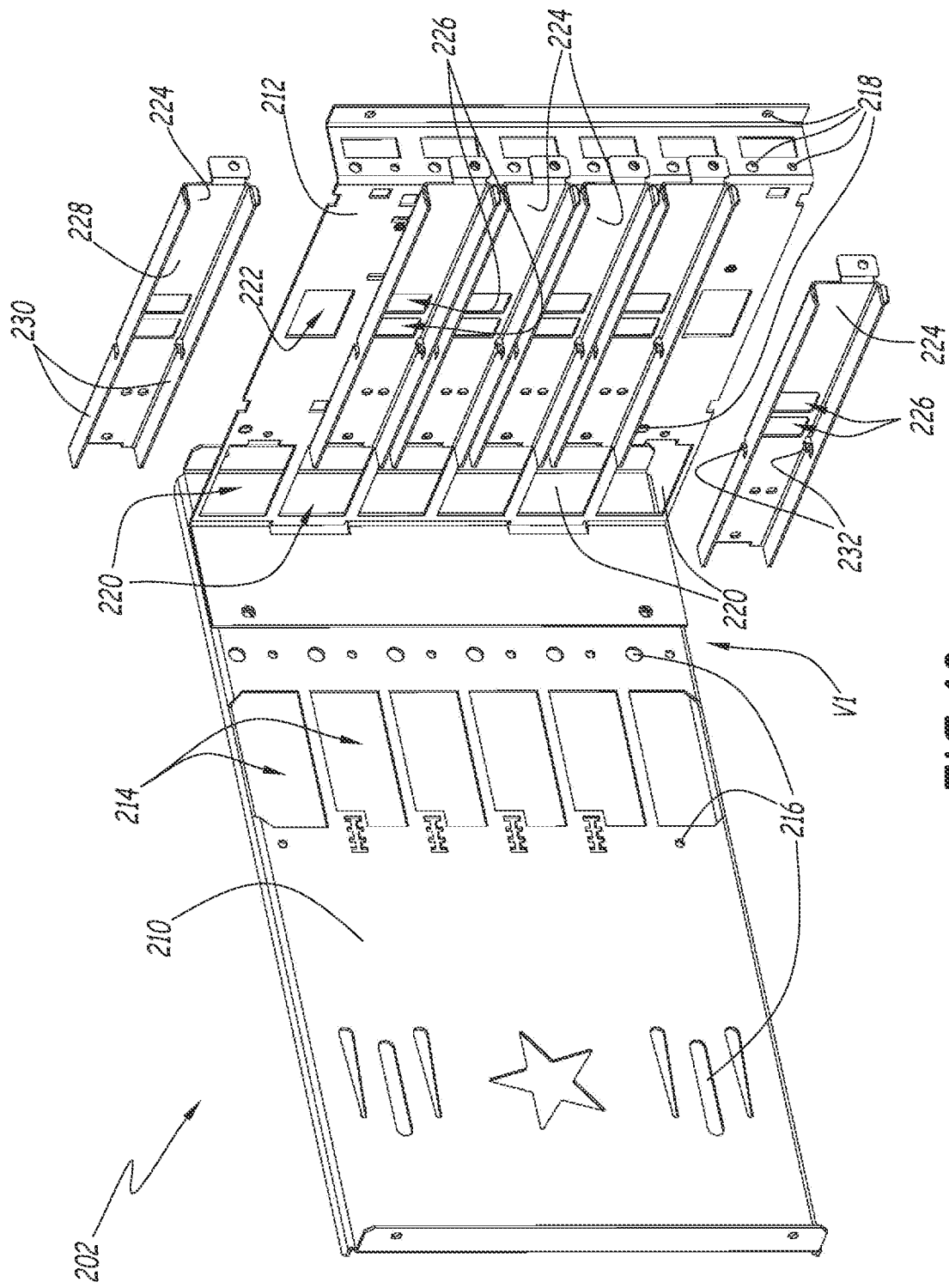
FIG. 10 is a perspective view of a support structure for the motor start-up module of FIGS. 8 and 9.

As can be seen in FIG. 10, the support structure 202 of each motor start-up module 200 comprises a back support 210 and a lateral support 212.

The back 210 and lateral 212 supports make it possible, on the one hand, to attach the motor start-up module 200 to the motor start-up column 110 and, on the other hand, to attach the segment of computer bus 204, the protection unit 140, each drawer 138, each input-output module 206 and each external connection module 208 to the motor start-up module 200.

In practice, each motor start-up module 200 is attached to the framework 164 of the motor start-up column 110 to which the module belongs through its support 202.

For that, the back support 210 is attached either to bars 172 of the framework 164 located on the back face of the enclosure, when the enclosure has a width l2 of 400 mm like in the embodiment of FIG. 4, or to the reinforcements 174 of the framework 164 when the enclosure has a width l1 of 600 mm like in the embodiments of FIGS. 1 to 3 and 5. The lateral support 212 is attached to bars 172 of the framework 164 located on the front face of the enclosure.

The attachment of the supports 210 and 212 to the framework 164 preferably takes place using screws (not shown in the figures).

The supports 210 and 212 are preferably attached together using screws (not shown in the figures).

In the assembled configuration of the motor start-up module 200 on the enclosure 100, the back support 210 extends mainly parallel to the plane formed by the X- and Z-axes. It is overall rectangular in shape and comprises ventilation orifices 214, in the example shown six ventilation orifices.

The back support 210 comprises a set of attachment holes 216 which make it possible to attach the back support 210 both to the framework 164 and to the elements of the motor start-up module 200 such as for example the protection unit 140 or the external connection modules 208.

The lateral support 212 extends mainly parallel to the plane formed by the Y- and Z-axes, in the assembled configuration of the motor start-up module 200 on the enclosure 100. It is overall rectangular in shape.

The lateral support 212 is configured to be attached, on the one hand, to a first end, to the back support 210 and, on the other hand, to a second end, to the framework 164 of the enclosure 100. The lateral support 212 comprises a set of attachment holes 218 which allow this installation, which preferably takes place using screws (not shown).

The lateral support 212 comprises openings 220, located close to the back support 210, i.e. close to the back of the motor start-up module. These openings are configured to allow the passage of the external connection modules 208, as can be seen in FIG. 8. In practice, the lateral support 212 comprises six openings 220.

The lateral support 212 comprises, in addition, windows 222, the role of which is explained below. In practice, the support comprises six windows 222.

The back 210 and lateral 212 supports are, in the example shown, formed by folded and pierced metal sheets.

The support structure 202 comprises, in addition, rails 224, in practice six rails 224, which extend along the Y-axis. The rails 224 are, preferably, attached to the lateral support 212 by screws (not shown).

Each rail 224 comprises two windows 226, juxtaposed along the Y-axis. When a rail is attached to the lateral support 212, its two windows 226 face a window 222 of the lateral support 212, as can be seen in FIGS. 8 and 10.

In FIG. 10, two rails 224, namely the upper rail and the lower rail, are shown in exploded view, i.e. these two rails are shown uninstalled from the lateral support 212. The other intermediate rails are shown in position on the lateral support 212.

Each rail 224 has a "U" shape, with a bottom 228 parallel to the plane formed by the Y- and Z-axes in which the windows 226 are made, and two edges 230 which extend perpendicular to the bottom 228. The two edges 230 are therefore opposite one another.

Additionally, the edges 230 of each rail 224 comprise a tongue 232, which extends in the direction of the opposite edge of the rail. The tongues 232 of a rail are made in its edges 230 at the level of the windows 226 of this rail closest to the back support 210, more precisely at an end of this window closest to the back support 210.

Figure 11:
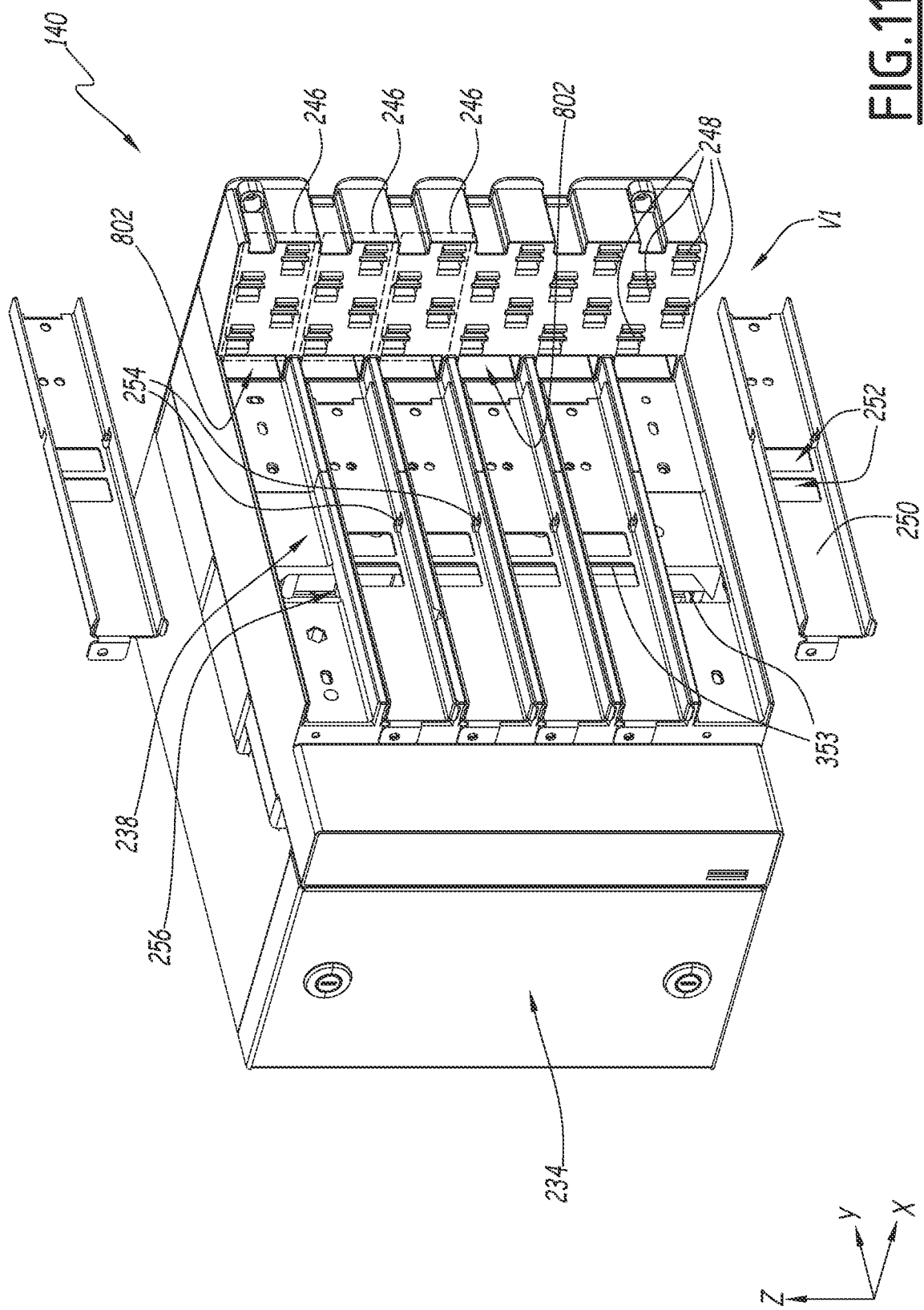
FIG. 11 is a perspective view of a protection unit for the motor start-up module of FIGS. 8 and 9.
Figure 12:
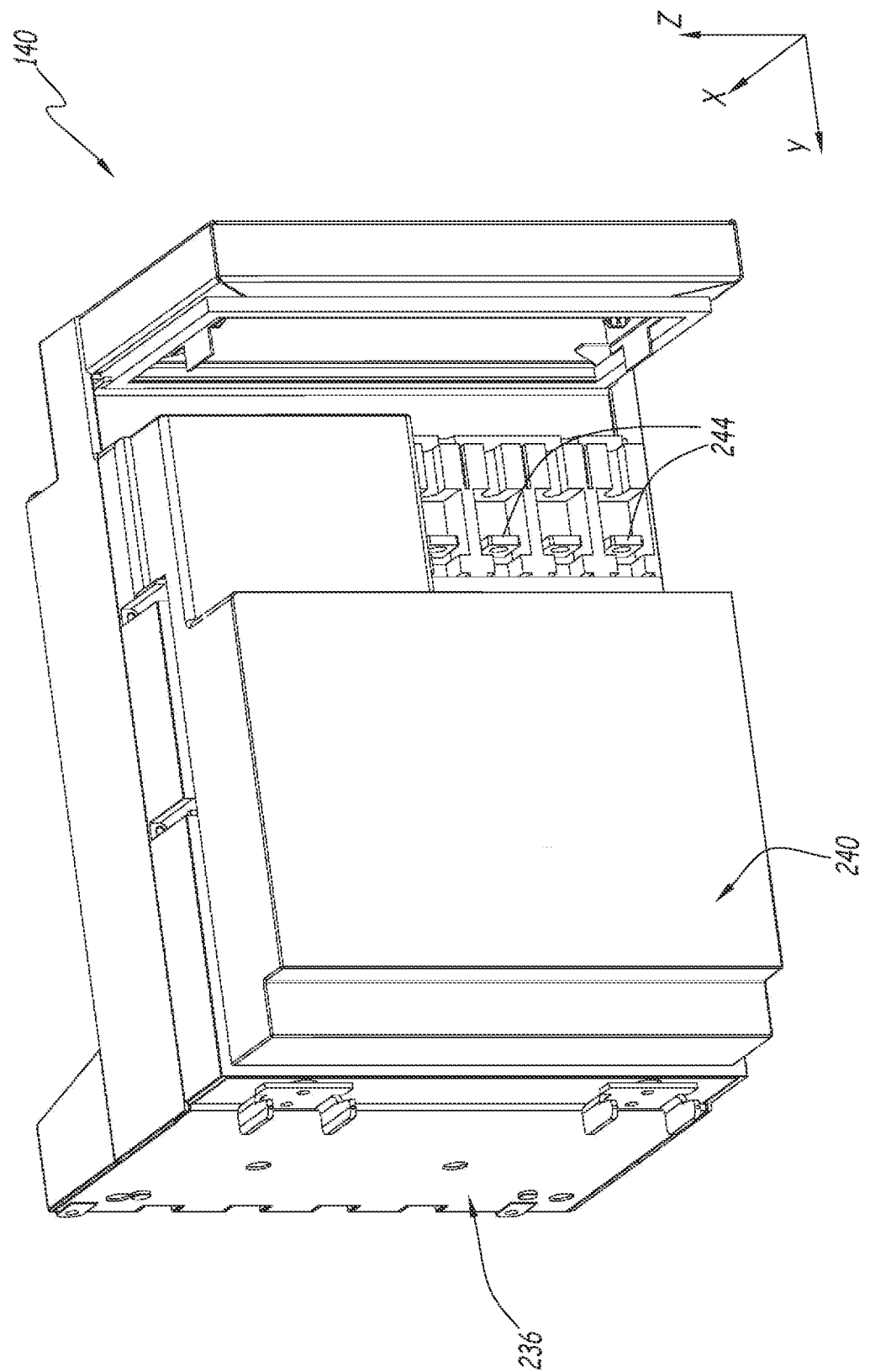
FIG. 12 is a perspective view of the protection unit of FIG. 11, viewed from another angle.

A protection unit 140 is shown in perspective in FIGS. 11 and 12.

This protection unit contains the one or more protection members (not shown), such as for example a circuit breaker, which protect the one or more drawers 138 of the motor start-up module 200.

The protection unit 140 comprises a front face 234, a back face 236, an interior face 238 and an exterior face 240.

In practice, in installed configuration, the front face 234 of the protection unit is contained in the same plane as the front face F1 of the enclosure 100.

In practice, the front and back faces 234 and 236 are parallel to the plane formed by the X- and Z-axes and the interior and exterior faces 238 and 240 are parallel to the plane formed by the Y- and Z-axes.

The back face 236 of the protection unit 140 is attached to the back support 210 of the structure 202 of the motor start-up module 200, for example using screws (not shown), which pass through the attachment holes 216 in the back support.

When the protection unit 140 is attached to the structure 202, the interior face 238 of the protection unit and the lateral support 212 of the structure 202 are facing, i.e. they are arranged facing one another. A volume V1 is defined as the volume located between the interior face 238 of the protection unit, the back support 210 and the lateral support 212.

The electrical connection of the protection unit 140 to the vertical set of busbars 122 takes place using electrical connectors 244, arranged on the exterior face 240 of the protection unit, as can be seen in FIG. 12. Each connector 244 is connected to a vertical busbar 124 of the vertical set of busbars 122. In practice, the protection unit 140 comprises four electrical connectors 244, which makes it possible to connect, for example, a power supply comprising three phases and a neutral. Additionally, it is possible not to connect some electrical connectors 244, for example if the power supply of the electrical enclosure 100 comprises three phases without neutral, or one phase and a neutral.

The protection unit 140 comprises a plurality of electrical output groups 246. These electrical output groups extend from the back face 236 of the protection unit, in the direction of its front face 234. In other words, the electrical output groups 246 are arranged in the volume V1.

In practice, the protection unit 140 comprises six electrical output groups 246. The protection unit 140 may therefore protect up to six drawers 138.

The protection unit 140 therefore makes it possible to pool the protection of the drawers 138 of a motor start-up module 200. This pooling is advantageous since it makes it possible to decrease the cost of the motor start-up module, each drawer 138 not requiring a dedicated protection unit.

Additionally, it is advantageous for the protection unit 140 not to be integrated into the drawers 138. Specifically, in the event of failure of a drawer, only this drawer has to be replaced and the protection unit 140 does not have to be replaced, which is less costly.

Each group of electrical outputs 246 comprises four electrical outputs 248, each connected to one of the four electrical connectors 244.

The protection member of the protection unit 140 is therefore arranged between the electrical connectors 244 and the electrical outputs 248.

This protection member is therefore connected, for each phase and the neutral, as input to a connector 244 and as output to six electrical outputs 248, i.e. to one of the four electrical outputs of each group of electrical outputs.

A group of electrical outputs 246 is contained in a volume of height equal to 1U. The protection unit 140 comprises rails 250, preferably six rails 250, which are identical to the rails 224 of the support structure 202. In particular, the rails 250 comprise windows 252 and tongues 254.

The rails 250 are arranged on the interior face 238 of the protection unit.

In FIG. 11, the upper and lower rails 250 are shown in exploded view, i.e. these rails are uninstalled from the protection unit 140. The other intermediate rails 250 are shown in position on the protection unit 140.

The rails 250 face the rails 224 of the support structure 202, i.e. each rail 250 extends parallel to, and in the same horizontal plane as, a rail 224. Thus, a rail 250 and a rail 224 together form a pair of rails.

As described below, a pair of rails formed of a rail 250 and of a rail 224 makes it possible to move a drawer 138 between its operating position, its test position and its disconnected position.

Additionally, the interior face 238 of the protection unit 140 comprises windows 256, in practice six windows 256, which are located facing the windows 252 of the rails 250.

Figure 13:
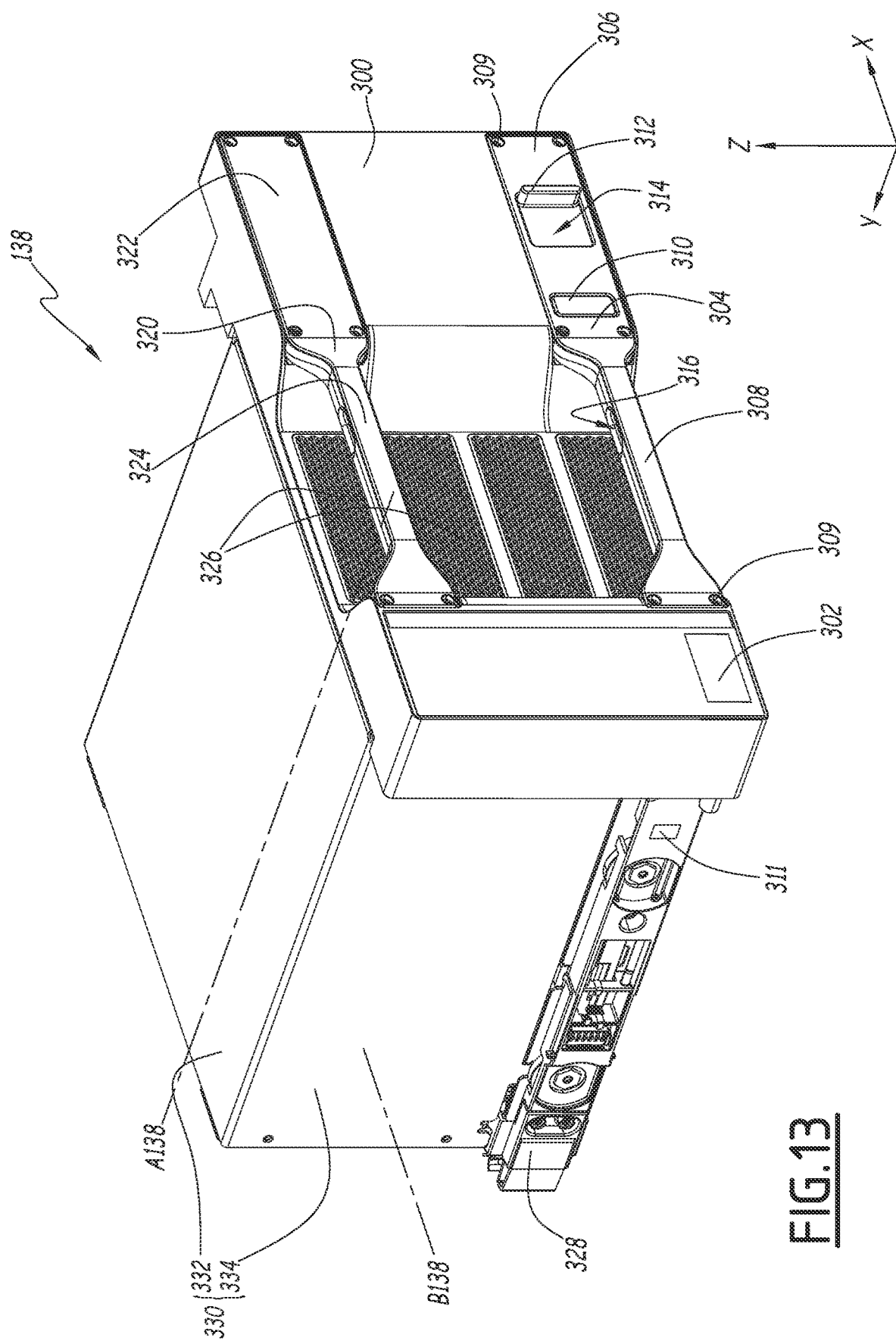
FIG. 13 is a perspective view of a monitoring-and-control unit belonging to an enclosure according to one of FIGS. 1 to 5, this unit being in accordance with the invention.
Figure 14:
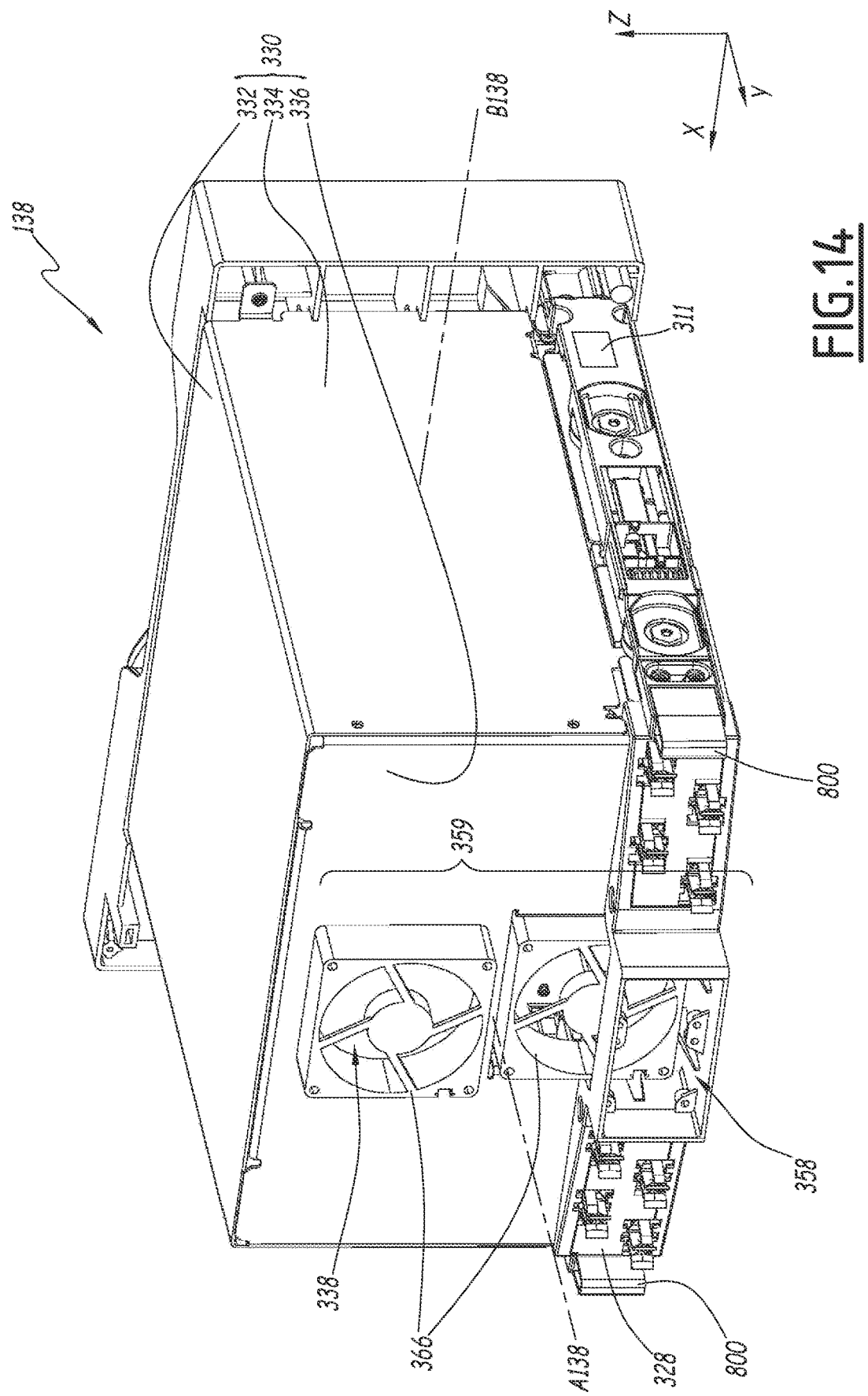
FIG. 14 is a perspective view of the monitoring-and-control unit of FIG. 13, viewed from another angle.

A drawer 138 of height 4U is shown in FIGS. 13 and 14.

This drawer 138 of height 4U comprises a frontal portion 300.

As can be seen in FIG. 13, the frontal portion 300 of the drawer extends mainly parallel to the plane formed by the axes X and Z.

All of the drawers 138 comprise a frontal portion 300, which is different depending on the height of the drawer. Thus, the height of the frontal portion is matched to the height of the drawer of this frontal portion. A frontal portion 300 may therefore have a height of 1U, 2U, 3U, 4U, 5U or 6U.

Throughout the rest of the description, any element described with reference to the drawer 138 of height 4U of FIGS. 13 and 14 is also present in drawers 138 of a different height, unless explicitly mentioned otherwise.

The frontal portion 300 comprises a display 302, which displays information on the operation of the drawer 138. This information is, for example, the reference of the electrical load 104 controlled by the drawer 138, the electrical power delivered to this electrical load, or the state of this electrical load.

As a variant, the display 302 further comprises a strip of light-emitting diodes, or "LEDs", which comprises one or more LEDs able to emit visual indicators in the form of colours.

The frontal portion 300 comprises a main handle 304.

The handle 304 comprises a base 306 and a grip extension 308.

In practice, the base 306 and the grip extension 308 are formed of a part formed as one piece, joined to the frontal portion by fastening means 309 such as screws.

The base 306 comprises a button 310. The button 310 makes it possible to transmit a command to open the electromagnetic lock 311 arranged on one side of the drawer 138, as can be seen in FIGS. 13 and 14 where the electromagnetic lock 311 is on the side of the rail 250 of the protection unit 140.

Figure 15:
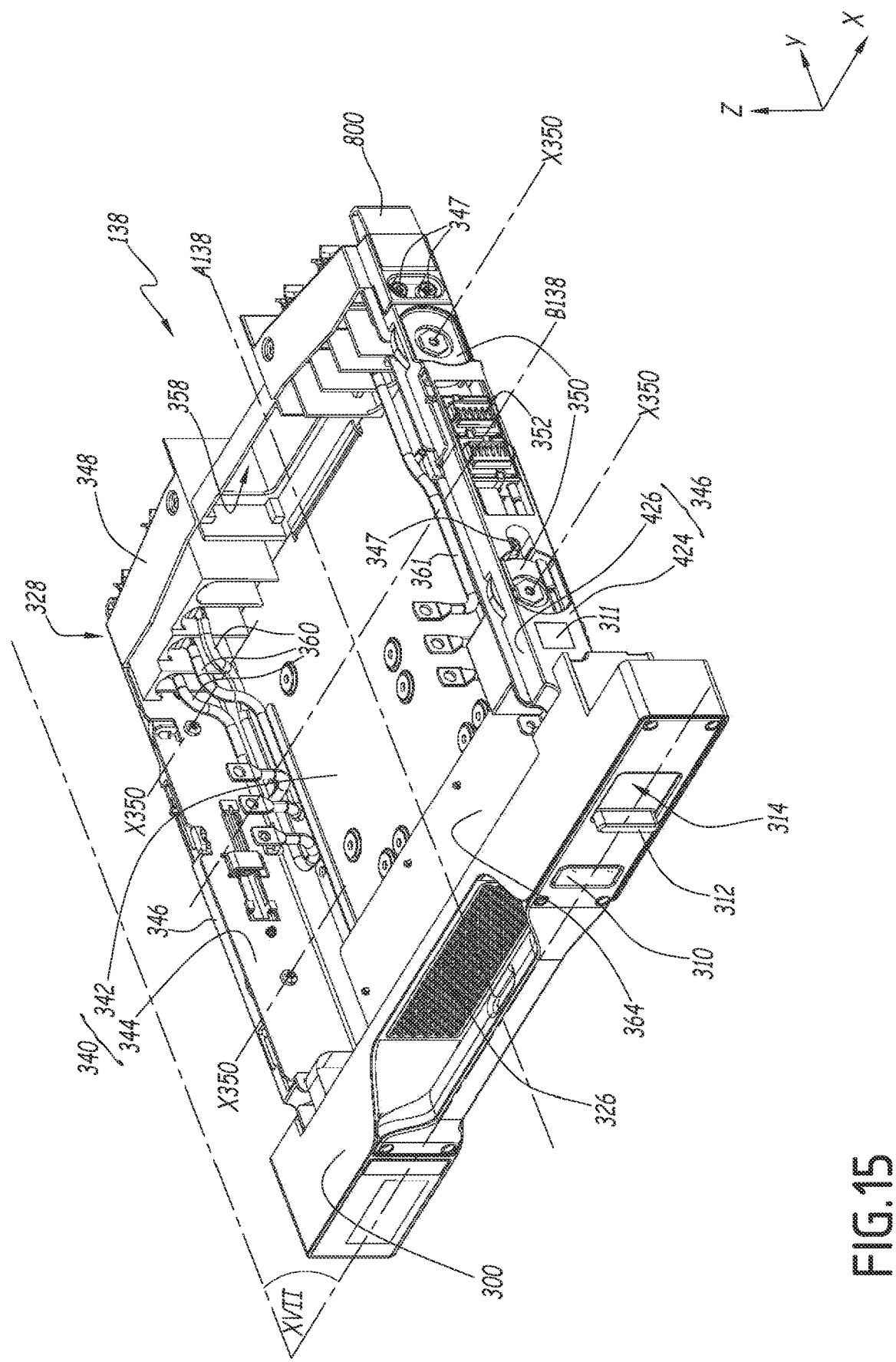
FIG. 15 is a perspective view of a second monitoring-and-control unit belonging to an enclosure according to one of FIGS. 1 to 5, this second unit being in accordance with the invention.
Figure 16:
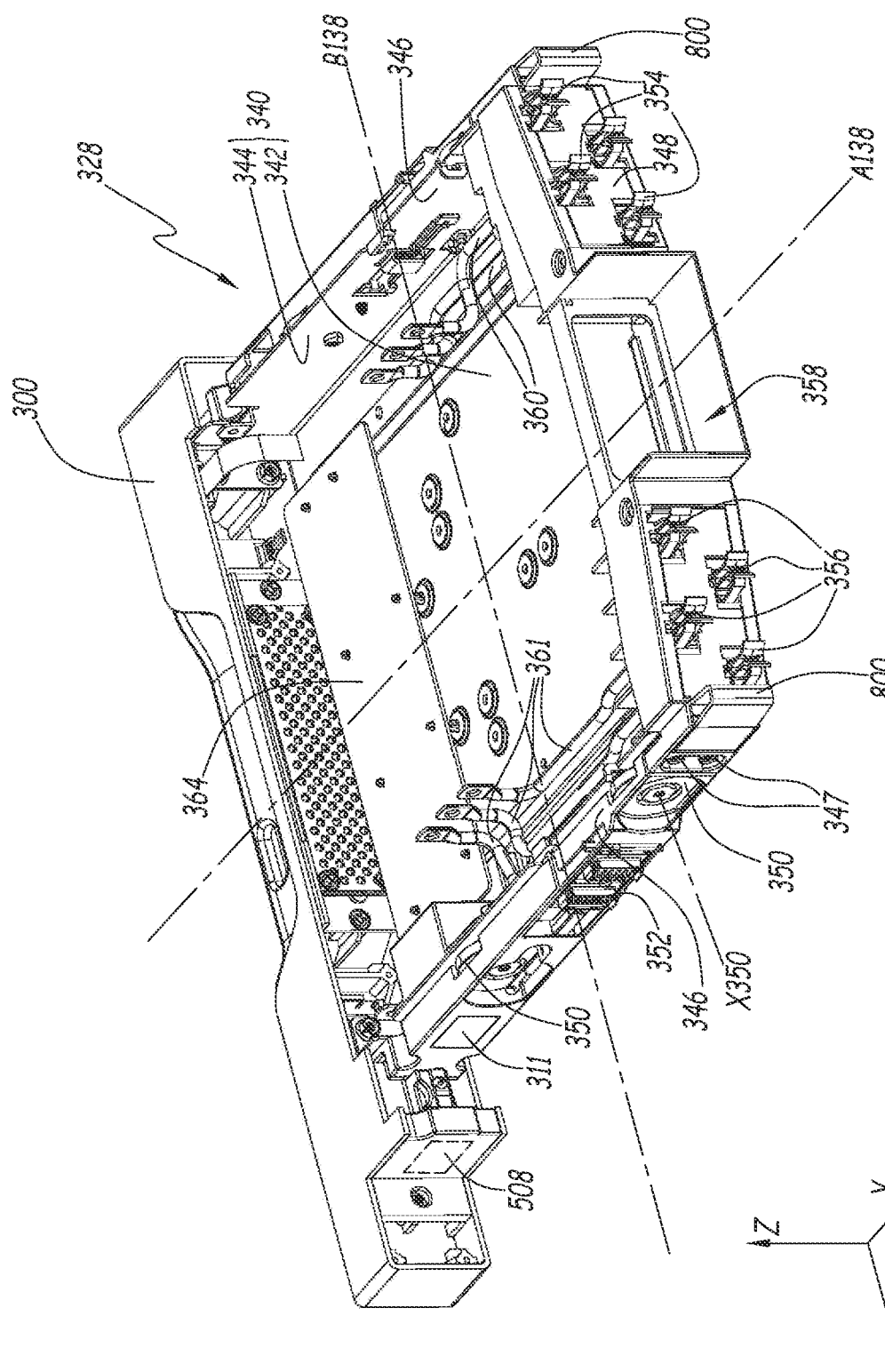
FIG. 16 is a perspective view of the second monitoring-and-control unit of FIG. 15, viewed from another angle.

As a variant, the electromagnetic lock 311 is arranged on another side of the drawer 138, as can be seen in FIGS. 15 and 16, where the electromagnetic lock 311 is on the side of the rail 224 of the support structure 202. As a variant, two electromagnetic locks 311 are arranged on the drawer 138, each on one side.

As a variant (not shown) of the invention, the button 310 is arranged in another location on the frontal portion 300 of the drawer 138.

This electromagnetic lock 311 is mobile between a position for locking the drawer 138 and a position for unlocking the drawer 138.

In the position for locking the drawer 138, the electromagnetic lock 311 makes it possible to keep the drawer 138 either in operating position, or in test position. In other words, the electromagnetic lock prevents the insertion of the drawer into the motor start-up module 200 from its test position to its operating position and prevents it from exiting the motor start-up module from its operating position or from its test position.

In the position for unlocking the drawer 138, the electromagnetic lock allows the drawer to be freely inserted into the motor start-up module from its test position to its operating position, or taken out of the motor start-up module from its operating position or from its test position.

In practice, in the position for locking the drawer 138, the electromagnetic lock 311 extends out of the drawer and mechanically blocks its insertion into the motor start-up module or its removal from the motor start-up module, as detailed below.

By default, the electromagnetic lock 311 is in the position for locking the drawer 138 and the lock moves into the position for unlocking the drawer when it receives an opening command. In the absence of an opening command, the lock moves into the position for locking the drawer by default.

In the example, the button 310 has to be depressed into the base 306 to transmit an opening command and a spring (not shown) keeps the button not depressed.

In other words, to insert the drawer 138 into the motor start-up module from its test position to its operating position, or to remove the drawer 138 from the motor start-up module from its operating position, it is necessary to actuate the button 310. Thus, the button 310 makes it possible, when it is actuated, to send an opening command controlling the unlocking of the electromagnetic lock 311 and thus to allow the movement of the drawer from its operating position or from its test position.

In practice, the electromagnetic lock 311 controlled by the button 310 prevents the insertion of the drawer 138 from its test position to its operating position, or the removal of the drawer 138 from its operating position, by interfering with the rail 224 or with the rail 250.

Figure 36:
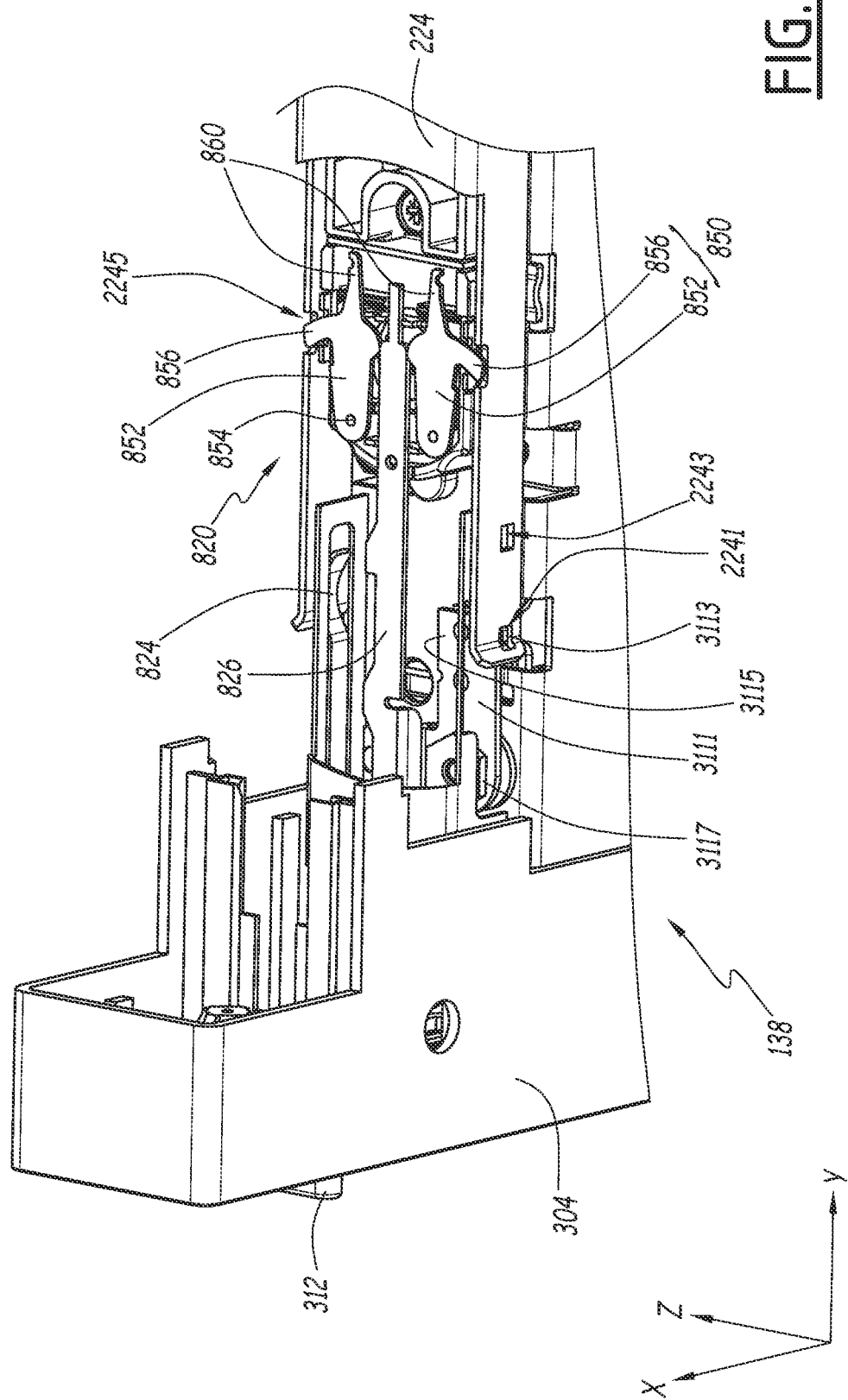
FIG. 36 is a detail view of the locking system for the monitoring-and-control drawer of FIGS. 15 to 17, in a first position.
Figure 37:
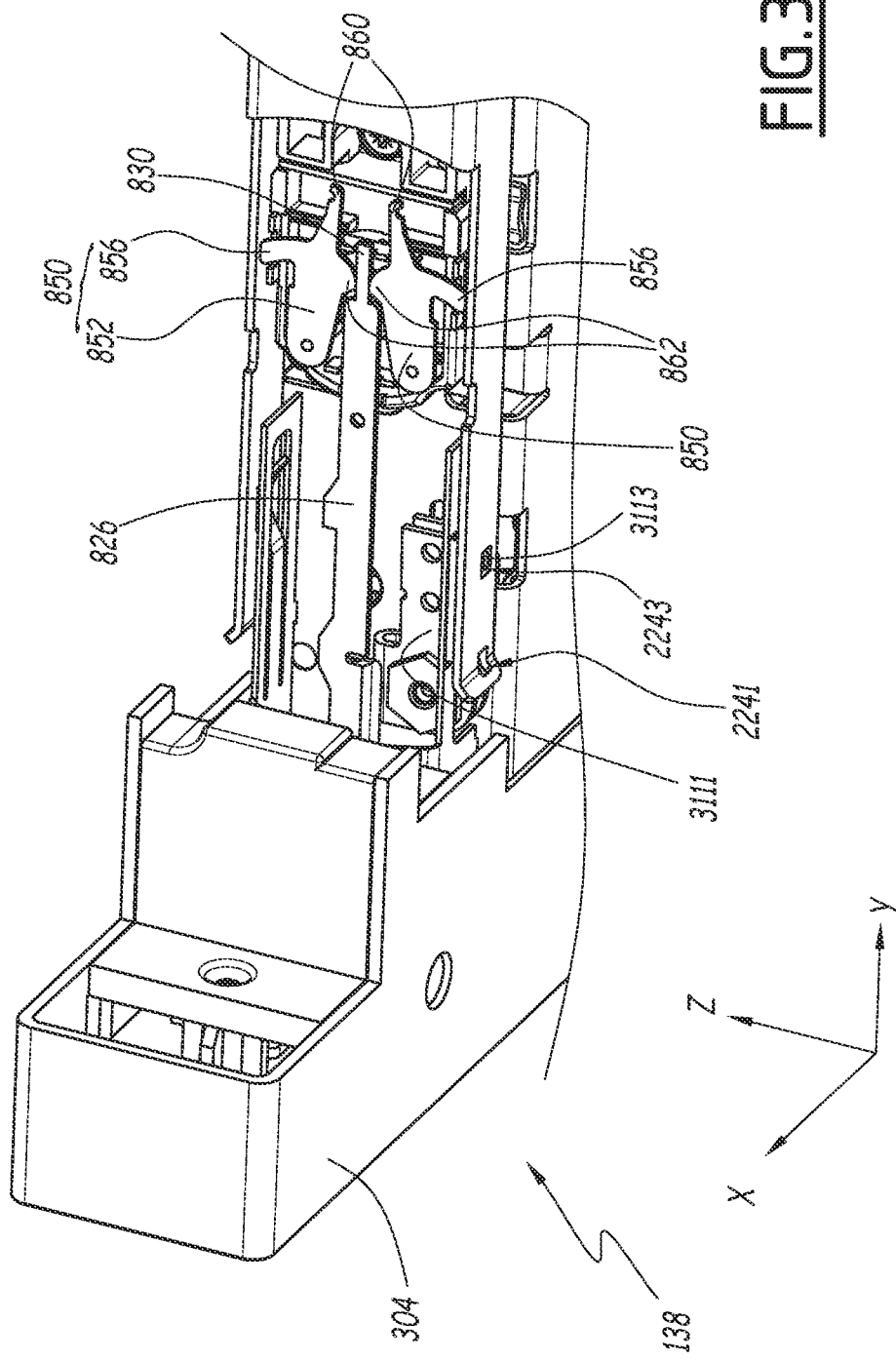
FIG. 37 is a detail view of the locking system for the monitoring-and-control drawer of FIGS. 15 to 17, in a second position.

In FIGS. 36 and 37, the drawer 138 is shown locked by the electromagnetic lock 311 in test position and in operating position, respectively. In this example, the electromagnetic lock 311 is shown on the side of the rail 224 of the support structure 202.

The description below of the operation of the electromagnetic lock 311 applies identically to an electromagnetic lock arranged on the side of a rail 250 and interfering with this rail 250 to prevent the movement of the drawer 138.

As can be seen in these FIGS. 36 and 37, the electromagnetic lock 311 comprises a rocker lever 3111 and a bolt 3113 arranged at a first end 3115 of the rocker lever 3111. The rocker lever is rotatably mobile about a second end 3117. Thus, when the electromagnetic lock 311 receives an opening command, the rocker lever 3111 is rotatably driven so as to move the bolt 3113.

In the position for locking the electromagnetic lock 311, the bolt 3113 is arranged in a slot 2241 in the rail 224, when the drawer 138 is in test position, or in another slot 2243 in the same rail 224, when the drawer is in operating position.

Thus, the movement of the drawer 138 is blocked by the contact of the bolt 3113 with the edge of the slot 2241 or the edge of the slot 2243 of the rail 224 of the support structure 202.

The rotation of the rocker lever 3111 is driven by an electromagnetic actuator (not shown). This electromagnetic actuator is activated when the electromagnetic lock 311 receives an opening command. In practice, the actuation of the button 310 generates an opening command, which is an electrical signal, which controls the activation of the actuator of the electromagnetic lock 311.

As a variant (not shown) of the invention, the electromagnetic lock 311 does not comprise a rotatably mobile rocker lever and the bolt 3113 is translatably driven by an electromagnetic actuator, for example via a slide.

The base 306 comprises a slider 312, accessible through a window 314 in the base 306.

The slider 312 is actuable between a position for locking the button 310 and a position for unlocking the button 310.

In the position for locking the button 310, the slider 312 mechanically prevents the button 310 from being actuated. In other words, in this position, it is not possible to send an opening command to the electromagnetic lock 311 and, therefore, it is not possible to move the drawer 138 from its operating position or from its test position in the motor start-up module 200.

The position of the slider 312 in which the button 310 is prevented from being actuated by the slider therefore corresponds to a position for locking the drawer 138.

In FIG. 13, the slider 312 is shown in the position for locking the button 310. In practice, the slider 312 may be translated along the X-axis with respect to the base 306 and the position for locking the slider is obtained when the slider is to the right of the window 314 in the base.

The grip extension 308 of the handle is configured to be easily gripped by hand and thus facilitate the movement of the drawer 138 within the motor start-up module 200, parallel to the Y-axis.

Additionally, the grip extension 308 comprises an open-ended hole 316. The hole 316 is configured to allow a locking device 318 to be put in place in the main handle 304.

Locking devices 318 are shown in FIGS. 8 and 9, and are, in the example, padlocks.

In practice, the open-ended hole 316 is configured to allow a plurality of locking devices 318 to be put in place therein, for example the shanks of three locking devices.

Figure 40:
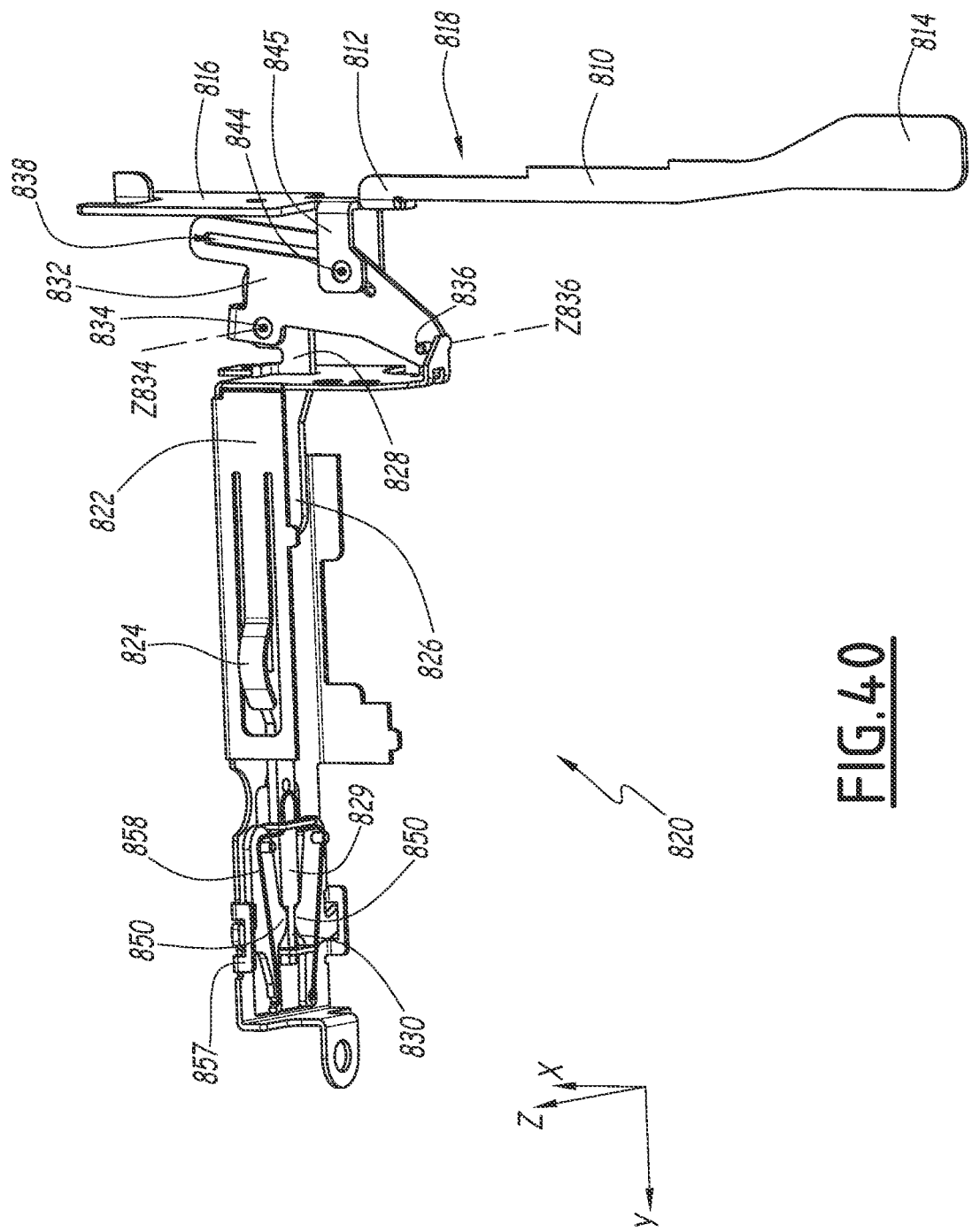
FIG. 40 is a perspective view of the locking system of FIG. 37, in which a portion of the drawer is hidden.

The slider 312 is securely attached to a shank 810 visible in FIG. 40, which extends inside the main handle 304 of the drawer 138.

The shank 810 comprises a first free end 812 and a second free end 814.

The first end 812 of the shank 810 is securely connected to a support plate 816, which is driven in motion by the slider 312. Thus, the slider 312 transmits a translational motion to the shank 810 via the support plate 816.

In practice, the support plate 816 is arranged in the base 306 of the handle 304, and is translatably mobile in the base 306 along an axis parallel to the X-axis of the drawer 138.

The free end 814 of the shank 810 is configured so as, in the position for locking the button 310, not to extend into the open-ended hole 316 and, in the position for unlocking the button 310, to extend into the open-ended hole 316.

Thus, when the locking device 318 is in place in the open-ended hole 316, the slider 312 cannot be actuated into the position for unlocking the button 310, since the end 814 of the shank 810 is prevented from extending into the open-ended hole 316 by the locking device 318, in the example by the shackle of a padlock.

In addition, the shank 810 comprises a cut-out 818. When the slider 312 is in the position for unlocking the button 310, the cut-out 818 is located facing the button 310 and does not prevent the activation of the button. Conversely, when the slider 312 is in the position for locking the button 310, the cut-out 818 is offset, along the X-axis, in relation to the button 310, and the body of the shank 810 then prevents the button from being actuated.

In other words, when the slider 312 is in the position for locking the drawer 138 and potentially when a locking device 318 is in place in the open-ended hole 316, the button 310 cannot be actuated.

In summary, when the slider 312 is in the position for locking the button 310, it is possible to put a locking device 318 in place in the hole 316 in the handle 304, which makes it possible to prevent the translation of the slider 312 into the position for unlocking the button 310. This makes it possible to block the actuation of the button 310 and therefore the sending of a command to unlock the drawer 138 via the electromagnetic lock 311.

The support plate 816, which is secured to, and actuated by, the slider 312 is additionally connected to a mechanical lock 820, visible in FIGS. 36 to 40. In FIGS. 36 and 37, the rail 224 is partially hidden, in order to make visible a portion of the mechanism of the mechanical lock 820.

In the example shown in these figures, the mechanical lock 820 is shown on the side of a rail 224. The description below of the operation of the mechanical lock 820 applies identically to a mechanical lock arranged on the side of a rail 250 and interfering with this rail 250 to prevent the movement of the drawer 138.

The mechanical lock 820 is complementary to the electromagnetic lock 311 and these locks together form a locking system for the drawer 138.

Preferably, the mechanical lock 820 is made of a metal material, for example of steel.

The mechanical lock 820 comprises a structure 822, which is attached to the drawer 138. This structure 822 extends mainly parallel to the Y-axis, i.e. parallel to the axis of movement of the drawer 138 in the motor start-up module 200.

Additionally, when the drawer 138 is installed in the motor start-up module 200, the structure 822 is accommodated in the rail 224.

The structure 822 comprises a tongue 824 in the shape of a boss which is in contact with the rail 224 and thus makes it possible to maintain electrical continuity between the structure 822 and the rail 224, when the drawer is installed in the motor start-up module. In particular, this electrical continuity makes it possible for the drawer 138 to have a common ground with the motor start-up module 200.

The mechanical lock 820 comprises a shank 826, which extends mainly parallel to the Y-axis and which is translatably mobile along this axis with respect to the structure 822.

The shank 826 comprises a first end 828, a main body 829 and a second end 830.

The second end 830 is thin in relation to the main body 829, i.e. the dimension of the second end 830, measured along an axis parallel to the Z-axis of the drawer 138, is smaller than the dimension of the main body 829. In other words, the second end 830 is narrower than the main body 829.

The first end 828 is connected to an actuating lever 832, by a pivot link 834, of axis Z834 parallel to the Z-axis of the drawer 138. Thus, the actuating lever 832 is rotatably mobile with respect to the shank 826.

Additionally, the actuating lever 832 is also connected to the structure 822, by a pivot link 836, of axis Z836 parallel to the Z-axis of the drawer 138. Thus, the actuating lever 832 is rotatably mobile with respect to structure 822. In practice, the axis Z836 represents the axis of rotation of the actuating lever 832 in relation to the drawer 138, because the structure 822 is fixed in relation to the drawer 138.

In addition, a guide rail 838 is made in the actuating lever 832. The guide rail 838 has a bent shape, i.e. it comprises two rectilinear portions that are oblique with respect to one another, denoted by 840 and 842, respectively.

A pin 844, attached to the support plate 816, is arranged in the guide rail 838. More precisely, the pin 844 is arranged at the end of a leg 845 which is formed as one piece with the support plate 816 and is folded at right angles with respect to this support. Thus, the pin 844 is mobile and its movement is driven by the slider 312.

Figure 38:
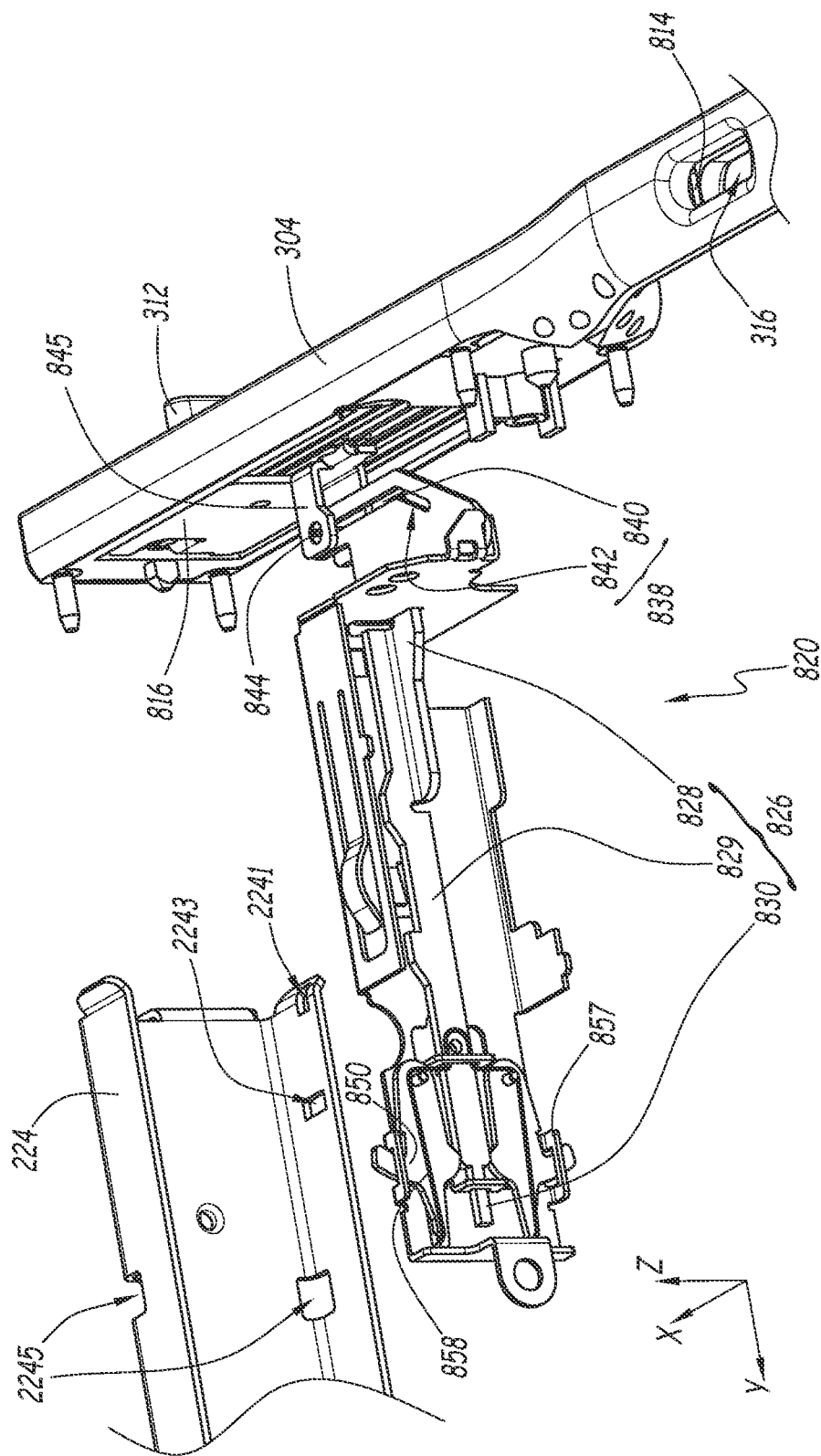
FIG. 38 is a perspective view of the locking system of FIG. 36, in which a portion of the drawer is hidden and a rail belonging to an enclosure according to one of FIGS. 1 to 5 is also shown.

When the slider 312 is in the position for locking the button 310, the pin 844 is arranged in the portion 840 of the guide rail 838, as shown in FIG. 38.

Figure 39:
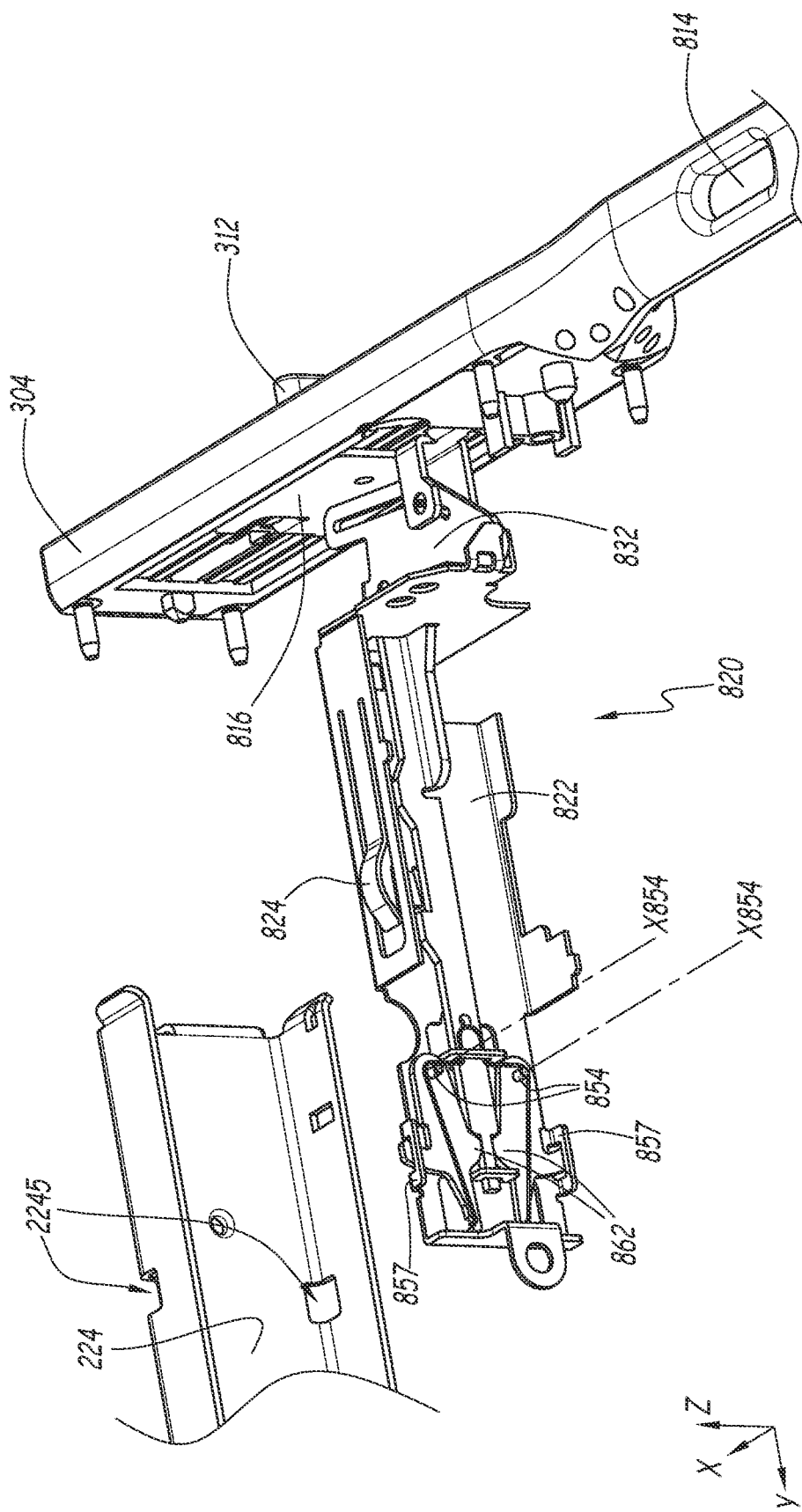
FIG. 39 is a perspective view of the locking system of FIG. 37, in which a portion of the drawer is hidden and a rail belonging to an enclosure according to one of FIGS. 1 to 5 is also shown.

When the slider 312 is in the position for unlocking the button 310, the pin 844 is arranged in the portion 842 of the guide rail 838, as shown in FIG. 39.

The movement of the slider 312 from its locking position to its unlocking position drives a rotation of the actuating lever 832 about the axis Z836, due to the translation of the pin 844 along an axis parallel to the X-axis of the drawer.

Specifically, the pin 844 moves only in translation, since it is attached to the support plate 816 by the leg 845. This translation takes place without movement of the actuating lever 832 when the pin 844 is located in the first portion 840 of the guide rail 838. Next, the pin 844 forces the rotation of the actuating lever 832 about the pivot 836 as soon as it engages in the second portion 842 of the guide rail 838, by exerting a force on the lateral walls of the guide rail.

The rotation of the actuating lever 832, under the action of the pin 844, drives a movement of the pivot 834, which then gets closer, along an axis parallel to the Y-axis of the drawer 138, to the support plate 816.

This movement of the pivot 834 then drives a movement of the shank 826, also along an axis parallel to the Y-axis of the drawer 138 and in the direction of the support plate 816.

Thus, the actuating lever 832 makes it possible to convert a translational motion of the slider 312 along an axis parallel to the X-axis of the drawer 138 into a translational motion of the shank 826 along an axis parallel to the Y-axis of the drawer, i.e. in a direction perpendicular to the direction of the translation of the slider 312.

Preferably, the connection between the shank 826 and the actuating lever 832 comprises a set of operations, along an axis parallel to the X-axis of the drawer 138 (not visible in the figures), which facilitates the conversion of the rotation of the actuating lever into the translation of the shank.

The second end 830 of the shank 826 cooperates with two latches 850, which belong to the mechanical lock 820. Each latch 850 comprises a main body 852, pivotably mounted about a pivot 854, the axis of rotation X854 of which is parallel to the X-axis of the drawer 138, and a hook 856.

Each latch 850 is mobile between a position for locking the drawer 138, shown in FIGS. 36 and 38, and a position for unlocking the drawer 138, shown in FIGS. 37 and 39.

When the latches 850 are in the position for locking the drawer 138, their hook 856 extends into a notch 2245 in the rail 224. This position is visible in FIG. 36.

In this position, the drawer 138 is in test position and cannot be moved into its operating position or into its disconnected position, since the hooks 856 butt against the walls of the notches 2245 in the rail 224.

When the latches 850 are in the position for unlocking the drawer 138, as can be seen in FIG. 37, the hooks 856 do not extend into the notches 2245 and do not prevent the movement of the drawer 138 in the motor start-up module.

As can be seen in FIGS. 38 and 39, the structure 822 also comprises two guide notches 857. Each notch 857 is configured to guide a hook 856, i.e. a hook 856 extends through a notch 857, when the latches 850 are in the position for locking the drawer 138 and when the latches are in the position for unlocking the drawer.

By virtue of the guide notches 857, the movement of the hooks 856 is guided so as to facilitate their insertion into the notches 2245 in the rail 224 when the latches 850 move into the position for locking the drawer 138.

By default, the latches 850 are in the position for unlocking the drawer 138.

Specifically, the mechanical lock 820 further comprises an elastic member 858, which keeps the latches 850 in the position for unlocking the drawer 138.

In the example shown, this elastic member 858 is an elastically deformable tongue, for example made of spring steel.

This elastically deformable tongue is overall in the shape of a U, with arms that converge with distance from its bottom. It extends around the pivots 854 and its two ends are each held by an end 860 of the main body 852 of a latch 850.

As a variant (not shown) of the invention, the elastic member 858 is a tension spring, for example a helical spring, which extends between the two ends 860 of the main bodies 852 of the two latches, along an axis parallel to the Z-axis of the drawer 138.

Each latch 850 further comprises a cam 862 which is oriented towards the other latch 850. Thus, the two cams 862 are located facing one another.

When the slider 312 is in the position for unlocking the button 310, the latches 850 are in the position for unlocking the drawer 138.

Specifically, when the slider 312 is in the position for unlocking the button 310, the second end 830 of the shank 826 is located between the cams 862 of the latches 850. Since this second end 830 is thin, the cams 862 are close to one another and the hooks 856 are sufficiently far from the rail 224 so as not to extend into the notches 2245 in the rail.

Conversely, when the slider 312 is in the position for locking the button 310, the latches 850 are in the position for locking the drawer 138.

Specifically, when the slider 312 is in the position for locking the button 310, the shank 826 is moved such that the main body 829 of the shank is located between the cams 862 of the latches 850, as can be seen in FIG. 36. Thus, the latches 850 are moved apart from one another and the hooks 856 extend into the notches 2245 in the rail 224.

In other words, when the slider 312 goes from its position for unlocking to its position for locking the button 310, the shank 826 of the mechanical lock 820 moves so as to push on the cams 862 and thus move the hooks 856 apart into the notches 2245 in the rail 224 until the latches 850 reach their position for locking the drawer 138. The movement of the slider 312 therefore makes it possible to move the hooks 856.

The notches 2245 in the rail 224 are made in a specific location, such that the hooks 856 may extend therein only when the drawer 138 is in test position. The mechanical lock 820 therefore makes it possible to lock the drawer 138 in test position.

Thus, the mechanical lock 820 is mobile between two positions: a position for locking the drawer 138, in which the drawer is in test position, and a position for unlocking the drawer 138, in which the mechanical lock 820 does not prevent the movement of the drawer 138.

Additionally, when the slider 312 is in the position for locking the button 310, then the mechanical lock 820 is in the position for locking the drawer 138, and when the slider 312 is in the position for unlocking the button 310, then the mechanical lock 820 is in the position for unlocking the drawer 138.

Thus, when the slider 312 is in the position for locking the button 310, it is possible to mechanically block the movement of the drawer 138 in the motor start-up module 200, by virtue of the mechanical lock 820.

Additionally, in this position of the slider 312, a locking device may be put in place in the hole 316 in the handle, which then prevents the passage of the slider into the position for unlocking the button 310 and therefore the passage of the mechanical lock 820 into the position for unlocking the drawer 138.

In summary, the slider 312 makes it possible to actuate the mechanical lock 820.

The locking system for the drawer 138 thus comprises two distinct locking mechanisms, i.e. the electromagnetic lock 311 and the mechanical lock 820.

It is understood that the slider 312 interacts with these two locking mechanisms, since, depending on its position, the slider 312 allows or prevents the activation of the button 310, which controls the electromagnetic lock 311, and moves the mechanical lock 820 between its positions for locking or for unlocking the drawer 138.

In summary, the electromagnetic lock 311 makes it possible to lock the drawer 138 either in operating position, or in test position, and the mechanical lock 820 makes it possible to lock the drawer 138 in test position.

Additionally, the electromagnetic lock 311 may be unlocked only when the mechanical lock 820 is unlocked.

The locking of the position of the drawer 138 in test position then has redundancy, which is particularly advantageous for making the use of the drawer 138 and of the electrical load 104 to which it is connected safe.

Specifically, during maintenance operations on the electrical load 104 connected to a drawer 138, it is desirable for the drawer 138 to be supplied with electrical power but for the electrical load 104 not to be supplied with electrical power, which corresponds to the test position of the drawer. In this position of the drawer, it is then possible to operate on the electrical load 104 connected to the drawer without risk, because the electrical load 104 is not being supplied with electrical power.

To ensure the safety of a maintenance operator operating on the electrical load 104, it is necessary to ensure that the drawer 138 cannot be moved from its test position into its operating position. For that, the maintenance operator puts a locking device 318, such as a padlock, in place on the drawer 138, which prevents the movement of the drawer 138. This operation is referred to as "electrical lockout" of the electrical load 104, since it is not possible to re-establish the supply of electrical power to the electrical load 104 as long as the locking device 318 is installed.

The locking device 318 thus prevents the unlocking of the drawer 138.

Because the through-hole 316 is configured to be able to accommodate a plurality of locking devices 318, a plurality of maintenance operators may prevent the unlocking of the drawer 138 by each installing a locking device 318.

Having locking redundancy is then safer, since in the event of failure of one of the two locks, the movement of the drawer 138 into operating position remains impossible.

Additionally, the electromagnetic lock 311 and the mechanical lock 820 both operate independently of the elements contained in the drawer 138. Thus, the locking system described above is usable for many types of monitoring-and-control drawer, regardless of the functions that these drawers comprise.

As a variant, the drawer 138 further comprises a manually operated mechanism making it possible to unlock the electromagnetic lock 311 in the absence of voltage, so as to allow the movement of the drawer from its operating position into its test position, or from its test position into its disconnected position.

As a variant, the drawer 138 does not comprise a mechanical lock 820 and the locking system for the drawer is then formed only of the electromagnetic lock 311.

As a variant, the button 310 is replaced with another control device such as, for example, a touchscreen or a handle.

As a variant, the electromagnetic lock 311 is controlled by a device other than the button 310, in particular by a remote device. In such a variant, the commands to open the electromagnetic lock 311 are, for example, sent by a remote computer, which may be the computer 130, or, for example, by the communication module 134.

The frontal portion 300 of the drawer 138 further comprises a secondary handle 320.

The secondary handle 320 comprises a base 322 and a grip extension 324.

The grip extension 324 of the secondary handle is identical to the grip extension 308 of the main handle 304.

The base 322 of the secondary handle 320 differs from the base 306 of the main handle in that the base 322 does not comprise a button, or a slider.

In practice, only the drawers 138 with a height of 4U, 5U and 6U comprise a secondary handle 320. The drawers with a height of 1U, 2U and 3U comprise only the main handle 304.

The main handle 304 has a height equal to 1U, in order to be able to be installed on a drawer of height 1U.

The frontal portion 300 comprises ventilation grilles 326. The ventilation grilles are in practice perforations made in a region of the frontal portion which allow the flow of air between the exterior of the drawer 138 and the interior of the drawer.

Each ventilation grille 326 has a height equal to 1U.

In practice, the frontal portion of a drawer with a height N×U, with N an integer between 1 and 6, comprises N ventilation grilles. For example, the frontal portion 326 of the drawer of height 4U of FIGS. 13 and 14 comprises four ventilation grilles 326 and the frontal portion of the drawer of height 2U visible in FIG. 8 comprises two ventilation grilles 326.

The drawer 138 comprises a base 328, which has a height equal to 1U and a cover 330.

The base 328 is the main structure of the drawer. The frontal portion of the drawer is attached to the base 328 and the drawer is installed and secured in the motor start-up module 200 by the base 328.

In practice, the electromagnetic lock 311 is arranged in the base 328 of the drawer.

The base 328 is horizontal and the elements contained in the drawer, which are detailed below, are attached thereto.

In the example shown in FIGS. 8, 9, 13 and 14, the base 328 is located at the bottom of the drawer 138.

The cover 330 is a protection structure, which makes it possible to close the drawer 138 and to protect the elements contained in the drawer. In practice, the shape of the cover 330 is dependent on the height of the drawer 138. Thus, each drawer height has a corresponding cover height.

When the drawer 138 has a height equal to 1U, the cover 330 is formed by a planar and horizontal plate 332. Such an example is visible in FIG. 9. In such an example, it is considered that the height of the cover 330 is 0×U.

As can be seen in FIGS. 13 and 14, when the drawer 138 has a height greater than 1U, the cover 330 comprises a horizontal planar plate 332, two lateral walls 334 which extend from two opposite edges of the planar plate towards the base 328 and which are parallel to a plane formed by the Y- and Z-axes, and a back wall 336 which extends from an edge of the planar plate opposite the frontal portion 300 of the drawer towards the base 328 and which is parallel to a plane formed by the X- and Z-axes. In such a configuration, the height of the cover 330 is 1U shorter than the height of the drawer 138.

Thus, the height of the cover 330 is between 0U and 5U.

In practice, in the example of FIGS. 13 and 14 which corresponds to a drawer of height 4U, the cover 330 has a height equal to 3U. Thus, when it is positioned on the base 328, the cover 330 extends from the base to the top of the drawer 138, i.e. the planar plate 332 of the cover 330 is at the level of the upper edge of the frontal portion 300.

In the case of a drawer with a height equal to 2U or 3U, the back wall 336 of the cover 330 comprises one ventilation orifice 338.

In the case of a drawer with a height equal to 4U, 5U, or 6U, the back wall 336 of the cover 330 comprises two ventilation orifices 338.

As a variant, the back wall 336 of the cover of a drawer of height 6U comprises three ventilation orifices 338.

In FIGS. 15 and 16, a drawer 138 of height equal to 1U is shown without its cover 330 which is the same as that shown in FIG. 9.

In FIG. 15, it is possible to see the frontal portion 300 of the drawer 138, the slider 312 of which is in the position for unlocking the button 310, i.e. the slider is to the left of the window 314 in the base 306 and the button 310 may be actuated to unlock the drawer 138 from the motor start-up module 200.

The base 328 comprises a support plate 340. The support plate 340 is in the shape of a "U", i.e. it comprises a main portion 342, which is horizontal, and which is in practice the bottom of the drawer 138, and two vertical walls 344, which extend parallel to the plane formed by the Y- and Z-axes.

The base 328 comprises, in addition, two lateral structures 346. The lateral structures 346 are attached on the exterior of the vertical walls 344 of the support plate 340 by fastening means such as for example screws 347. In practice, the lateral structures 346 extend from the frontal portion 300 of the drawer 138 along the Y-axis to the back of the drawer, i.e. to a back portion 348 of the drawer opposite its frontal portion, this back portion 348 of the drawer also belonging to the base 328 of the drawer 138.

The lateral structures 346 therefore belong to the base 328 of the drawer 138.

In practice, the structure 822 of the mechanical lock 820 is secured to a lateral structure 346.

Each lateral structure 346 comprises rollers 350, preferably two rollers 350.

The rollers 350 each have an axis X350 parallel to the X-axis and are configured to roll in the rails 224 of the structure 202 of the motor start-up module and in the rails 250 of the protection unit 140. Thus, the diameter of the rollers 350 is smaller than the separation between the two edges of the rails 224 and 250.

In practice, each drawer 138 is installed in the volume V1 in the motor start-up module 200. For that, a first lateral structure 346 is inserted into a first rail of the rails 224 and 250 and a second lateral structure 346 is inserted in a second rail of the rails 224 and 250 of the same pair of rails, and then the rolling of the rollers 350 on the rails makes it possible to insert the drawer into the motor start-up module and to remove it therefrom.

Thus, the drawer 138 is mobile in the motor start-up module between the three main positions of the drawer, by virtue of the lateral structures 346.

Each lateral structure 346 further comprises a mobile lateral contact 352, which makes it possible to connect the drawer 138 to a communication interface 353 which belongs either to the input-output module 206 or to the protection unit 140 and the operation of which is explained below.

The back portion 348 of the drawer 138 extends between the two lateral structures 346.

In the case of a drawer of height 1U, the cover 330 extends from the frontal portion 300 to the back portion 348 and between the two lateral structures 346.

In the case of a drawer of height greater than or equal to 2U, the lateral walls 334 of the cover 330 extend up to the vertical walls 344 and the back wall 336 of the cover extends up to the back portion 348.

The back portion 348 comprises a group of upstream connectors 354, a group of downstream connectors 356 and a ventilation orifice 358.

The upstream 354 and downstream 356 connectors are therefore installed on the base 328 of the drawer 138.

As can be seen more clearly in FIG. 16, the ventilation orifice 358 is located between the group of upstream connectors 354 and the group of downstream connectors 356, along the longitudinal X-axis of the drawer 138. Advantageously, the ventilation orifice 358 is centred with respect to the base 328, along the X-axis. In addition, the groups of upstream 354 and downstream 356 connectors are arranged symmetrically on either side of the ventilation orifice 358.

When a drawer is installed in the motor start-up module 200, the ventilation orifice 358 is located facing a ventilation orifice 214 of the back support 210.

In practice, the back portion 348 comprises four upstream connectors 354 and four downstream connectors 356.

When the drawer 138 is in operating position, the upstream connectors 354 are fitted onto the four electrical outputs 248 of a group of electrical outputs 246 of the protection unit 140. Thus, the drawer 138 is supplied with electrical power from an electrical power supply line, via the protection unit 140. In other words, the protection unit 140 is a source of electricity for the drawer 138.

When the drawer 138 is in operating position, the downstream connectors 356 are fitted onto an external connection module 208. Thus, the drawer 138 supplies electrical power to an external connection module 208 and makes it possible to supply power to an electrical load 104 when such a load is connected to the external connection module 208.

When the drawer 138 is in test position or in disconnected position, the upstream 354 and downstream 356 connectors are unplugged from the electrical outputs 248 of the protection unit 140 and of the external connection module 208, respectively.

Figure 17:
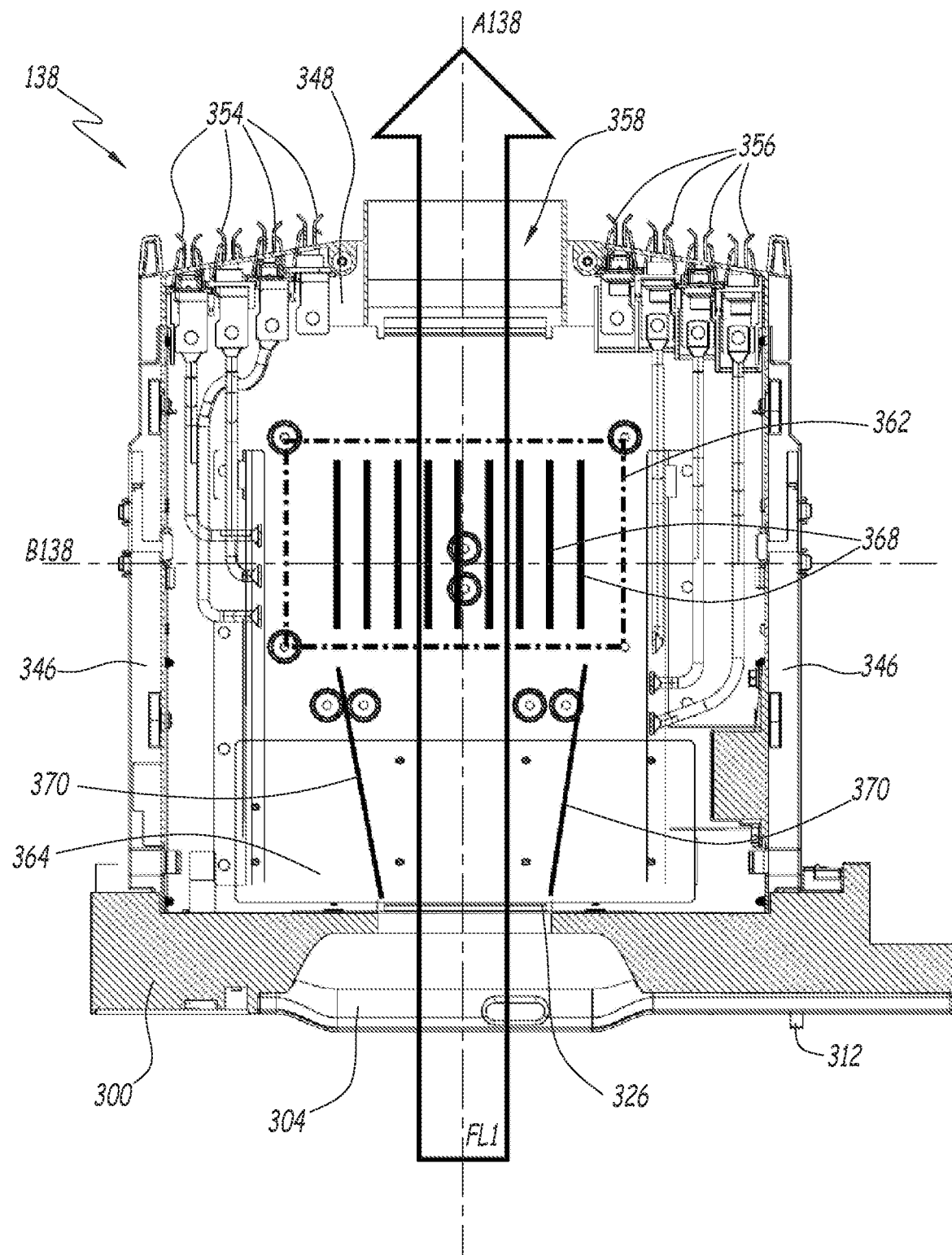
FIG. 17 is a view from above of the second monitoring-and-control unit of FIG. 15, in section along the plane XVII in FIG. 15.

The drawer 138 comprises functional elements 362, which are not shown in detail but the location of which is marked by dashed lines in FIG. 17. In a known manner, these functional elements 362 make it possible to control the electrical load 104, in practice an electric motor, and allow the operation of the drawer 138.

These functional elements comprise in particular:
at least one contactor;
a thermal protection relay, for example a bimetallic electromechanical relay or an electronic relay, which has the role of protecting the electric motor supplied with power by the drawer 138 from potential overloads which may occur in particular on starting up the motor;
sensors for the operation of the drawer 138, such as for example sensors for the voltage of the electrical power supply from the upstream connectors 354; and
electronic components configured to collect signals from sensors for the operation of the electrical load 104, arranged on, or close to, the electrical load 104, such as for example temperature probes or speed sensors.

In practice, the contactor is directly connected to the upstream connectors 354 by connection busbars 360 and to the downstream connectors 356 by downstream connection busbars 361. In practice, one connection busbar 360 or 361 is provided per connector 354 or 356. In FIGS. 15 and 16, just three connection busbars are shown for the sake of simplicity, namely those of the phases of the current.

Thus, the contactor may, in a known manner, selectively interrupt or allow the flow of an electric current between the upstream connectors 354 and the downstream connectors 356. By virtue of the contactor, it is possible to supply electrical power to the electrical load 104, which makes it possible for example to start up and then to run an electric motor when the flow of a current is allowed, and to stop the operation of such a motor when the current is interrupted.

Additionally, the drawer 138 may contain a plurality of contactors, which makes it possible for example to control the voltage delivered to the electrical load 104 in order to control, for example, the rotational speed of a motor; or to control the direction of rotation of a motor.

The drawer 138 also comprises a control circuit board 364. The control circuit board is attached to support plate 340.

The control circuit board 364 is connected to the communication module 134 of the motor start-up column 110. It makes it possible to control the functional elements 362 of the drawer 138, such as the contactor, the thermal protection relay, the display 302 according to the commands from the communication module. It also makes it possible to group together the information from the sensors for the operation of the drawer and the information from the electronic components configured to collect signals from the sensors for the operation of the electrical load, before analysing it and transmitting it to the communication module 134.

According to this analysis of the information from the sensors for the operation of the drawer and of the electrical load, the control circuit board 364 may adapt its control of the functional elements 362, for example by giving the contactor the order to interrupt the supply of power to the electrical load when an operation sensor returns a malfunction in the electrical load.

Thus, by virtue of the functional elements 362 and of the circuit board 364, each drawer 138 supplies power to an electrical load 104, controls this electrical load and monitors this electrical load. Each drawer 138 therefore simultaneously has a role of supplying power to, of controlling and of monitoring an electrical load 104.

The control circuit board 364, the functional elements 362 and the electromagnetic lock 311 of the drawer are supplied with first auxiliary voltage.

The electromagnetic lock 311 is in practice controlled by the control circuit board 364 and the button 310 communicates with the control circuit board.

When the button 310 is actuated, it sends a control signal to the control circuit board 364, requesting the activation of the electromagnetic lock 311 so as to move into the position for unlocking the drawer 138.

In this case, the control circuit board 364 performs verification operations, after receiving the signal from the button 310 and before moving the electromagnetic lock into the position for unlocking the drawer.

These verification operations consist, for example, in analysing the information from the sensors for the operation of the drawer and from the sensors for the operation of the electrical load 104, so as to move the electromagnetic lock 311 into the position for unlocking the drawer only if the operating states of the drawer, for example of the functional elements 362, and/or of the electrical load are satisfactory.

The control circuit board is configured so that if, during these verification operations, a fault in the drawer 138, for example in one of the functional elements 362, or in the electrical load 104, for example in one of the sensors for the operation of the electrical load, is detected, then the lock 311 is not moved into the position for unlocking the drawer and so that, preferably, a message informing of this fault is displayed on the display 302.

Thus, by virtue of the electromagnetic lock 311, the opening of which is controlled by the button 310 and validated by the control circuit board 364, the drawer 138 may be unlocked, i.e. moved from its test position or from its operating position, only after validation of the correct operating state of the drawer 138 and/or of the electrical load 104.

This validation prior to unlocking the drawer 138 is particularly advantageous, since it makes it possible to make the use of the electrical enclosure 100 and of the electrical load 104 safe by ensuring the correct operation of the drawer and of the electrical load before their connection.

The choice of the height of a drawer 138—i.e. from 1U to 6U—is dependent on the power that has to be delivered to the electrical load 104. Specifically, the higher the power consumed by the electrical load 104, the larger the dimensions of the contactor and of the other functional elements.

Thus, a contactor controlling a motor of low power, for example up to 11 kW, will be relatively small and could be installed in a drawer of height 1U, whereas a contactor controlling a motor of high power, for example 75 kW, will be larger and will have to be installed in a drawer of height 6U. A contactor controlling a motor of intermediate power, for example 30 kW, will be for example installed in a drawer of height 3U.

The design of the drawers 138 described here is advantageous, since the base 328, which constitutes the main structure of the drawer allowing its installation in the motor start-up module and which bears all of the electrical connectors—upstream and front connectors, lateral contacts—and the functional elements 362 of the drawer 138, is common to the six heights of the drawer 138.

By virtue of the frontal portion 300 and of the cover 330, the heights of which are adapted to the dimensions of the functional elements 362, the drawer 138 is modular.

Thus, it is straightforward to adapt the height of a drawer 138 to the dimensions of a contactor and of the other functional elements, since only the frontal portion 300 and the cover 330 differ between drawers 138 of different height.

The functional elements 362 of a drawer 138 heat up during their operation, in particular the contactor and the thermal protection relay. The heat thus produced heats the air contained in the drawer 138, which then has to be replenished in order to maintain an interior temperature compatible with the normal operating conditions of the functional elements of the drawer.

An air flow FL1 flowing through a drawer 138 is shown in FIG. 17.

In this figure, the siting of the functional elements 362 of the drawer 138 is shown with dashed lines. It is observed that the air flow FL1 flows at the level of these functional elements, which allows their cooling by heat exchange. In practice, when the air flow FL1 flows at the level of these functional elements, the air flow cools the functional elements while heating up itself.

The amount of heat produced by the functional elements 362 of the drawer depends in particular on the electrical power of the motor 104 controlled by this drawer. In the case of an electric motor of low power, for example up to 11 kW, the heat produced will be removed from the drawer 138 of height 1U controlling this motor by the air flow FL1 which is caused by natural convection.

This natural convection occurs by virtue of the ventilation grille 326 of the frontal portion 300 of the drawer 1U and of the ventilation orifice 358 of the back portion 348 of the drawer.

In practice, the air flow FL1 enters via the ventilation grille 326 and exits via the ventilation orifice 358.

In the case of an electric motor of higher power, for example of between 11 kW and 75 kW, the drawer 138 controlling this motor will have a height of between 2U and 6U, depending on the power of the motor. In such a configuration, the air flow FL1 allowing the cooling of the drawer enters via the ventilation grilles 326 of the frontal portion 300 and exits on the one hand via the ventilation orifice 358 of the back portion 348 and on the other hand via the one or more ventilation orifices 338 of the back wall 336 of the cover 330.

In other words, the ventilation orifice 358 of the back portion 348 and the one or more ventilation orifices 338 of the back wall 336 of the cover 330 together form a back ventilation region 359 of the drawer 138. The back ventilation region of the drawer is therefore located at the level of the back portion 348 of the drawer.

In the case of a drawer 138 of height 1U, the back ventilation region 359 of the drawer is akin to the ventilation orifice 358 of the back portion 348 of the drawer.

In practice, in the case of a drawer with a height of between 2U and 6U, the drawer 138 comprises one or more fans 366 to force the air flow FL1 to flow through the drawer 138.

Each fan 366 is arranged on the back wall 336 of the cover and has a height slightly shorter than 2U. The fans 366 are configured to expel the air contained in the drawer 138 out of the drawer.

When the drawer 138 has a height equal to 2U or to 3U, it comprises one fan 366. This fan is arranged between the ventilation orifice 358 of the back portion 348 of the drawer and the ventilation orifice 338 of the cover 330. In other words, this fan is arranged on the back ventilation region 359 of the drawer.

When the drawer 138 has a height equal to 4U, as can be seen in FIG. 14, 5U or 6U, it comprises two fans 366, which are superposed, a first of which is arranged between the ventilation orifice 358 of the back portion 348 of the drawer and a first ventilation orifice 338 of the cover and a second of which is arranged entirely on a second ventilation orifice 338 of the cover. In other words, these two fans are arranged on the back ventilation region 359 of the drawer.

When the drawer 138 has a height equal to 6U, it optionally comprises a third fan 366 arranged on a third ventilation orifice 338.

By virtue of the one or more fans 366, the replenishment of the air in the drawer 138 is improved and the cooling of the functional elements is more effective.

Advantageously, the control circuit board 364 controls the one or more fans 366 to optimize their operation.

Advantageously, the control circuit board 364 is configured to stop the fans 366 when the functional elements of the drawer 138 are not generating any heat, in particular when the electrical load 104 is not being supplied with electrical power.

According to another advantageous approach, the drawer 138 comprises a temperature sensor measuring the temperature inside the drawer 138 and the rotational speed of the fans 366 is adapted according to the temperature inside the drawer 138, i.e. the rotational speed increases when the temperature is high in order to accelerate the replenishment of air and decreases when the temperature inside the drawer is satisfactory.

Advantageously, the drawer 138 comprises one or more radiators 368, one of which is shown in FIG. 17, which are arranged on one or more functional elements 362 and which make it possible to increase the exchange of heat with the air flow FL1 flowing through the drawer 138, thereby improving the cooling of these functional elements.

In this case, advantageously, the drawer 138 comprises deflectors 370 which concentrate the air flow FL1 onto these radiators 368. In practice, the deflectors 370 are for example sheets which direct the air flow along its journey through the drawer. The presence of deflectors in the drawer 138 results in modifying the flow of the air through the drawer 138, without modifying its main direction, i.e. from the frontal portion 300 to the back ventilation region 359.

The fact that the air enters into the drawer 138 via its frontal portion 300 and exits therefrom via its back ventilation region 359 is advantageous. Specifically, these two portions are arranged at two ends of the drawer, along the Y-axis, and the air flow flowing through the drawer then flows directly between these two ends along the Y-axis, i.e. it does not undergo any significant change in direction, which is more effective than an air flow in which the air inlet and the air outlet are located on the same face, for example the frontal face. Specifically, any variation in the direction of flow of an air flow slows this air flow.

In other words, the air flow FL1 goes through the drawer from one side to the other without significant change in direction. What is meant by "without significant change" is that the air flow FL1 does not follow any curve having an angular amplitude greater than 30°, preferably greater than 15°.

In practice, the air flow FL1 is disrupted when it comes into contact with the functional elements 362, but these disruptions do not constitute a change in the main direction of the air flow and are necessary to provide heat exchange between the air and the functional elements.

Furthermore, the total height of the ventilation grilles 326 of the frontal portion 300 is substantially equal to the height of the back ventilation region 359 of the drawer 138. In other words, the back ventilation region 359 of the drawer and the ventilation grilles 326 of a drawer 138 extend over the entire height of the drawer, whatever the height of the drawer. Thus, the air flow FL1 goes through the drawer 138 from one side to the other without change in vertical direction, i.e. the air flow FL1 is horizontal.

By virtue of this heat management based on an air flow through the drawer 138 from one side to the other, the cooling of the functional elements of the drawer 138 is improved.

Additionally, this heat management based on an air flow through an element from one side to the other also makes it possible to cool the communication module 134.

Specifically, the communication module 134 comprises a front ventilation grille 180, on its front face 176, and a back ventilation grille 184, on its back face 178, which have a role analogous, respectively, to the ventilation grilles 326 of the frontal portion 300 of the drawers 138 and to the ventilation orifice 358 of the back portion 348 of the drawers 138.

The back ventilation grille 184 therefore has a role analogous to the back ventilation region 359 of the drawer 138.

The communication module 134 is therefore also passed through from one side to the other by an air flow FL1, without significant change in direction.

This air flow makes it possible to cool the elements producing heat in the communication module 134, in practice the one or more power supply blocks 150 and the circuit board 188.

As a variant (not shown) of the invention, the communication module 134 comprises, in addition, at least one fan installed in order to force the air flow FL1 through the communication module and arranged on the back ventilation grille 184 and/or on the front ventilation grille 180. Preferably, these one or more fans are controlled by the circuit board 188.

As a variant (not shown) of the invention, the communication module 134 comprises, in addition, at least one radiator, arranged on the one or more power supply blocks 150 or on the circuit board 188. Preferably, the communication module 134 further comprises at least one deflector, configured to direct the air flow FL1 towards the one or more radiators.

What is meant by "functional unit" is a unit which is either a communication module 134, or a monitoring-and-control unit 138, in the example a drawer 138, and which is cooled by the air flow FL1.

The drawer 138 has a width, measured along the Y-axis, equal to l2, i.e. 400 mm. This width is measured between the frontal portion 300 and the back portion 348 of the drawer.

When the motor start-up module 200 is installed in an enclosure 100 of width €2 equal to 400 mm like in the embodiment of FIG. 4, the back portion 348 of each drawer is located at the level of the back face F2 of the enclosure 100. Additionally, the sheet 166 forming the back face of the enclosure 100 comprises ventilation grilles. These ventilation grilles are arranged facing the ventilation region 359 of each drawer. Thus, the ventilation region 359 of a drawer 138 connects the interior of this drawer to the exterior of the enclosure, through these ventilation grilles. In such a configuration, the air flowing through the drawer 138 exits directly out of the enclosure 100, via its back face.

When the motor start-up module 200 is installed in an enclosure 100 of width l1 equal to 600 mm like in the embodiments of FIGS. 1 to 3 and 5, the back portion 348 of each drawer is located at the level of the interface between the functional region 156, which comprises the motor start-up module 200, and the heat management region 162. Thus, the ventilation region 359 connects the interior of the drawer 138 to the heat management region 162 of the enclosure. In such a configuration, the airflow FL1 flowing through the drawer 138 exits into the heat management region 162 of the enclosure.

In addition, in such a configuration, the air flowing through the communication module 134 also exits into the heat management region 162 of the enclosure, via the back ventilation grille 184 of the communication module.

The heat management region 162 is an essentially empty column, which extends over the entire height of the enclosure 100. Thus, the air exiting from drawers 138, heated by the functional elements 362 of these drawers, rises through convection to the top of the heat management region 162, the same as for the air exiting from the communication module 134.

Additionally, the heat management region 162 comprises an upper face, at the top of the enclosure 100, which is in practice a portion of the upper face F4 of the enclosure. This upper face comprises an escape grille 372, visible in FIG. 2. This escape grille allows the hot air to exit from the heat management region 162. Thus, an air flow FL2 from the drawers 138 and from the communication module 134 rises through the heat management region 162 and exits via the top of the heat management region 162, i.e. via the upper face F4 of the enclosure 100, as shown in FIG. 2.

In other words, the heat management region 162 has the role of a chimney for the escape of the hot air from the drawers 138 and from the communication module 134.

Optionally, the upper face of the heat management region, which corresponds to the upper face F4 of the enclosure, comprises an extraction fan 374, which draws the air contained in the heat management region in order to expel it from the enclosure 100. By virtue of such a fan, the removal of the hot air flow FL2 is facilitated. By virtue of the heat management region 162, which allows extraction of the hot air from all of the drawers 138, and from the communication module 134, via the top of the enclosure 100, it is possible to install the enclosure 100 such that its back face is obstructed, for example by positioning the enclosure against a wall, or back-to-back with a second enclosure 100, without negatively affecting the heat management of the drawers 138 and of the communication module 134.

As a variant, the fans 366 are arranged on the ventilation grilles 326 of the frontal portion of the drawer 138 and facilitate the entry of the air flow FL1 into the drawer.

As a variant, the fans 366 are arranged both on the ventilation grilles 326 of the frontal portion of the drawer and on the back ventilation region 359.

Additionally, when the enclosure 100 does not comprise a cabling region 160, like in the embodiment of FIG. 5, the connection of the cables 139 is performed in the heat management region 162, but the cables 139 are not arranged in the air flow FL2 and therefore do not affect the cooling of the enclosure. Specifically, the cables are located at the back of the connection region 158 while the air flow FL2 is located at the back of the functional region 156.

As a variant, the heat management of a drawer 138 and of an enclosure 100 comprising one or more drawers 138 described above is applied to drawers 138 installed in current distribution columns or load driving columns.

As a variant, the heat management of a drawer 138 and of an enclosure 100 comprising one or more drawers 138, described above and comprising the use of the grilles 326 and of the orifices 338 and 358, is applied to monitoring-and-control units 138 which are fixed units of the enclosure.

Figure 18:
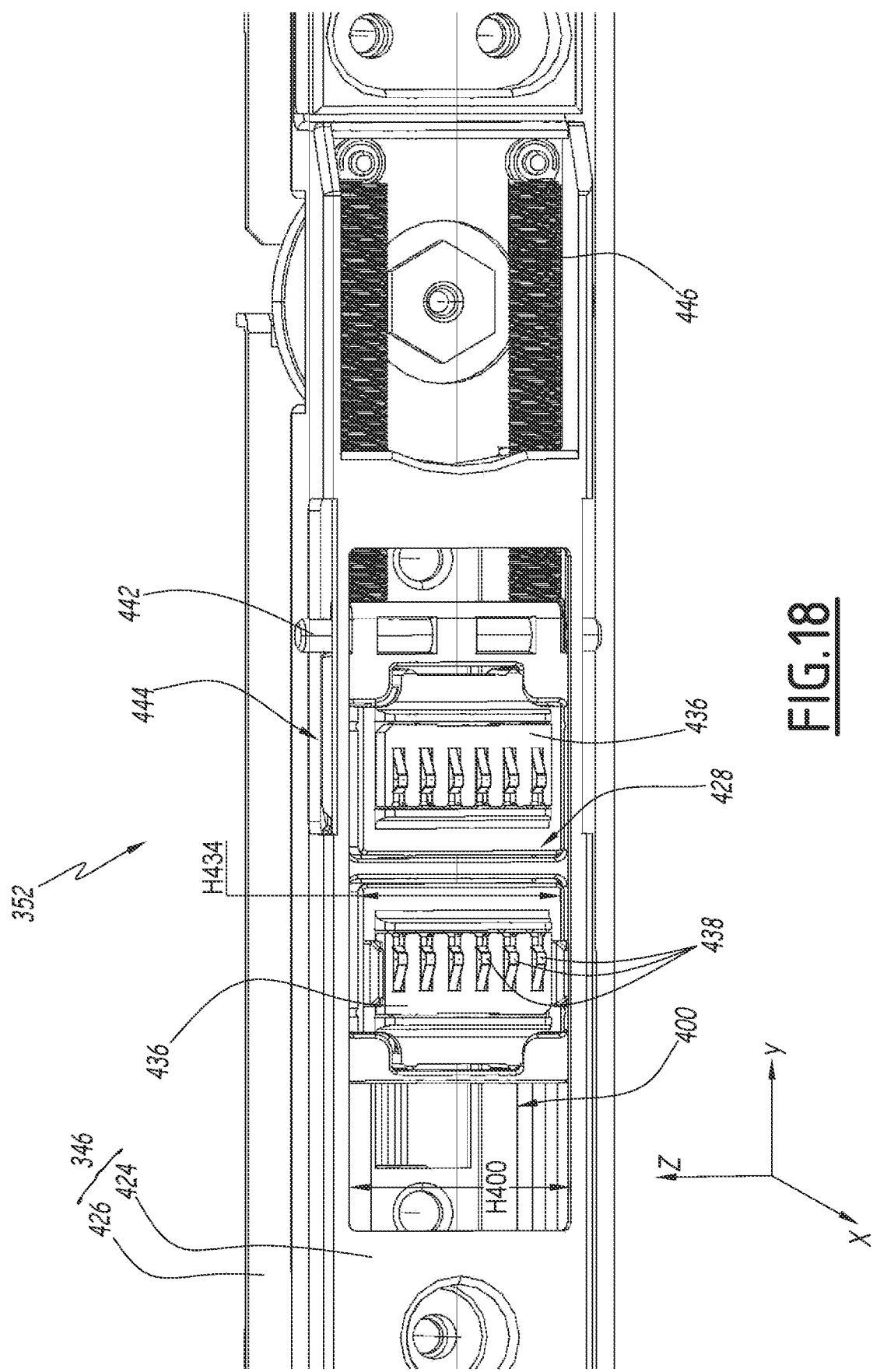
FIG. 18 is a perspective view of a mobile lateral contact belonging to an enclosure according to one of FIGS. 1 to 5.

FIG. 18 is a perspective view of a mobile lateral contact 352 of a lateral structure 346. Each mobile lateral contact 352 is in practice arranged at the level of a window 400 made in the lateral structure 346 and of a window 402 made in the vertical wall 344.

Each drawer 138 comprises two mobile lateral contacts 352, each arranged in a lateral structure 346. Of these two mobile lateral contacts, a first makes it possible to connect the drawer 138 to the communication interface 353 of the input-output module 206 and a second makes it possible to connect the drawer 138 to a communication interface 353 of the protection unit 140. The design and the operation of these two mobile lateral contacts are identical.

As a variant, the drawer 138 comprises just one mobile lateral contact 352, arranged in a lateral structure 346, which makes it possible to connect the drawer 138 either to the communication interface 353 of an input-output module 206, or to the communication interface 353 of the protection unit 140.

In practice, each input-output module 206 comprises one communication interface 353 and the protection unit 140 comprises six communication interfaces 353, arranged in the windows 256.

Each mobile lateral contact 352 comprises a plate 404. The plate 404 comprises a main body 406 which has a shape that is elongate along the Y-axis and two wings 408 which extend perpendicular to the main body 406 along the X-axis.

The main body 406 of the plate comprises an opening 410.

In practice, the main body 406 has a height along the Z-axis that is shorter than the height of the window 402 of the vertical wall 344.

Figure 19:
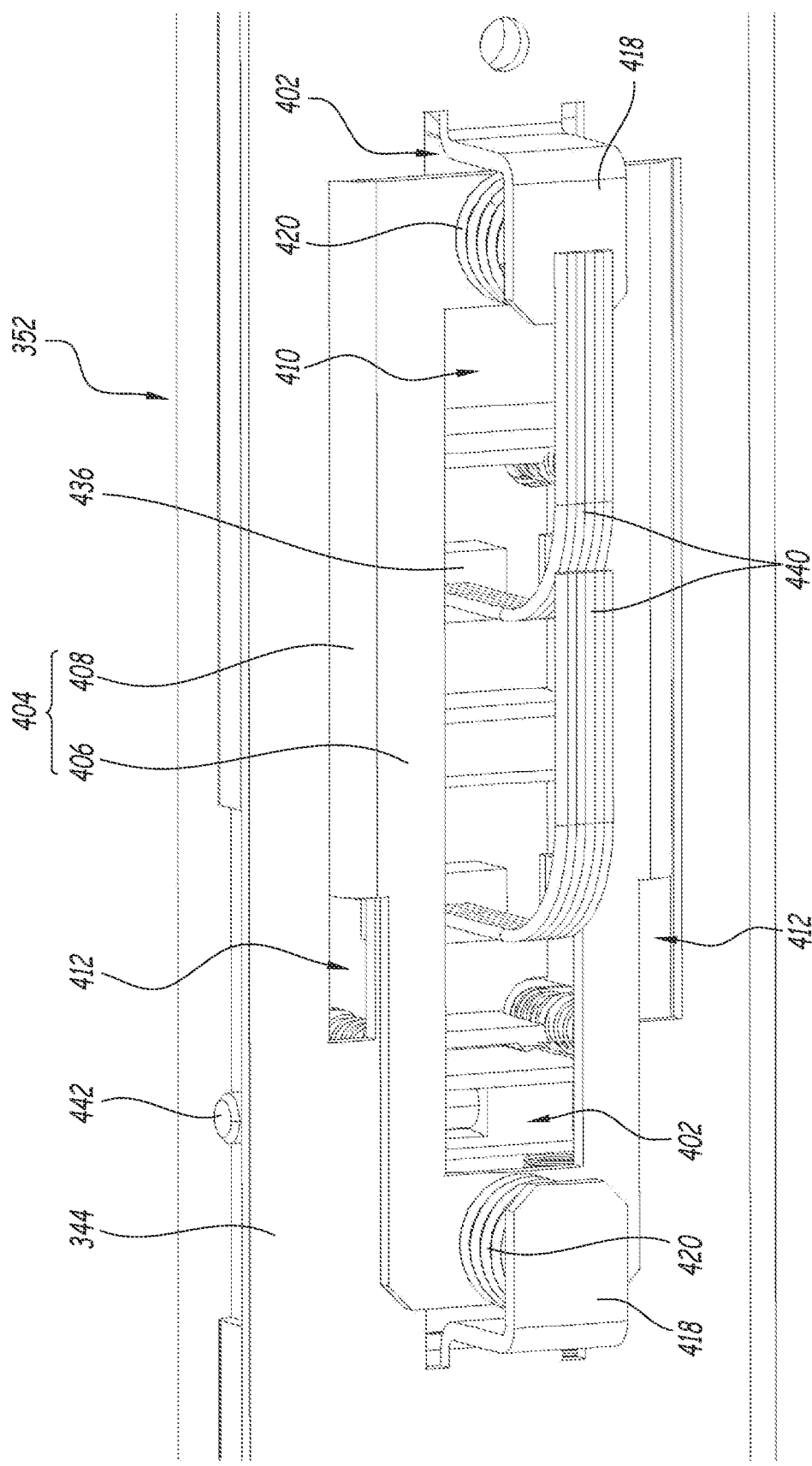
FIG. 19 is a perspective view of the mobile lateral contact of FIG. 18 viewed from another angle.

As can be seen in FIG. 19, the plate 404 is arranged inside the drawer 138, in contact with the face of the vertical wall 344 facing the interior of the drawer 138.

The two wings 408 of the plate extend towards the exterior of the drawer 138, are arranged in two slots 412 in the vertical wall 344 and extend between the vertical wall 344 and the lateral structure 346.

Each wing comprises an end edge 414, parallel to the Y-axis and a chamfer 416, which connects the end edge 414 to the main body 406 of the plate 404.

The vertical wall 344 comprises two holding brackets 418, which are located facing the window 402 and formed by cutting out and folding the vertical wall 344. In practice, the holding brackets 418 comprise a first portion which extends perpendicular to the vertical wall 344 towards the interior of the drawer 138 and a second portion which extends perpendicular to the first portion, i.e. parallel to the vertical wall 344, so as to extend facing the window 402.

The plate 404 is held in position in relation to the drawer 138 by the wings 408, arranged in the slots 412, by the brackets 418, which prevent the plate from translating towards the interior of the drawer 138 along the X-axis, and by the vertical wall 344, which prevents the plate from translating towards the exterior of the drawer along the X-axis.

The plate 404 is fixed in relation to the drawer 138 along the Y-axis.

Additionally, a spring 420 is arranged between each bracket 418 and the main body 406 of the plate. The two springs 420 allow the plate 404 to be held against the vertical wall 344.

Each mobile contact 352 also comprises a frame 422, arranged between the vertical wall 344 and the lateral structure 346.

In practice, the lateral structure 346 comprises a main wall 424 and two secondary walls 426. The main wall 424 is parallel to the vertical wall 344 of the support plate 340 and the two secondary walls 426 extend from the main wall 424 towards the vertical wall 344, as can be seen for one of them in FIG. 15.

Thus, the lateral structure 346 defines an interior volume between the main 424 and secondary 426 walls and the vertical wall 344 of the support plate 340.

The frame 422 is arranged inside the interior volume of the lateral structure 346 and is mobile in this interior volume, along the Y-axis.

In practice, the frame 422 is not mobile along the X-axis since it is in contact on the one hand with the vertical wall 344 and on the other hand with the main wall 424.

The height H422 of the frame 422 is shorter than the distance, measured along the Z-axis, which separates the two secondary walls 426 of the lateral structure 346.

The height of the frame 422 is greater than the height H400 of the window 400 in the lateral structure, such that the frame cannot exit from the interior volume of the lateral structure via the window 400.

Figure 20:
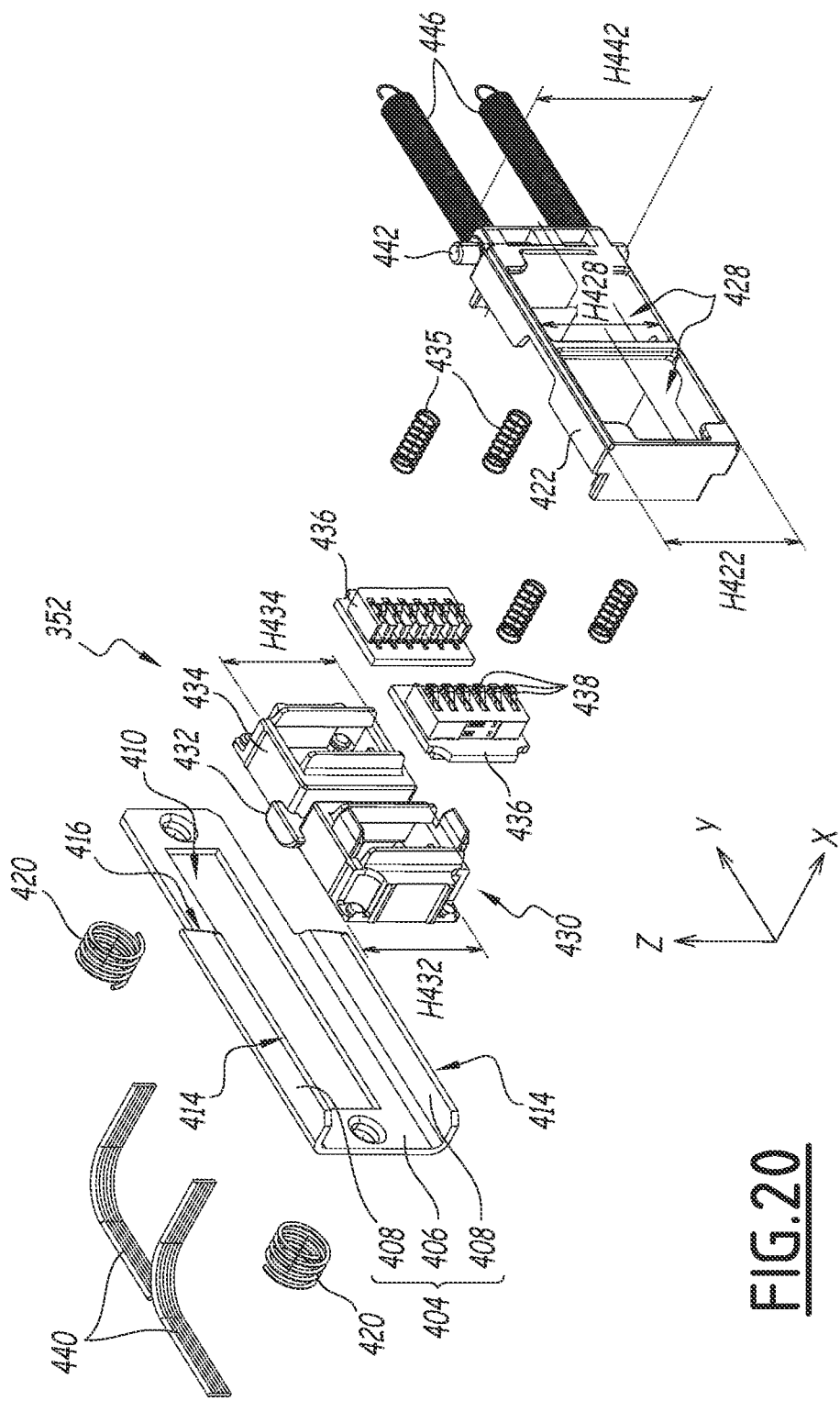
FIG. 20 is an exploded perspective view of the mobile lateral contact of FIGS. 18 and 19.

As can be seen in FIG. 20, the frame 422 comprises two openings 428 of height H428 which go through the frame 422 along an axis parallel to the X-axis.

Each mobile lateral contact 352 also comprises a contact housing 430. The contact housing comprises a fixture 432 from which two contact holders 434 extend, on each side of the fixture 432, along the Y-axis.

The height of each contact holder 434, denoted by "H434", is shorter than the height H428 of the openings 428.

The height of the fixture 432, denoted by "H432", is greater than the height H428 of the openings 428.

The contact housing 430 is arranged in the interior volume of the lateral structure 346, between the frame 422 and the vertical wall 344, and extends partially out of this interior volume, along the X-axis, through the window 400. In practice, the frame 422 bears the contact housing 430. Each contact holder 434 passes through an opening 428 in the frame 422. In other words, the frame 422 guides the movement of the contact housing 430 along the Y-axis in the lateral structure 346.

Figure 21:
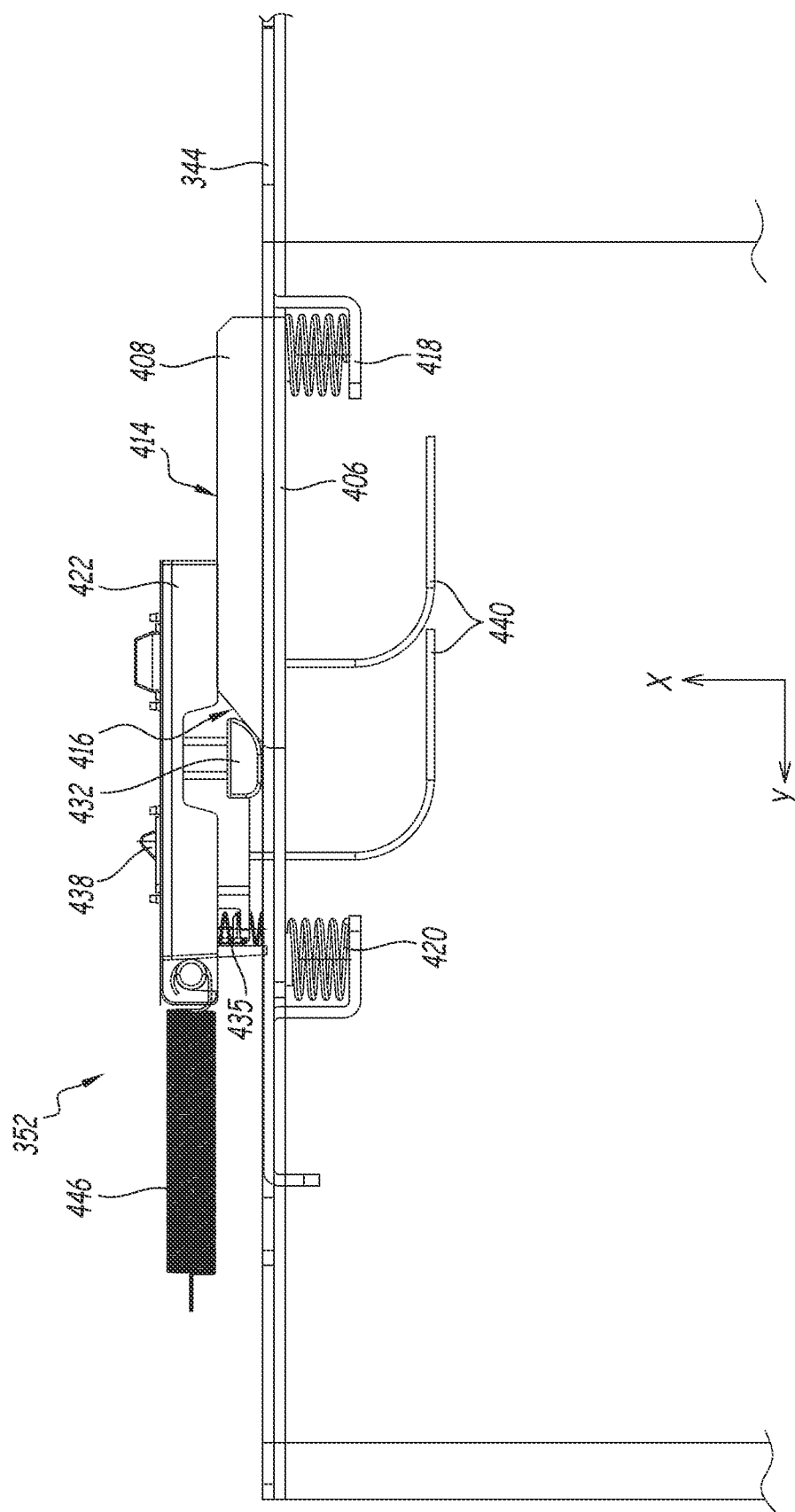
FIG. 21 is a view from above of the mobile lateral contact of FIGS. 18 and 19 in a first position.
Figure 22:
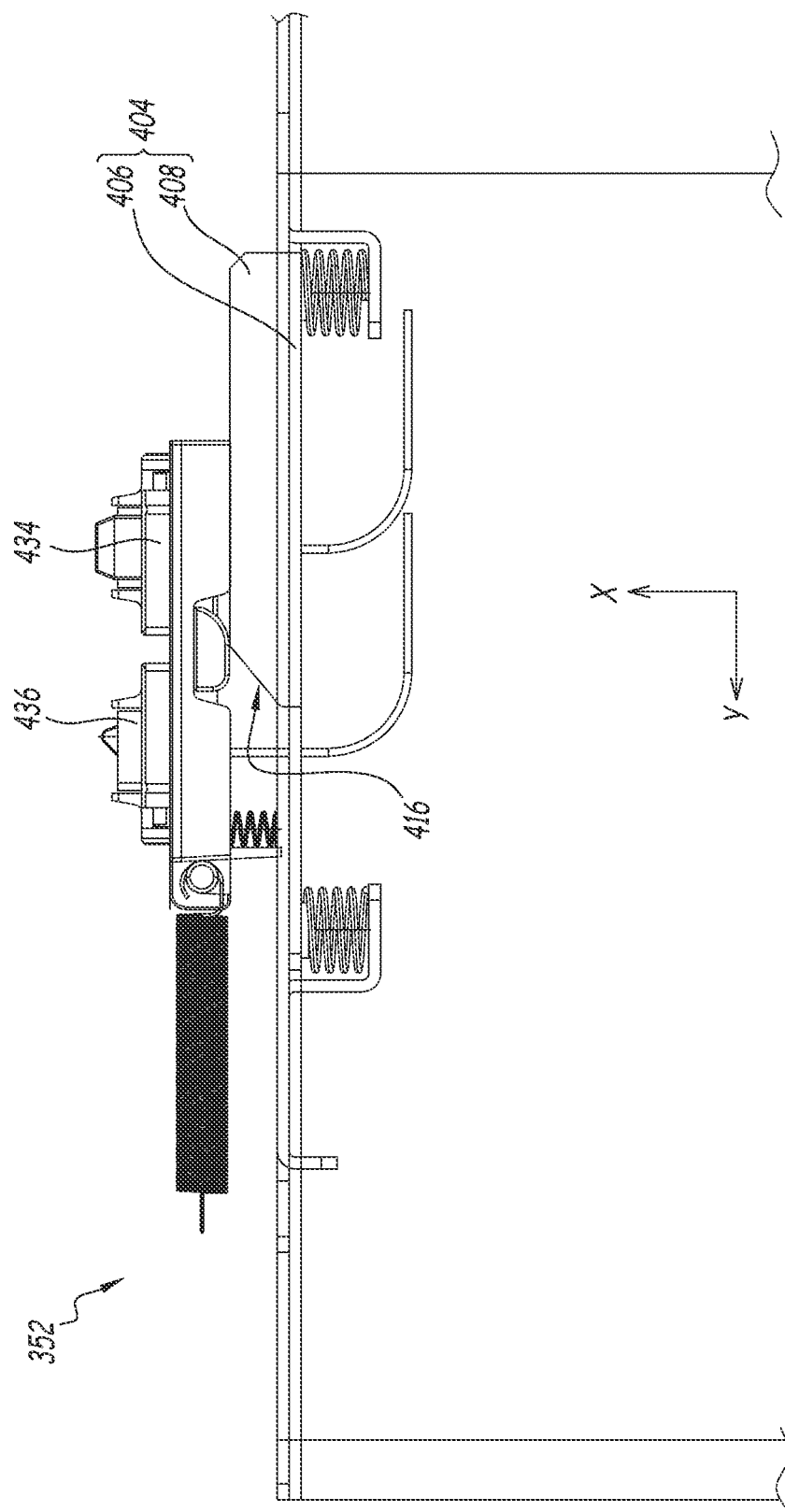
FIG. 22 is a view from above of the mobile lateral contact of FIGS. 18 and 19 in a second position.
Figure 23:
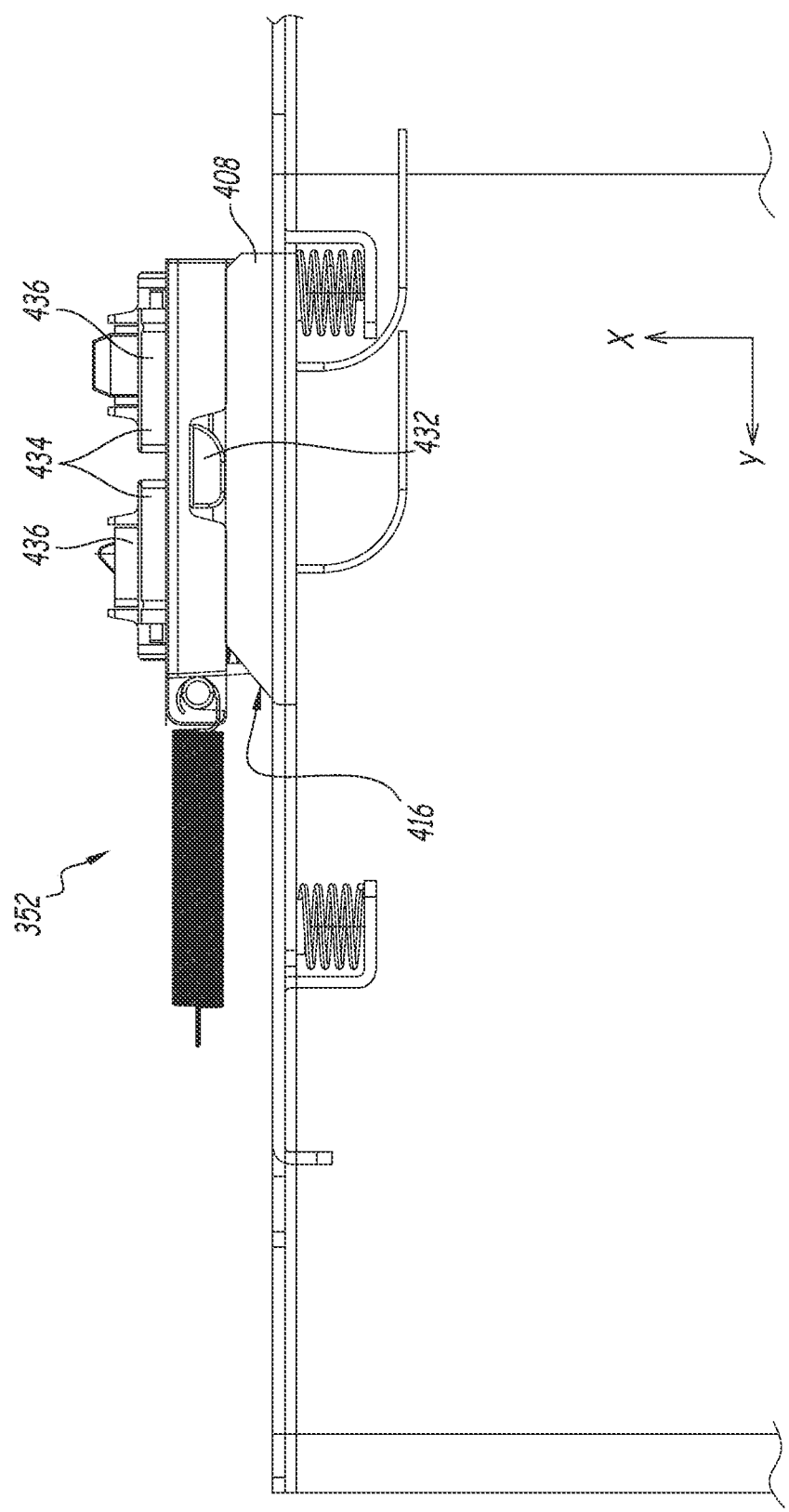
FIG. 23 is a view from above of the mobile lateral contact of FIGS. 18 and 19 in a third position.

The contact housing 430 is mobile along the X-axis in the frame 422. Its translational motion along the X-axis is limited, on the one hand, by the vertical wall 344 and, on the other hand, by the fixture 432 which comes into contact with the frame 422, as can be seen in FIGS. 21, 22 and 23.

Each mobile lateral contact 352 comprises springs 435, in practice four springs 435. The springs 435 are arranged between the contact housing 430 and the frame 422 and are configured to exert a force which distances the contact housing 430 from the frame 422, along the X-axis. Since the frame 422 is not mobile along the X-axis, the force exerted by the springs 435 results in the contact housing 430 being moved along the X-axis in relation to the drawer 138, towards the interior of this drawer.

Each mobile lateral contact 352 also comprises two electrical contacts 436.

Each electrical contact 436 is arranged securely in a contact holder 434.

The electrical contacts 436 each comprise flexible connectors 438.

The flexible connectors 438 are configured to be able to connect the drawer 138 either to an input-output module 206, or to the protection unit 140. This connection is described below.

Cables 440 are additionally connected to the control circuit board 364 of the drawer 138. In FIGS. 18 to 23, the cables 440 are shown only partially.

In practice, the cables are connected to the flexible connectors 438 and extend from the back of the electrical contacts 436 through the window 402 in the vertical wall 344 and through the opening 410 in the plate 404, into the interior of the drawer 138.

Each mobile lateral contact 352 also comprises a guide shaft 442. The guide shaft is preferably a cylinder which extends along the Z-axis and it is installed in the frame 422.

As a variant, the guide shaft is formed as one piece with the frame 422.

The height H442 of the guide shaft 442 is greater than the distance, measured along the Z-axis, which separates the secondary walls 426 of the lateral structure 346. Thus, the guide shaft 442 extends out of the interior volume of the lateral structure 346, through two slots 444 made in the secondary walls 426.

Each mobile lateral contact 352 also comprises tension springs 446, preferably two springs 446. The tension springs 446 extend parallel to the Y-axis. Each tension spring 446 is attached by one of its ends to the guide shaft 442 and by the other of its ends to the lateral structure 346.

Each mobile lateral contact 352 is configured to ensure connection of the flexible connectors 438 to a protection unit 140 or an input-output module 206 for any position of the drawer 138 between its operating position and its test position and so that this connection is not interrupted when the drawer 138 is moved between its test position and its operating position.

For that, each mobile lateral contact 352 is mobile along the longitudinal axis A138 of the drawer 138, which is parallel to the Y-axis, and along the transverse axis B138 of the drawer, which is parallel to the X-axis.

FIGS. 21, 22 and 23 illustrate three different positions of a lateral contact 352.

An engagement position of the drawer 138 is defined as a position located between the disconnected position and the test position of the drawer. In FIG. 21, the drawer 138 is shown between its engagement position and its test position. The test position of the drawer is shown in FIG. 22 and the operating position of the drawer is shown in FIG. 23.

In these figures, only the mobile lateral contact 352 and a portion of the drawer 138 are shown. In particular, the rails 224 and 250 into which the lateral structures of the drawer are inserted are hidden, for greater clarity. In practice, the movement of each mobile lateral contact is affected by the interaction of the mobile lateral contact with the rail 224 or 250 into which the lateral structure 346 bearing this mobile lateral contact is inserted.

When the drawer 138 is inserted into the motor start-up module 200 between its disconnected position and its engagement position, the mobile lateral contact 352 does not move in relation to the drawer 138.

In this position, the frame 422 and the guide shaft 442 are held by the tension springs 446 as close as possible to the back portion 348 of the drawer, in a rest position. In practice, the frame 422 and the guide shaft 442 are as close as possible to the back portion of the drawer 348 when the guide shaft 442 is in contact with an end of the slot 444. This position is not shown in the figures.

In addition, in this position, the contact housing 430 and the contacts 426 are in an inserted position in the drawer 138, i.e. the contact housing 430 is away from the frame 422 and is closer to the vertical wall 344. In other words, in the inserted position, the contact housing 430 and the contacts 426 are contained as far as possible in the interior volume of the lateral structure 346 and extend as little as possible out of this interior volume through the window 400.

In practice, the inserted position of the contact housing 430 and of the contacts 426 is imposed by the springs 435 which exert on the contact housing 430 a force separating it from the frame 422.

During the insertion of the drawer 138 into the motor start-up module 200, when the drawer 138 reaches engagement position, the guide shaft 442 comes into contact with the tongues 232 or 254 of the rails 224 or 250.

Specifically, the height H442 of the guide shaft 442 is greater than the distance, measured along the Z-axis, between the edges of the rails 224 and 250 but is shorter than the distance between the tongues of the rails.

From this engagement position, the translation of the frame 422, of the contact housing 430 and of the electrical contacts 436 along the Y-axis is stopped. These elements then start to move in relation to the drawer 138. Thus, between the engagement position of the drawer and the operating position of the drawer, via the test position of the drawer, the frame 422 is translated with respect to the interior volume of the lateral structure 346. In practice, the frame 422 becomes fixed in relation to the motor start-up module 200 while the drawer 138 is in motion. During this motion of the drawer, the tension springs 446 are stretched.

The movement of the frame 422, of the housing of contact 430 and of the electrical contacts 436 between the engagement position of the drawer and the test position of the drawer takes place in two phases.

During a first phase, the frame 422, the contact housing 430 and the electrical contacts 436 move in relation to the drawer 138 along the Y-axis and the axis B138, away from the rest position of the frame 422, while remaining fixed in relation to the motor start-up module 200. This movement takes place until the fixture 432 of the contact housing 430, which is fixed along the Y-axis, comes into contact with the end edge 414 of the wing 408 of the plate 404, which is mobile along the Y-axis. This position is shown in FIG. 21.

During a second phase, after the fixture 432 has come into contact with the end edge 414, the movement in relation to the drawer 138 of the frame 422 and of the elements that it bears along the Y-axis continues and the contact housing 430 is additionally translated along the X-axis and the axis A138, away from the interior volume of the lateral structure 346.

The translation of the contact housing 430 along the X-axis therefore takes place by virtue of the chamfer 416 of the wing, which, during its translation along the Y-axis, pushes the contact housing and the contacts 436 from their inserted position towards an exserted position from the drawer 138, visible in FIG. 22. This motion leads to compression of the springs 435 between the contact housing and the frame 422.

Additionally, this translation of the contact housing 430 and of the electrical contacts 436 along the X-axis is allowed since, from the engagement position to the operating position of the drawer 138, the contact housing 430 of the mobile lateral contact 352 is located facing the windows 226 or 252 in the rail into which the lateral structure is engaged.

In practice, each contact holder 434 of the contact housing 430 is located facing one of the two windows 226 or 252 in the rail.

By virtue of this translation, the electrical contacts 436 extend out of the lateral structure 346 and may come into contact with the protection unit 140 or an input-output module 206.

Between the test position of the drawer and the operating position of the drawer, the contact housing 430 is fixed along the X-axis in relation to the motor start-up module 200 and the fixture 432 of the contact housing slides on the end edge 414 of the wing 408 of the plate 404.

In other words, the fixture 432 imposes the motion of the contact housing 430 in relation to the drawer 138, towards its exserted position.

Additionally, the springs 420 which hold the plate 404 against the vertical wall 344, i.e. in a reference position, are configured so that, in the event that the exsertion of the contact housing 430 along the X-axis is blocked, for example by an obstacle present in the window in the rail, the force exerted by the springs 420 is weaker than the force exerted by the fixture 432 on the wing 408 of the plate 404, which then results in the plate 404 moving along the X-axis, towards the holding brackets 418, i.e. towards a safety position.

By virtue of this movement of the plate 404, in such a scenario, the mobile lateral contact 352 is not damaged.

This movement of the plate 404 also makes it possible to accommodate variations in the relative positioning of the parts. For example, if the communication interfaces 353 are closer to the drawers 138, the movement along the X-axis of the plate will make it possible to avoid exerting excessive stresses on the electrical contacts 436.

In summary, in relation to the motor start-up module 200, the movement of the electrical contacts 436 comprises three phases:
from the disconnected position to the engagement position of the drawer, the electrical contacts 436 are in translation along the Y-axis in a rail 224 or 250 in relation to the motor start-up module and are fixed in relation to the drawer 138;

from the engagement position of the drawer to the test position of the drawer, the electrical contacts 436 are in translation along the X-axis away from the lateral structure 346, through the windows 226 or 252 in the rail and are fixed along the Y-axis in relation to the motor start-up module 200; and from the test position of the drawer to the operating position of the drawer, the electrical contacts 436 are fixed in relation to the motor start-up module.

By virtue of this three-phase movement of the electrical contacts 436, and more particularly by virtue of the fact that the electrical contacts 436 are fixed in relation to the motor start-up module 200 between the test position and the operating position of the drawer, contact between the electrical contacts 436 and the protection unit 140 or the input-output module 206 is maintained without interruption, which makes it possible to maintain a connection between the control circuit board 364 and the protection unit 140 or between the control circuit board 364 and an input-output module 206 between these two positions.

When the electrical contacts 436 extend through the windows 226 in a rail 224, they also extend through the windows 222 in the lateral support 210 to which the rail 224 is attached.

The cables 440 are flexible, such that their end connected to the electrical contacts 436 is mobile with the electrical contacts 436. In addition, the dimensions of the window 402 of the vertical wall 344 and of the opening 410 of the plate 404 make it possible not to interfere with the movement of the cables 440.

When the drawer 138 is taken out of the volume V1 of the start-up module 200, i.e. when it goes from its operating position to its disconnected position, the movement of the electrical contacts 436 of the mobile lateral contact 352 comprises three phases:
from the operating position to the test position of the drawer, the electrical contacts 436 are fixed in relation to the motor start-up module 200 and are in translation along the Y-axis in relation to the drawer 138;

from the test position to the engagement position of the drawer, the electrical contacts 436 are fixed along the Y-axis in relation to the motor start-up module and are in translation along the X-axis away from the frame 422 and towards the lateral structure 346, under the effect of the springs 435; and from the engagement position to the disconnected position of the drawer, the electrical contacts 436 are in translation along the Y-axis in relation to the motor start-up module and are fixed in relation to the drawer 138.

Figure 24:
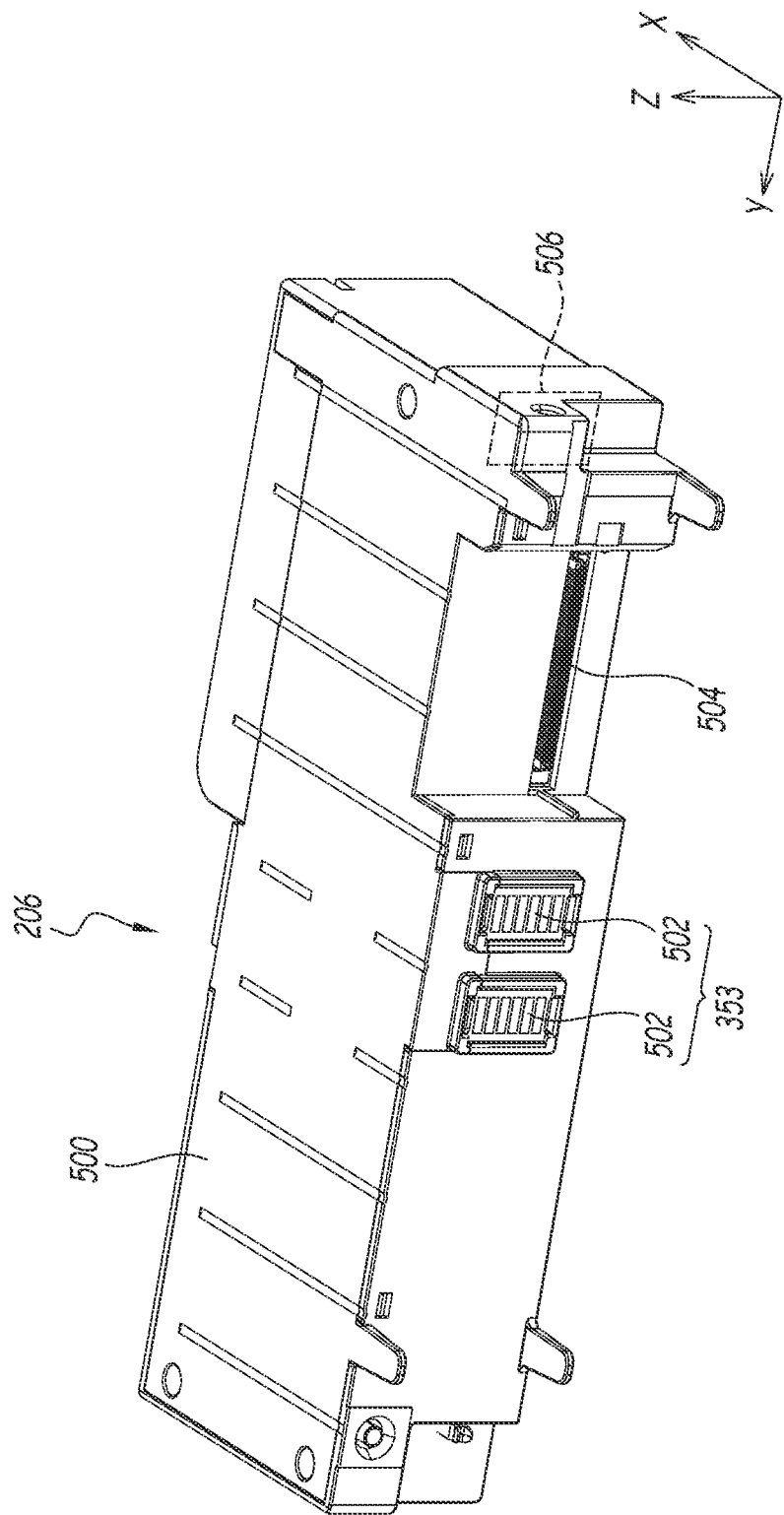
FIG. 24 is a perspective view of an input-output module belonging to an enclosure according to one of FIGS. 1 to 5.

As can be seen in FIG. 24, the input-output module 206 comprises a housing 500 on which are arranged two connection pads 502, which form the communication interface 353.

When the drawer 138 is in operating position or in test position, the flexible connectors 438 of the two electrical contacts 436 are in contact with the two connection pads 502. In practice, the connectors 438 are said to be "flexible" since they may deform elastically along the X-axis under a force, for example under the force generated by contact with the connection pads 502. This deformation makes it possible to maintain good electrical contact between the flexible connectors and the connection pads 502 since it makes it possible to tolerate errors in relative alignment and in relative position of the connectors and of the pads.

As can be seen in FIG. 8, the housing 500 of the input-output module 206 is attached to the lateral support 212 of the motor start-up module 200. Each input-output module 206 is associated with a drawer 138 and is located, on the lateral support 212, at the height of the base 328 of this drawer.

The input-output module 206 also comprises a linear connector 504 which makes it possible to connect the input-output module 206 to the segment of computer bus 204 of the motor start-up module 200. Thus, the input-output module 206 is connected to the electronic circuits 144, to the electrical power supply tracks 148 conducting the first auxiliary voltage and to the electrical power supply tracks 154 conducting the second auxiliary voltage.

The input-output module 206 comprises a first wireless communication board 506, arranged in the housing 500. This first wireless communication board is not visible from the exterior of the housing 500 and is shown with dashed lines in FIG. 24.

The first wireless communication board 506 communicates with a second wireless communication board 508, which is in practice arranged in the drawer 138 associated with the input-output module, as can be seen in FIG. 16 where the second board is also shown with dashed lines.

In practice, the first and second wireless communication boards are arranged facing one another, i.e. they are aligned along the same axis parallel to the transverse Y-axis of the electrical enclosure.

The first and second communication boards are configured to be able to exchange data by transmitting and receiving radiofrequencies, for example by using a wireless protocol, preferably at a frequency of 60 GHz. For example, the protocol used is the Ethernet protocol. This exchange of data therefore takes place remotely, without contact between the communication boards.

Additionally, the first and second communication boards 506 and 508 are configured to allow this exchange of data when the drawer 138 is in operating position, when the drawer is in test position, and when the drawer moves between these two positions.

In the example, the contact between a mobile lateral contact 352 of a drawer and the two connection pads 502 of an input-output module makes it possible to deliver the first auxiliary voltage from the electrical power supply tracks 148 to the drawer and the data exchanged between the first and second communication boards 506 and 508 correspond to the data which travel through the electronic circuits 144.

This solution is advantageous since it makes it possible to separate, into two different connections, the data exchanged on the one hand and the transmission of a voltage on the other hand.

Additionally, because one of the two mobile lateral contacts 352 of a drawer 138 is connected to the input-output module from the test position of the drawer to the operating position of the drawer, the first auxiliary voltage is delivered to the drawer from its test position. Thus, the control circuit board 364 and the functional elements 362 are supplied with first auxiliary voltage in the test position of the drawer.

This power supply in test position is advantageous, since it makes it possible, for example, to verify the correct operation of the drawer 138 before allowing the movement of the drawer 138 into operating position.

As a variant, a first connection pad 502 of the two pads makes it possible to deliver the first auxiliary voltage to the drawer 138 and a second connection pad makes it possible to exchange data between the drawer and the input-output module 206, in complement to or in redundancy with the exchange of data carried out by the communication boards, such as for example emergency stop signals.

As a variant, the drawer 138 and the input-output module 206 do not comprise communication boards and the data which travel through the electronic circuits 144 are exchanged between the drawer 138 and the input-output module via the connection pads 502 and a mobile lateral contact 352.

As can be seen in FIG. 8, each input-output module 206 also comprises connection terminal blocks 510.

Among the connection terminal blocks 510 of an input-output module, some are connected on the one hand to the electrical power supply tracks 154 and on the other hand to the electrical load 104 connected to the drawer 138 associated with said input-output module, which makes it possible to supply this electrical load with second auxiliary voltage. In practice, power supply cables (not shown) connect the connection terminal blocks 510 to the electrical load 104.

As a variant, these power supply cables are connected to mobile connectors and the mobile connectors are configured to be connected to the connection terminal blocks 510.

Supplying an electrical load 104 with second auxiliary voltage makes it possible to supply power to ancillary functions of the electrical load 104. When the electrical load 104 is an electric motor, these ancillary functions are, for example, heating circuits, which make it possible to keep the electric motor above a minimum temperature when the motor is not in operation. These heating circuits are advantageous since they make it possible to prevent condensation effects which could damage this motor.

Among the connection terminal blocks 510 of an input-output module, others are connected on the one hand to the electronic circuits 144 and on the other hand to sensors (not shown) arranged at the level of the electrical load 104, such as for example position, speed or temperature sensors when the load 104 is a motor, or an emergency stop button. The data from these sensors are transmitted on the one hand to the drawer 138 and on the other hand to the segment of computer bus.

Thus, each input-output module 206 makes it possible to connect the segment of computer bus 204 to a monitoring-and-control drawer 138 and to the electrical load 104 connected to this monitoring-and-control drawer and allows the exchange of data between the monitoring-and-control drawer 138 and the electrical load 104.

This input-output module 206 is advantageous, since it makes it possible to centralize a plurality of connections in a single housing and it makes it possible to connect the drawer 138 to the segment of computer bus 204 without requiring the implementation of electrical cables.

As can be seen in FIG. 25, the segment of computer bus 204 comprises a housing 600 in which a circuit board 602 is arranged.

Like the computer bus 142, the segment of computer bus 204 extends lengthwise along the Z-axis.

The circuit board 602 bears electronic circuits 604, first electrical power supply tracks 606 and second electrical power supply tracks 608.

The segment of computer bus 204 also comprises linear connectors 610, in practice six linear connectors.

Each linear connector 610 is connected to the electronic circuits 604 and to the electrical power supply tracks 606 and 608.

In practice, the segment of computer bus 204 is configured to be able to be connected to one or more input-output modules 206, up to six input-output modules. Each input-output module is connected to the segment of computer bus by a linear connector 610. Specifically, the linear connectors 610 are configured to be connected to the linear connectors 504 of the input-output modules, thus ensuring a connection between the segment of computer bus 204 and the input-output modules 206.

In FIG. 8, two input-output modules 206 are connected to the segment of computer bus.

The segment of computer bus 204 also comprises male connectors 612 at a first end along the Z-axis, in the example at a top end. In practice, the male connectors 612 comprise a first connector 614 connected to the first electrical power supply tracks 606, a second connector 616 connected to the second electrical power supply tracks 608 and a third connector 618 connected to the electronic circuits 604.

This first end also comprises pins 620, in practice two pins 620, which extend from the housing 600 along the Z-axis, away from the housing.

The segment of computer bus 204 also comprises female connectors 622 at a second end along the Z-axis, in the example at a bottom end. In practice, the female connectors 622 comprise a first connector 624 connected to the first electrical power supply tracks 606, a second connector 626 connected to the second electrical power supply tracks 608 and a third connector 628 connected to the electronic circuits 604.

The male connectors 612 and the female connectors 622 have complementary shapes, i.e. the male connectors may slot into the female connectors.

This second end also comprises cavities 630. The pins 620 and the cavities 630 have complementary shapes, i.e. the pins may slot into the cavities.

Figure 26:
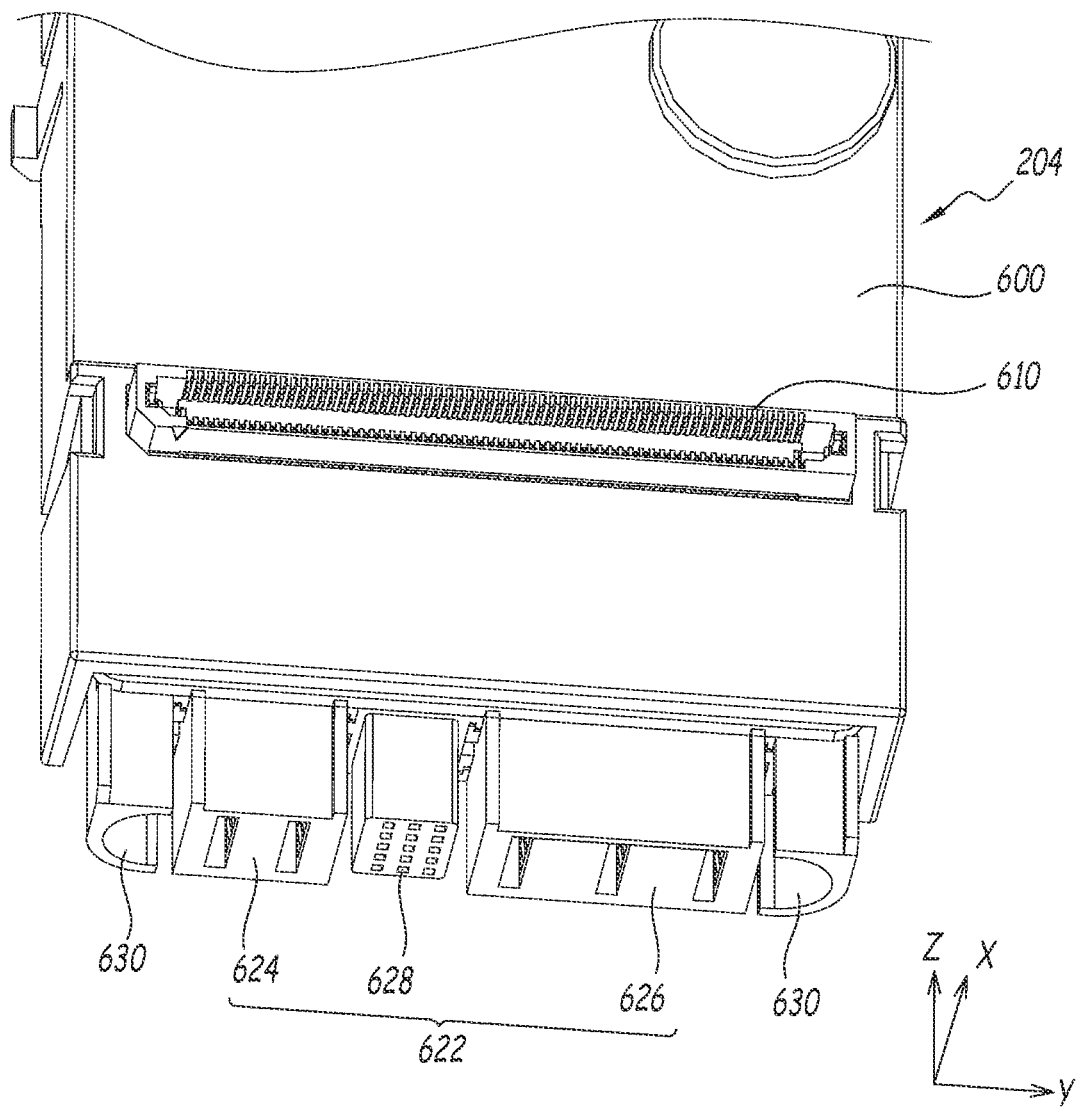
FIG. 26 is a view of the detail XXV of FIG. 25.

The female connectors 622 and the cavities 630 are visible in detail in FIG. 26.

By virtue of the pins 620 and of the cavities 630, a plurality of segments of computer bus 204 may be joined together. By virtue of the male connectors 612 and of the female connectors 622, a plurality of segments of computer bus 204 may be connected in electrical continuity.

When two segments of computer bus 204 are joined, they are juxtaposed along the Z-axis, the male connectors of a first segment are slotted into the female connectors of a second segment and the pins 620 of the first segment are slotted into the cavities 630 of the second segment.

In practice, each motor start-up module 200 comprises a segment of computer bus 204. Thus, when a motor start-up column 110 comprises a plurality of motor start-up modules 200, which are superposed, the segments of computer bus 204 of all of the motor start-up modules 200 are joined and electrically connected to one another.

Figure 27:
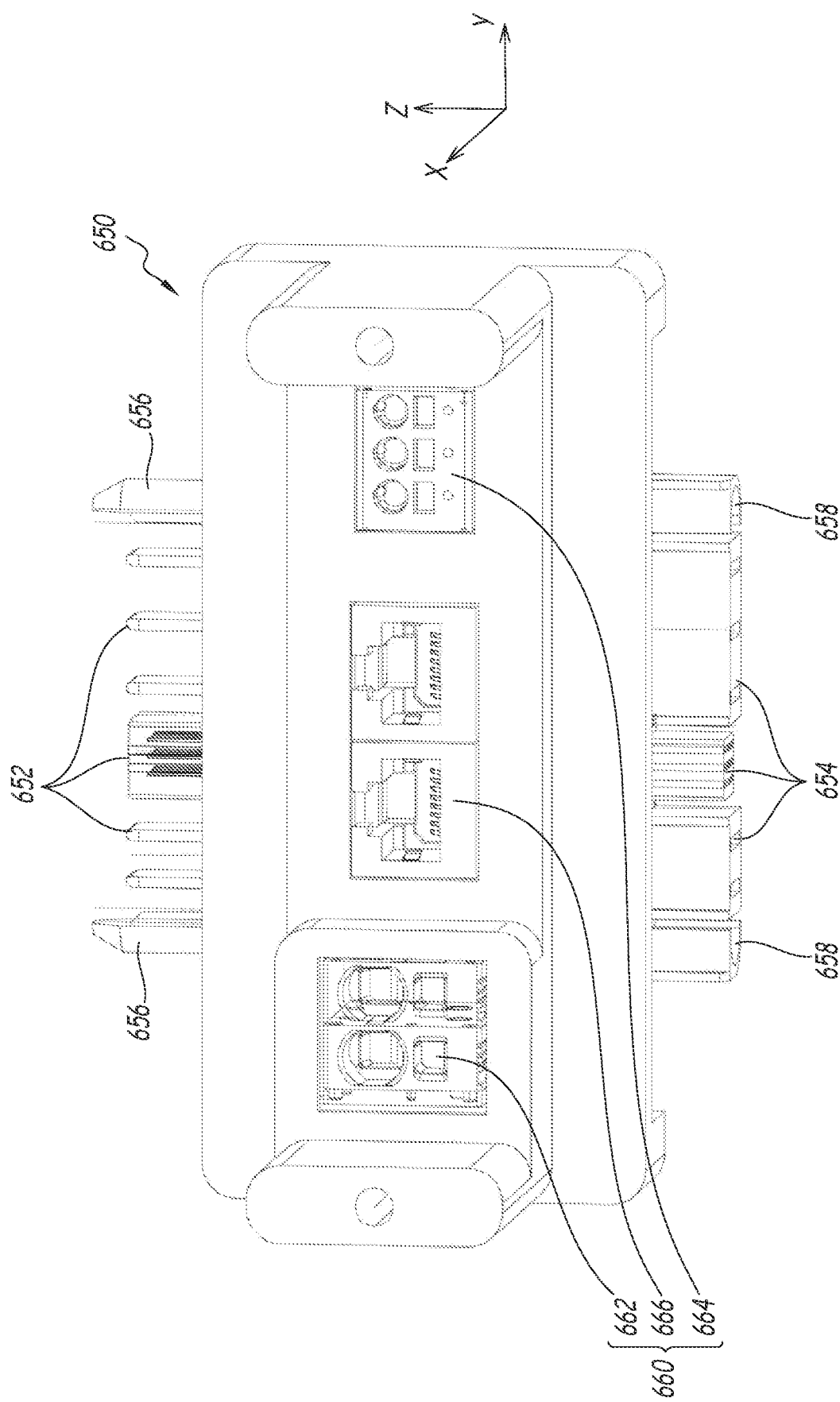
FIG. 27 is a perspective view of a computer bus connector.

A computer bus connector 650 is shown in FIG. 27. This connector is also visible in FIG. 6, joined to a communication module 134.

The computer bus connector 650 makes it possible to connect a segment of computer bus 204 of a connection column 110 to the communication module 134 of this connection column. Thus, each connection column 110 comprises a computer bus connector 650 attached to the communication module 134 of the column.

For that, the computer bus connector 650 comprises male connectors 652 and female connectors 654, which are identical to the male connectors 612 and to the female connectors 622, respectively, of the segment of computer bus 204.

The computer bus connector 650 also comprises pins 656 and cavities 658, which are identical to the pins 620 and to the cavities 630, respectively, of the segment of computer bus 204.

Thus, the computer bus connector 650 may be joined to, and electrically connected to, a segment of computer bus, in the same way that two segments of computer bus may be joined to one another, i.e. by slotting into one another.

In addition, the fact that the computer bus connector 650 comprises male connectors and female connectors is advantageous, since it may be joined either at the top of a segment of computer bus, for example when the communication module 134 is arranged above the one or more motor start-up modules 200, or at the bottom of a segment of computer bus, when the communication module 134 is arranged below the one or more motor start-up modules 200.

In practice, just the male connectors or the female connectors are used when the computer bus connector 650 is installed in a column 110. It is then advantageous to protect the unused connectors with a cap (not shown).

In a motor start-up column 110, the computer bus 142 is formed of the assembly of a computer bus connector 650 and of one or more segments of computer bus 204.

In a motor start-up column 110, the electronic circuits 604 correspond to the electronic circuits 144 of the computer bus 142, the first electrical power supply tracks 606 of the one or more segments of computer bus correspond to the power supply tracks 148 of the computer bus 142 and the second electrical power supply tracks 608 correspond to the power supply tracks 154 of the computer bus 142.

The connection of the computer bus 142 to the communication module takes place via a plurality of front connectors 660. In practice, these connectors comprise:

A first connector 662, which is connected on the one hand to the first connector 192 of the communication module by cables (not shown) and on the other hand to the power supply tracks 148 of the computer bus 142. By virtue of the first connector 662, the power supply tracks 148 of the computer bus 142 are supplied with first auxiliary voltage.

A second connector 664, which is connected on the one hand to the protection housing 194 of the communication module 134 by cables (not shown) and on the other hand to the power supply tracks 154 of the computer bus 142. By virtue of the second connector 664, the power supply tracks 154 of the computer bus 142 are supplied with second auxiliary voltage.

A third connector 666, which is connected on the one hand to the managed switch 135 of the communication module 134 by cables (not shown) and on the other hand to the electronic circuits 144 of the computer bus 142. By virtue of the third connector 666, the electronic circuits 144 of the computer bus 142 are connected to the managed switch 135 and may therefore exchange information with the communication module 134.

Figure 34:
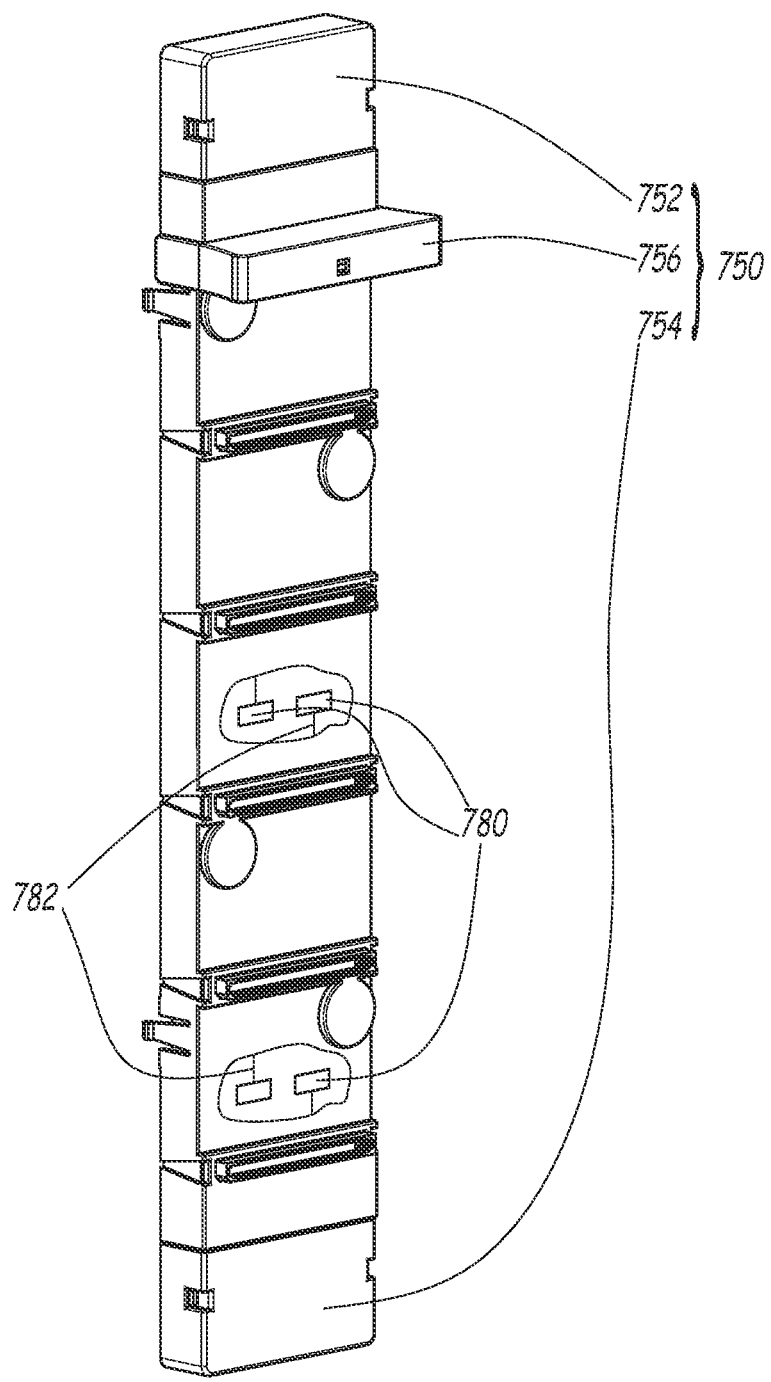
FIG. 34 is a perspective view of the segment of computer bus of FIGS. 25 and 26 equipped with three jumpers.

As can be seen in FIG. 34, the segment of computer bus 204 may be equipped with jumpers 750.

Figure 35:
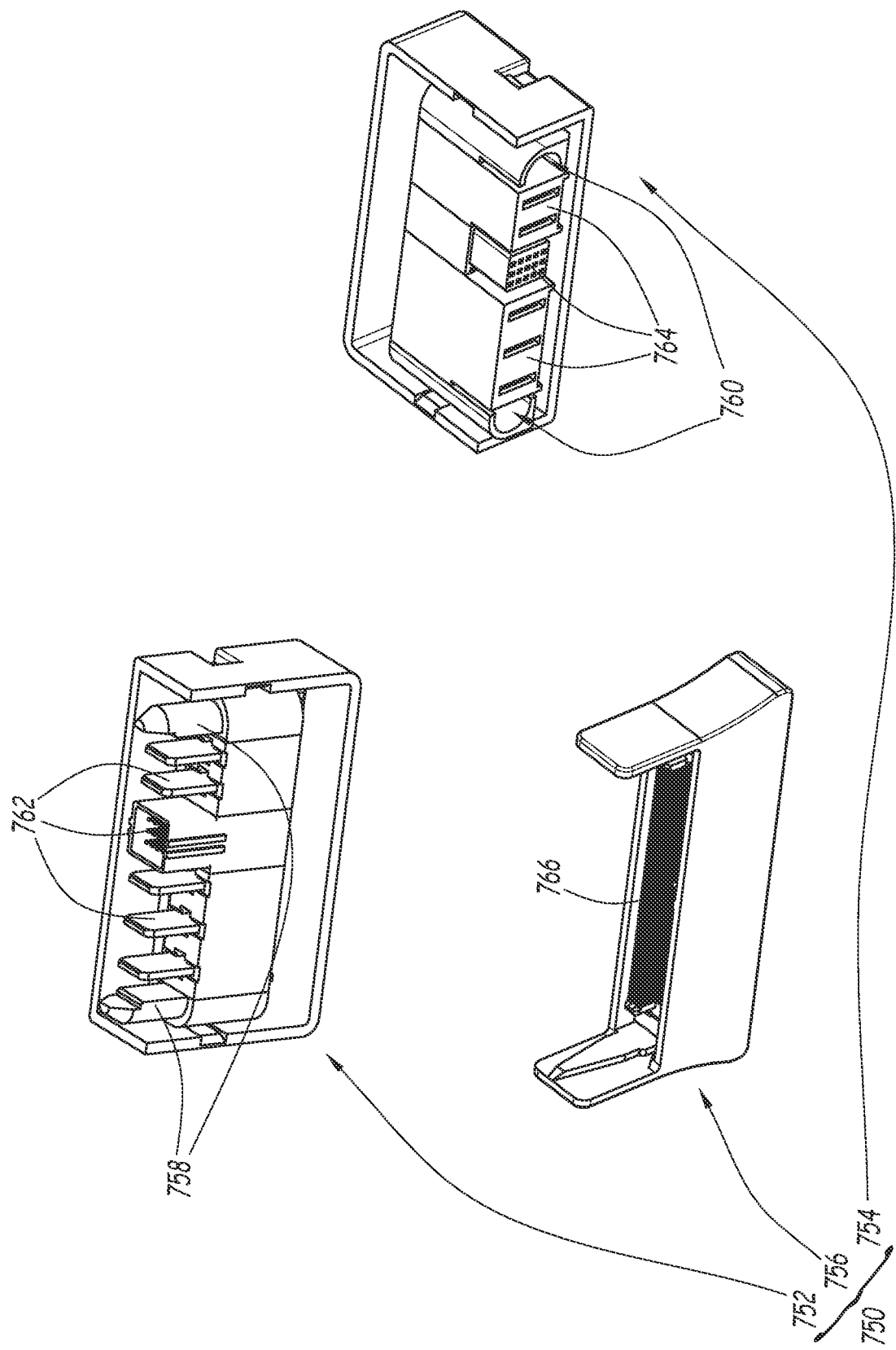
FIG. 35 is a perspective view of the jumpers of FIG. 34.

A distinction is made between three types of jumpers 750 in FIGS. 34 and 35:
a male end jumper 752;
a female end jumper 754; and
an input-output jumper 756.

The male 752 and female 754 end jumpers make it possible to avoid that in a motor start-up column 110, the end of the computer bus 142—which comprises a plurality of segments of computer bus 204 joined to one another—opposite the end connected to the computer bus connector 650 is free.

Thus, a first end of the computer bus 142 is connected to the computer bus connector 650 and a second end of the computer bus is connected to a male 752 or female 754 end jumper.

This connection makes it possible to protect the connectors 622 or 612 of the segment of computer bus 204 opposite the computer bus connector.

In practice, the male end jumper 752 makes it possible to protect the female connectors 622 and the female end jumper 754 makes it possible to protect the male connectors 612.

To allow the joining of the end jumpers to the segment of computer bus 204, the male end jumper 752 comprises two pins 758, of complementary shape to the cavities 630 of the first end of the segment of computer bus, and the female end jumper 754 comprises two cavities 760, of complementary shape to the pins 620 of the second end of the segment of computer bus.

Additionally, the end jumpers 752 and 754 make it possible to ensure the continuity of the electronic circuits 604 of the segment of computer bus 204, corresponding, in a motor start-up column 110, to the electronic circuits 144 of the computer bus 142.

Specifically, the electronic circuits 144, in particular when they allow an exchange of data using the Ethernet protocol, connect the communication module 134 of a motor start-up column 110 to the monitoring-and-control drawers 138 in series. Thus, the electronic circuits 144 form a loop, the point of origin of which is the communication module 134.

When a segment of computer bus 204 comprises a free end, the end jumper 752 or 754 installed on this free end makes it possible to close this loop, by virtue of connectors connected to the electronic circuits 604, by being connected to the free end of the segment of computer bus.

In practice, the male end jumper 752 comprises male connectors 762 and the female end jumper 754 comprises female connectors 764, which are identical to the male connectors 612 and to the female connectors 622, respectively, of the segment of computer bus 204.

As a variant (not shown) of the invention, the motor start-up column 110 does not comprise a communication module 134 and the electronic circuits 144 form a loop, the point of origin of which is the industrial computer 130, which then has a functional role identical to that of the communication module 134.

Advantageously, these male 762 and female 764 connectors also make it possible to connect the end jumpers 752 and 754 to the electrical power supply tracks 606 and 608.

Thus, the electrical power supply tracks 606 and 608 may supply power to the linear connectors 610 either in parallel, or in series. Specifically, in the case of a power supply in series, the male 762 and female 764 end jumpers make it possible to close the loops of the electrical power supply tracks 606 and 608.

By the same principle, the input-output jumpers 756 make it possible to close the loop formed by the electronic circuits 144 at the level of a given linear connector 610, when no input-output module 206 is connected to this linear connector 610.

For that, each input-output jumper 756 has a supplementary connector 766, configured to be connected to a linear connector 610.

In practice, in a motor start-up module 200, the number of input-output jumpers 756 is dependent on the number of input-output modules 206. This number is equal to the total number of linear connectors 610 minus the number of input-output modules 206 of the motor start-up module 200.

Thus, in the example shown in FIG. 8, in which two input-output modules 206 are connected to the segment of computer bus 204, which comprises six linear connectors 610, four input-output jumpers 756 are connected to the segment of computer bus, but are not shown to simplify the figure.

Because an input-output module 206 is always associated with a monitoring-and-control drawer, it may also be considered that the input-output jumpers 756 make it possible to close the loop formed by the electronic circuits 144 at the level of a linear connector 610, when no monitoring-and-control drawer is connected to this linear connector.

As can be seen in FIG. 34, the segment of computer bus 204 also comprises memory blocks 780, which are in practice electronic chips, also called integrated circuits.

Advantageously, the segment of computer bus 204 comprises the same number of memory blocks 780 and linear connectors 610.

In the example, the segment of computer bus 204 therefore comprises six memory blocks 780. In FIG. 34, just four memory blocks 780 are shown, through two cutaways in the housing 600 of the segment of computer bus, to simplify the figure.

Each memory block 780 is thus associated with one linear connector 610.

Thus, when the motor start-up module 200 is assembled, each memory block 780 is associated with an input-output module 206, which corresponds to the input-output module connected to the linear connector 610, and to a monitoring-and-control drawer 138, which corresponds to the drawer connected to the input-output module connected to the linear connector 610.

During the operation of the electrical enclosure 100, each memory block 780 saves information and parameters regarding the monitoring-and-control drawer 138, regarding the electrical load 104 connected to the monitoring-and-control drawer 138 and/or regarding the input-output module 206 to which the drawer and the electrical load are connected.

For example, a memory block 780 saves, regarding the electrical load 104 connected to the monitoring-and-control drawer 138 associated with the memory block, all or some of the following information:

- the type of the electrical load 104, such as for example a single-phase electric motor, a three-phase electric motor, or a drivable electrical load;
- the operating conditions of the electrical load 104, such as for example the electrical power required for its operation; and
- the type of the monitoring-and-control drawer 138 that has to control the electrical load, i.e. the representative characteristics of the drawer, comprising for example the number and the arrangement of the contactors of the functional elements 362 or the type of the thermal protection relay.

In practice, a memory block 780 saves in particular, regarding the monitoring-and-control drawer 138 associated with the memory block, the type of the monitoring-and-control drawer, i.e. the representative characteristics of the drawer, and operating parameters of the functional elements 362. These operating parameters are, for example, a setting for the power to be delivered to the electrical load 104, a setting for the trip threshold for the thermal protection relay, or detection thresholds for operation sensors.

In practice, a memory block 780 saves, regarding the input-output module 206 associated with the memory block, information which is for example the type of the electrical load 104 connected to the input-output module and/or the type of the sensors arranged at the level of the electrical load and connected to the input-output module.

These operating parameters are generally saved at the level of the control circuit board 364 of the monitoring-and-control drawer 138.

Additionally, each memory block 780 communicates with the communication module 134 of the corresponding motor start-up column 110. Specifically, each memory block 780 is connected to the electronic circuits 604, by virtue of connection circuits 782 visible in FIG. 34, thus allowing this communication.

The memory blocks 780 are particularly advantageous during the use of the electrical enclosure 100, and particularly during the phases for maintaining the electrical enclosure 100.

Specifically, in the event of replacing an old monitoring-and-control drawer 138 of a motor start-up column 110 with a new monitoring-and-control drawer, a first verifying method is carried out by the communication module 134, or by the industrial computer 130 via the communication module 134, comprising at least the following steps:

a) detecting the type of the old monitoring-and-control drawer 138 initially installed in a given location, on the basis of the information saved in the memory block 780 associated with the drawer;

b) verifying whether the type of the new monitoring-and-control drawer 138 installed as a replacement corresponds to the type of the old drawer and/or is compatible with the type of the electrical load 104, on the basis of the information saved in the memory block 780 associated with the drawer;

c) determining whether the new drawer is suitable to replace the old drawer;

d) in the case that the new monitoring-and-control drawer 138 is determined in step c) as being suitable to replace the old drawer, adjusting the operating parameters of the functional elements 362 of the new drawer, saving them in the control circuit board 364 of the new drawer, on the basis of the information saved in the memory block 780, such that these operating parameters are identical to the operating parameters of the old drawer; and e) in the case that the new monitoring-and-control drawer 138 is determined in step c) as being unsuitable to replace the old drawer, preventing the starting up of the new monitoring-and-control drawer and signalling an anomaly.

This first verifying method is advantageous since it makes it possible to ensure that replacement of a monitoring-and-control drawer is correctly carried out and makes it possible to carry out such replacement without having to indicate operating parameters to the new monitoring-and-control drawer, these operating parameters being automatically loaded.

Advantageously, if, during step b), it is detected that the type of the new monitoring-and-control drawer 138 is not identical to the type of the old drawer, but that the new drawer is compatible with the type of the electrical load 104, then during step c), the new drawer is determined as being suitable to replace the old drawer and step d) is carried out, and a signal indicating the difference in type between the new drawer and the old drawer is transmitted, for example via a message displayed on the display 302. For example, the new monitoring-and-control drawer 138 may comprise functional elements 362 making it possible to control an electrical load of higher power than the old drawer, but also suitable for controlling the electrical load associated with the drawer. The new drawer is then compatible with the electrical load, and may therefore be used as a replacement for the old drawer, even though the new drawer is of a different type from the old drawer.

As a variant, the first verifying method is carried out by the input-output module 206 associated with the replaced monitoring-and-control drawer 138. The input-output module is then equipped with a computing unit configured to execute steps a) to e) and access the information saved in the memory block 780 associated with this drawer.

In the event of replacing an old input-output module 206 with a new input-output module, which involves wiring the connection terminal blocks 510 of this module again, a second verifying method is carried out by the communication module 134, or by the industrial computer 130 via the communication module 134, comprising at least the following steps:

a) detecting the type of the electrical load 104 associated with the new input-output module 206 and/or the type of the sensors arranged at the level of the electrical load connected to the input-output module, on the basis of the information saved in the memory block 780 associated with this new input-output module;

b) verifying whether the type of this electrical load and/or of these sensors connected to the new input-output module corresponds to the type of the electrical load and/or of the sensors initially connected to the old input-output module;

c) determining whether the electrical load 104 and/or the sensors connected to the new input-output module do indeed correspond to the electrical load 104 and/or to the sensors connected to the old input-output module;

d) if so, authorizing the starting up of the electrical load 104; and e) if not, preventing the starting up of the electrical load 104 and signalling an anomaly.

This second verifying method is advantageous since it makes it possible to ensure that replacement of an input-output module 206 is correctly carried out, and more particularly that the connections to the connection terminal blocks 510 are correctly carried out.

As a variant, the second verifying method is carried out by the new input-output module 206. The new input-output module is then equipped with a computing unit configured to execute steps a) to e) and access the information saved in the memory block 780 associated with this input-output module.

Additionally, in the event of replacing the communication module 134 of a motor start-up column 110, a method for retrieving data is carried out by the new communication module, which consists in retrieving the operating parameters of the monitoring-and-control drawers 138 and/or the information related to the electrical loads 104 on the basis of the information saved in the memory blocks 780 so that the new communication module 134 has this information.

This method for retrieving data is particularly advantageous, since it avoids having to manually provide a large amount of data to the new communication module 134, which would be tedious, these data being automatically retrieved here.

In the variant where the motor start-up column 110 does not comprise a communication module 134, this method for retrieving data applies similarly to the replacement of the industrial computer 130.

Additionally, the fact that the memory blocks 780 are arranged on the segments of computer bus 204 is particularly advantageous, since the segments of computer bus are reliable elements, relatively insusceptible to faults, which are therefore generally not replaced over the service life of the electrical enclosure 100. Thus, the information saved in these memory blocks 780 is not lost, even during complex maintenance operations in which, for example, simultaneous replacement of monitoring-and-control drawers 138, of the associated input-output modules 206 and of the communication module 134 takes place.

The connection of a drawer 138 to an electrical load 104, i.e. the supplying of power to this electrical load by this drawer 138, takes place via an external connection module 208. Thus, an external connection module 208 is associated with each drawer 138.

Three types of external connection modules 208 are shown in FIGS. 28 to 33. These three types of modules together form a set of external connection modules 700 which is shown partially in each of these figures.

Each connection module of the set of modules 700 is configured to allow the connection of a drawer 138 to an electrical load 104 consuming an electrical power within a given data range.

Figure 28:
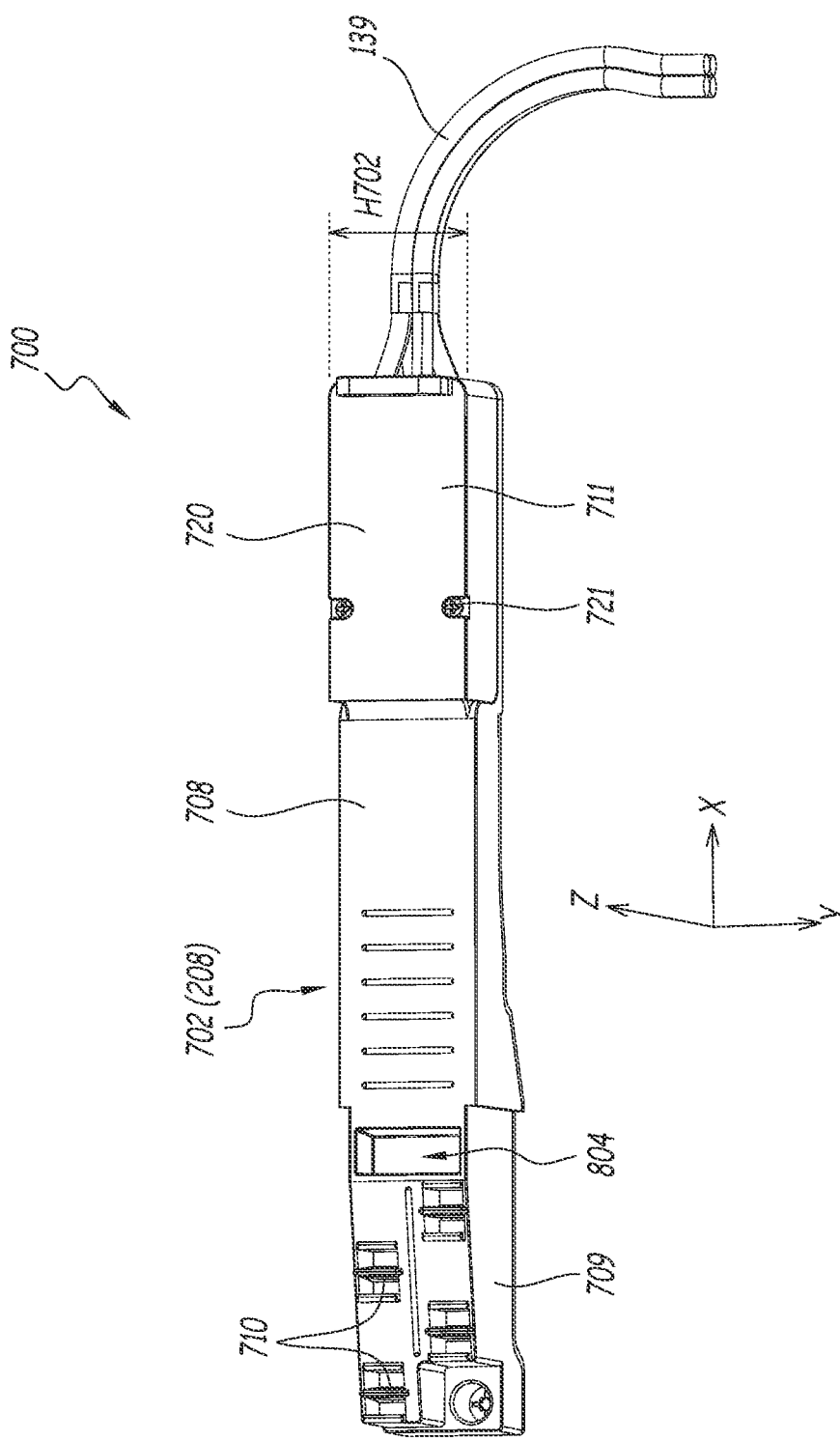
FIG. 28 is a perspective view of a first external connection module belonging to an enclosure according to one of FIGS. 1 to 5.
Figure 29:
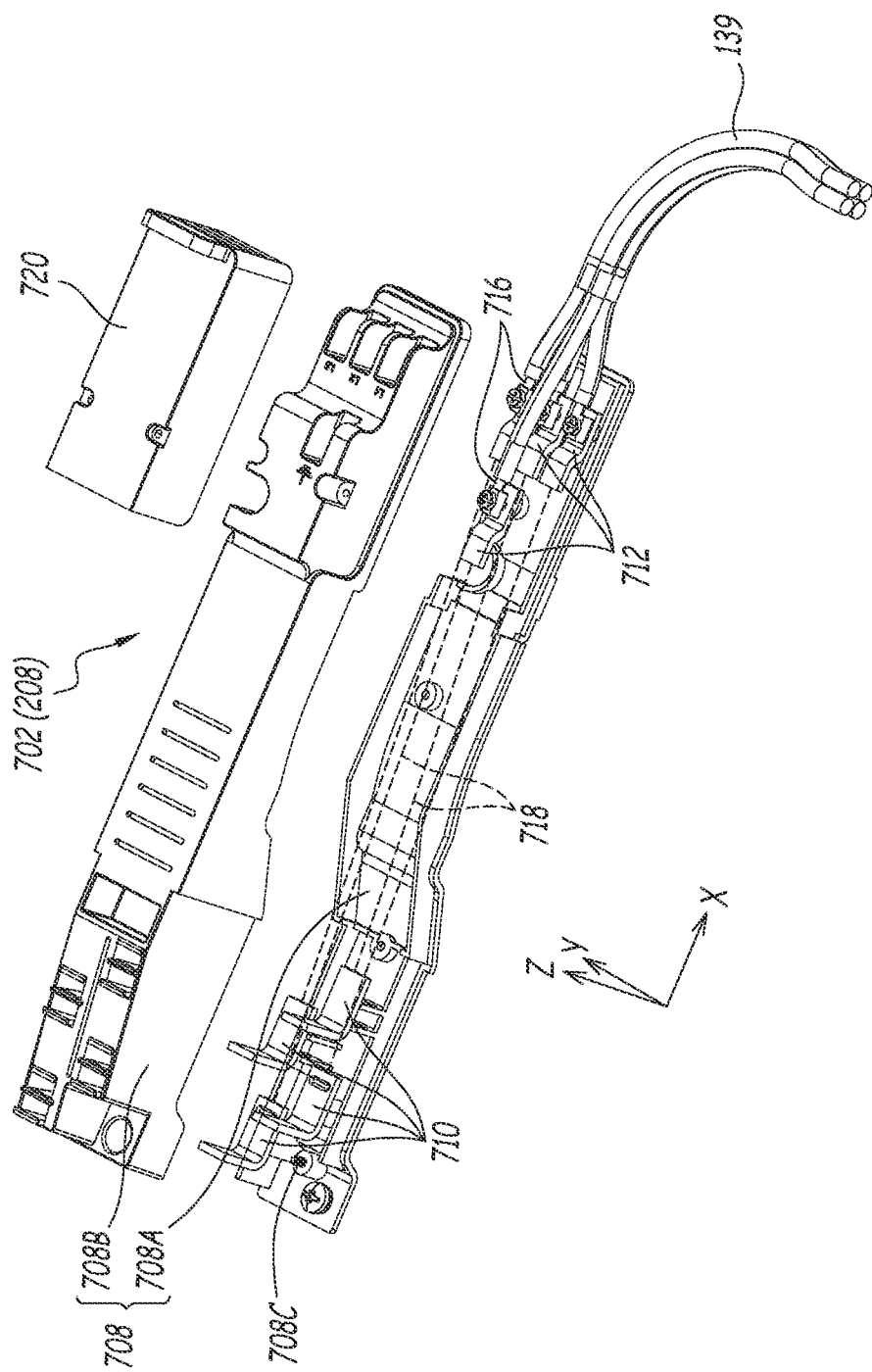
FIG. 29 is an exploded perspective view of the first external connection module of FIG. 28.

A first external connection module 702 is shown in FIGS. 28 and 29. This first connection module is configured to connect a drawer 138 to an electrical load 104 of low power, for example lower than 11 kW.

Figure 30:
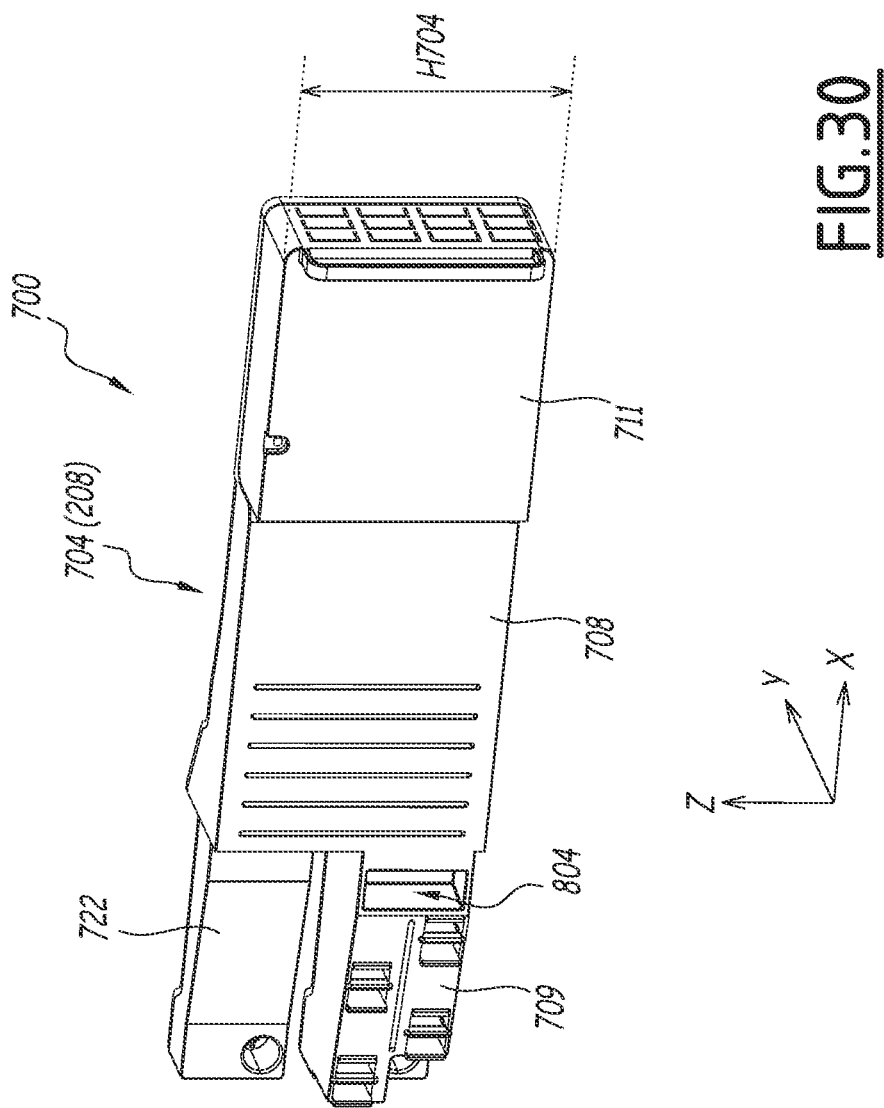
FIG. 30 is a perspective view of a second external connection module belonging to an enclosure according to one of FIGS. 1 to 5.
Figure 31:
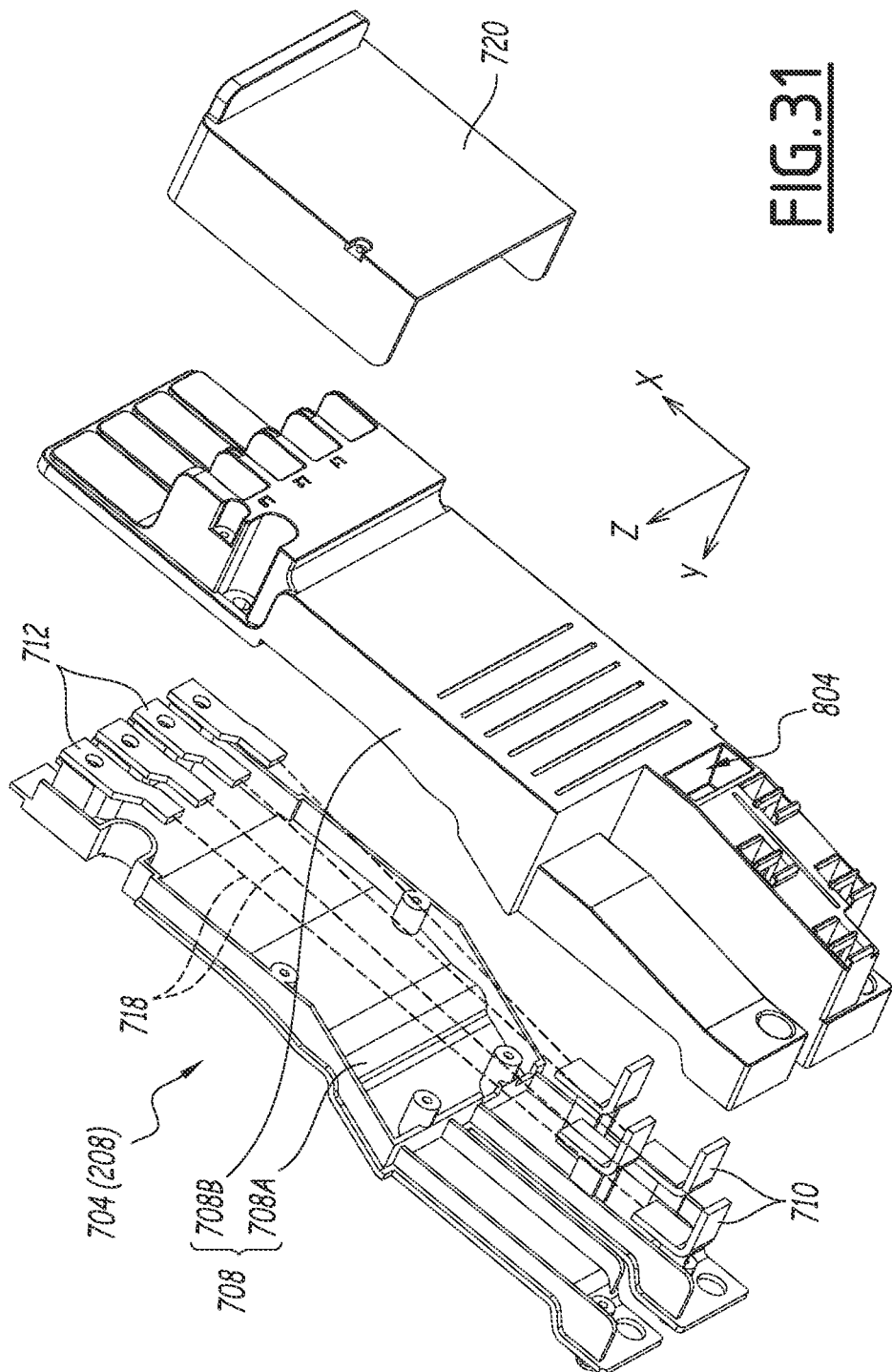
FIG. 31 is an exploded perspective view of the second external connection module of FIG. 30.

A second external connection module 704 is shown in FIGS. 30 and 31. This second connection module is configured to connect a drawer 138 to an electrical load 104 of medium power, for example of between 11 kW and 30 kW.

Figure 32:
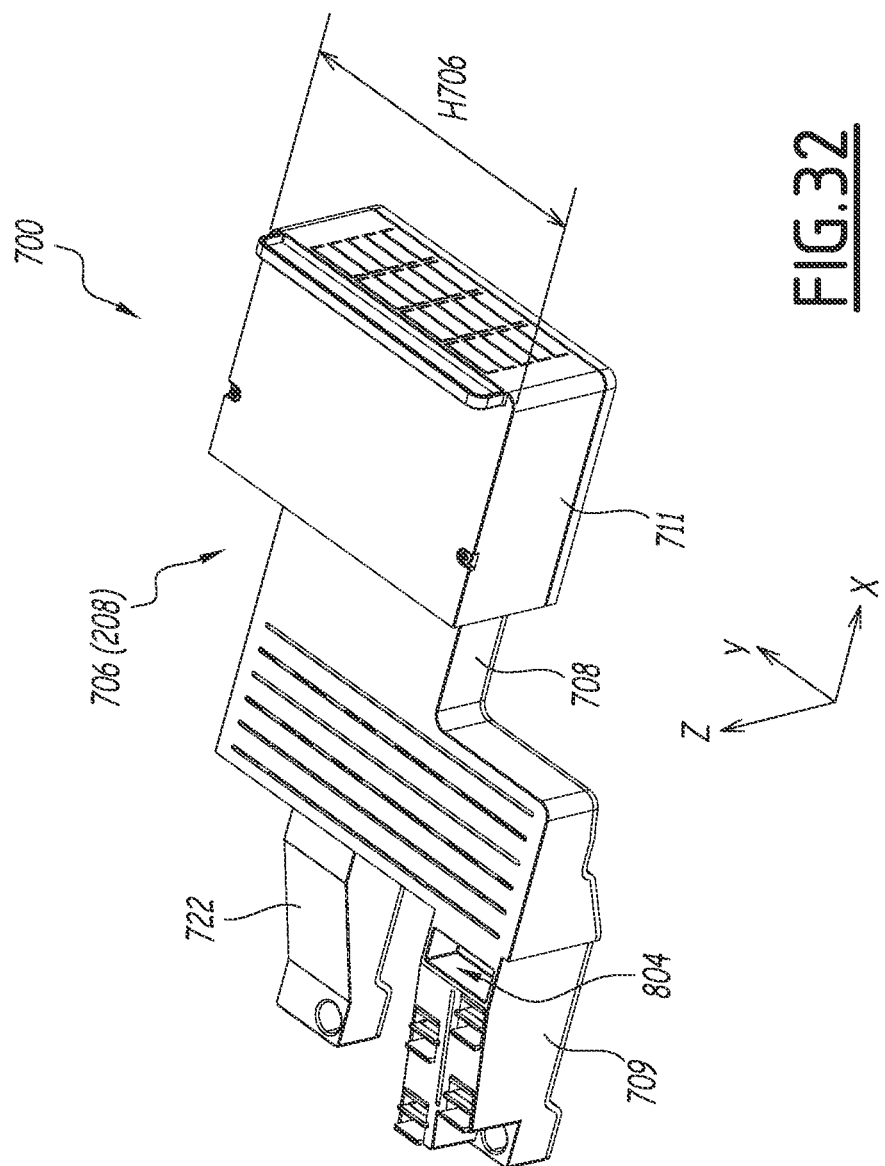
FIG. 32 is a perspective view of a third external connection module belonging to an enclosure according to one of FIGS. 1 to 5.
Figure 33:
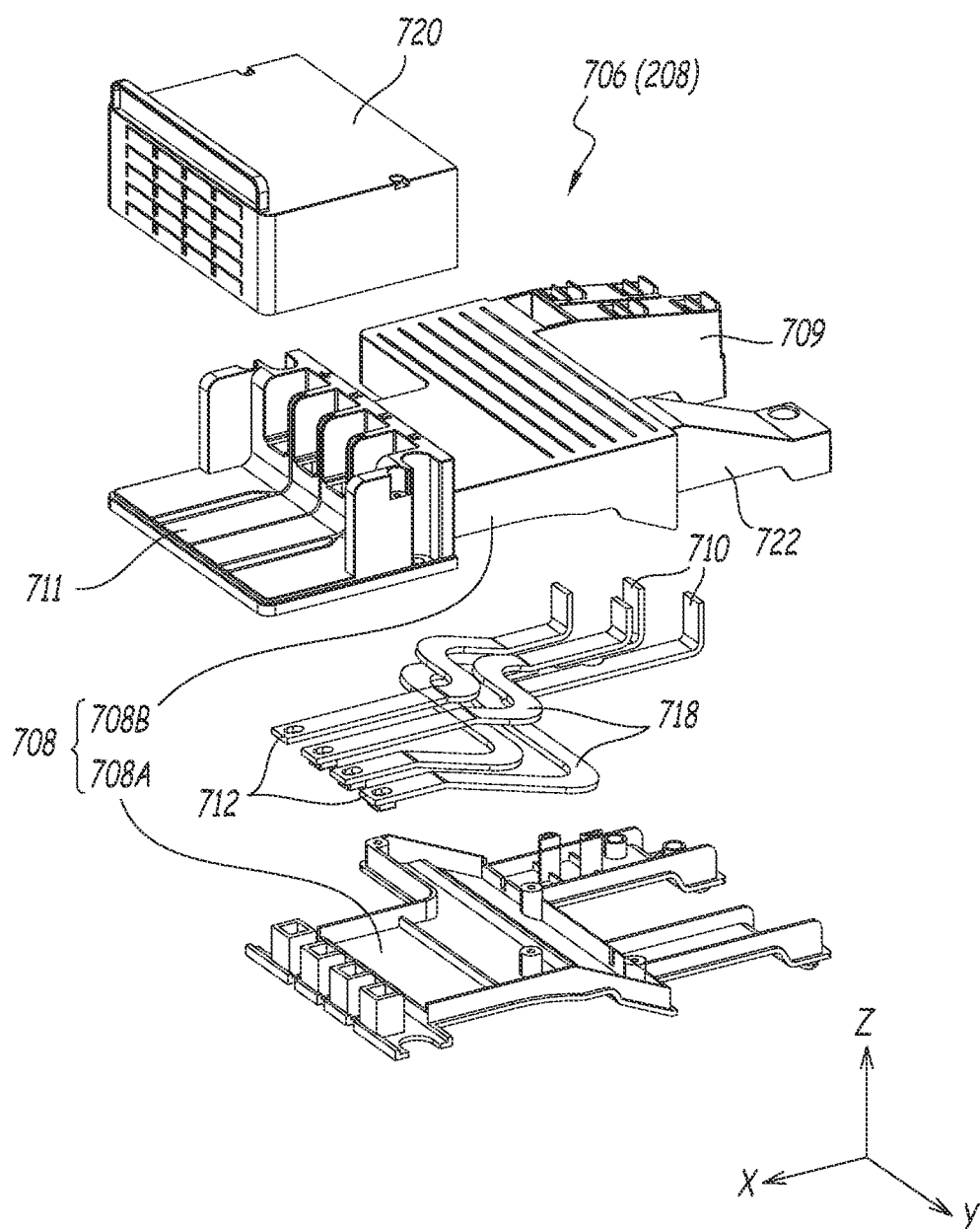
FIG. 33 is an exploded perspective view of the third external connection module of FIG. 32.

A third external connection module 706 is shown in FIGS. 32 and 33. This third connection module is configured to connect a drawer 138 to an electrical load 104 of high power, for example of between 30 kW and 75 kW.

Thus, the choice of an external connection module to be installed on a motor start-up module depends on the electrical power required by the electrical load 104 connected to this module.

The external connection modules 702, 704 and 706 each comprise a housing 708. The housing 708 comprises in practice two half-housings forming a base 708A and a hood 708B, respectively, joined by fastening means, such as screws 708C visible only for the external connection module 702 in FIG. 29.

The housing 708 of the external connection module 702 has a height H702 equal to 1U.

The housing 708 of the external connection module 704 has a height H704 equal to 2U.

The housing 708 of the external connection module 706 has a height H706 equal to 3U.

Preferably, the external connection module 702 is associated with a drawer 138 of height 1U or 2U, the external connection module 704 is associated with a drawer 138 of height 2U, 3U, 4U, 5U or 6U and the external connection module 706 is associated with a drawer 138 of height 5U or 6U. Thus, the height of an external connection module is always shorter than or equal to the height of the drawer with which it is associated.

A first end 709 of the housing 708 of each external connection module bears input connectors 710.

The height of the first end 709 is equal to 1U, regardless of the height of the housing 708.

A second end 711 of the housing 708 of each external connection module bears output connectors 712.

The height of the second end 711 is equal to the height H702, H704 or H706 of the housing 708.

In practice, the input 710 and output 712 connectors are arranged on the same face of the housing 708, i.e. when the housing is assembled on the motor start-up module 200, the input 710 and output 712 connectors face the same face of the enclosure 100, in the example the front face F1.

In the example, the first end 709 comprises four input connectors and the second end comprises four output connectors.

The input connectors 710 are configured to be connected to the downstream connectors 356 of the drawer 138 associated with the connection module. In other words, the downstream connectors 356 of a drawer supply electrical power to the external connection module 702, 704 or 706 associated with this drawer. Thus, the drawer 138 is a source of electricity for the connection module.

The constant height of the first end 709 is advantageous since it is equal to the height of the base 328 of the drawer 138. A first end 709 then allows the connection of all of the drawers 138, regardless of their height.

The output connectors 712 are configured to be connected to the electrical load 104 via the connection cables 139.

In practice, the electrical connection cables 139 are connected to the output connectors 712 by lugs 716, as can be seen in FIG. 29.

In the housing 708, the input connectors 710 and the output connectors 712 are electrically connected by cables or conductive busbars 718. In the first and second external connection modules 702 and 704, considering the power transmitted, it is possible to use conductive cables between the connectors 710 and 712, these cables being represented by their respective centre lines in FIGS. 29 and 31. In the third external connection module 706, considering the power transmitted, used is made, between the connectors 710 and 712, of the connection busbars visible in FIG. 33. In this latter case, the connectors 710 and 712 are formed by the ends of the busbars 718.

In practice, each external connection module comprises four conductive cables or conductive busbars 718, i.e. one busbar per input connector and per output connector.

The conductive cables or conductive busbars 718 are matched to the power consumed by the electrical load 104 connected to the output connectors 712.

Thus, for an electrical load of high power, for example between 30 kW and 75 kW, the conductive busbars 718 are for example copper busbars with a cross section of between 16 and 50 mm$^2$, for example equal to 50 mm$^2$ for an electrical load of 75 kW.

In the case of an electrical load of low power, for example lower than 11 kW, the conductive cables 718 are of smaller cross section, for example of between 1 and 6 mm$^2$, for example equal to 6 mm$^2$ for an electrical load of 11 kW.

As a variant, the conductive cables 718 of the first and second external connection modules 702 and 704 may be replaced with conductive busbars.

In practice, the higher the power delivered to an electrical load, the larger the cross section of the conductive cables and conductive busbars 718, which requires that the external connection module comprising such conductive cables or conductive busbars be higher. This is why the third external connection module 706 has a height H706 greater than the height H704 of the second module 704, itself greater than the height H702 of the module 702.

The second end 711 of each external connection module comprises, in addition, a covering part 720, which covers the output connectors 712. When the covering part 720 is installed, the connectors 712 are not accessible from the exterior of the housing 708 and are therefore protected, which prevents any contact with the lugs 716. When the covering part 720 is removed, the connectors 712 are accessible, which makes it possible to connect the cables 139 to the connectors.

Preferably, the covering part 720 is transparent, which makes it possible to check that the cables 139 are connected properly without making these cables accessible.

Preferably, the covering part 720 is joined to the housing 708 by fastening means, such as a screw 721 which is visible only for the external connection module 702.

As can be seen in FIG. 8, the housing 708 of each external connection module is attached to the back support 210 of the structure 202 of the motor start-up module 200, for example using screws, at the level of its first end 709, i.e. at the level of the end which comprises the input connectors 710.

The housing 708 therefore extends from the back support 210 as a cantilever, away from the motor start-up module 200.

Additionally, the housing 708 of each external connection module 704 and 706, i.e. of a module of height 2U and 3U, comprises a reinforcement 722, which extends from the housing 708 parallel to the first end 709 and which is also attached to the back support 210.

The reinforcement 722 has a height equal to 1U. It is formed as one piece with the hood 708B.

The first end 709, and potentially the reinforcement 722, are arranged in the volume V1 and in the functional region 156 of the connection column 110.

The rest of the housing 708 and the second end 711 extend into the cabling region 160 of the connection column 110.

In practice, the functional region 156 and the cabling region 160 are separated by the lateral support 212 of the motor start-up module. Thus, the first end 709 of an external connection module 702, 704 and 706 extends through the lateral support 212, and more particularly through an opening 220 made in the lateral support 212.

The reinforcement 722 of the housing 708 of an external connection module 704 and 706 also extends through an opening 220 in the lateral support 212.

As a variant, the external connection modules are configured so that the input 710 and output 712 connectors are arranged on two opposite faces. Such a configuration is advantageous when the connection of the cables 139 takes place via the back of the electrical enclosure 100, like in the variant of FIG. 5.

Additionally, each drawer 138 comprises two centring members 800, arranged on the back portion 348 of the drawer and which extend along the Y-axis out of the drawer. Each centring member 800 has a tapered shape, i.e. its free end is narrower than its base attached to the back portion of the drawer, with which it is preferably formed as one piece.

These centring members 800 make it possible to ensure correct positioning of the drawer 138 in the motor start-up module 200 when it is moved into its operating position.

For that, the protection unit 140 comprises centring cavities 802 and each external connection module 702, 704 and 706 comprises a centring cavity 804.

The centring cavities 802 of the protection unit 140 are arranged between the groups of connectors 246 and the interior face 238 of the protection unit 140, as can be seen in FIG. 11.

The centring cavities 804 of each external connection module 702, 704 and 706 are arranged on the hood 708B of each housing 708, close to the first end 709 and to the input connectors 710.

The centring cavities 802 of the protection unit and 804 of each external connection module are directed towards the volume V1 of the motor start-up module 200.

The centring cavities 802 and 804 have shapes that are complementary to those of the centring members 800 and are positioned so that in the operating position of the drawer, a first centring member 800 of a drawer 138 is accommodated in a centring cavity 802 and a second centring member of a drawer 138 is accommodated in a centring cavity 804.

When a drawer 138 is moved from its test position into its operating position, the centring members 800 of the drawer 138 are inserted gradually into the centring cavities 802 and 804 and, by virtue of the tapered shape of the centring members 800, this gradual insertion makes it possible to centre the drawer 138 in relation to the centring cavities 802 and 804 and therefore in relation to the motor start-up module 200.

By virtue of the external connection modules 208 of the set of modules 700, the connections from the electrical loads 104 to the drawers 138 are transferred from the functional region 156 to the cabling region 160. This is advantageous, since the cabling region 160 is easily accessible, which simplifies the connection of the electrical cables 139 to the output connectors 712.

As a variant, the number of types of external connection module 208 within the set of external connection modules may be different from three, in particular equal to 2, 4, 5 or 6.

In summary, the main electrical power supply delivered by the power supply cable 102 is conducted through the electrical enclosure 100 first by the power supply column 106, and is then redistributed to each protection unit 140 of each motor start-up column 110 by the sets of busbars 114, 118 and 122, and is then redistributed to each drawer 138 by the connectors 248 and 354, and is then redistributed to each external connection module 208 by the connectors 356, and is then redistributed to each electrical load 104 by each external connection module 208.

In summary, numerous exchanges of data are performed in the electrical enclosure 100:
  the operating data from sensors located on each electrical load 104 are transmitted by the input-output module 206 associated with this load to the drawer 138 on the one hand and to the communication module 134 on the other hand, via the computer bus 142;
  in the drawer 138, these data are, on the one hand, taken into account by the control circuit board 364 to adapt the operation of the drawer 138,
  in the drawer 138, these data are, on the other hand, if necessary, transmitted to the protection unit 140, for example when these data stem from the activation of an emergency stop button located close to the electrical load 104, with the objective of cutting the electrical power supply at the level of the protection unit 140, and
  in the communication module 134, these data are transmitted to the industrial computer 130,
  each drawer 138 transmits data on its own operation to the communication module of the connection column 110 comprising this drawer;
  the communication module 134 of each connection column 110 exchanges data on the operation of this connection column to the industrial computer 130 and to the communication modules of the other connection columns 110 of the enclosure 100, when the enclosure comprises a plurality of connection columns; and
  the industrial computer 130 transmits commands to the communication module 134 of each connection column 110, these data are then distributed by the managed switch 135 and transmitted to the drawers 138 by the computer bus 142 and the input-output module 206.

The installation of a motor start-up column 110, which includes a communication module 134 and at least one motor start-up module 200, comprises an assembly phase and a connection phase.

The assembly phase comprises steps consisting in:
a) joining the communication module 134 to the framework 164 of the motor start-up column;
b) assembling each motor start-up module 200, i.e. attaching the protection unit 140, the segment of computer bus 204, each input-output module 206 and each external connection module 208 to the structure 202 of the motor start-up module;
c) attaching each motor start-up module to the framework 164, by slotting the segments of computer bus 204 into one another and by slotting the segment of computer bus of a motor start-up module onto the computer bus connector 650;
d) attaching an input-output jumper to each free linear connector 610 and a male or female end jumper to the free end of the computer bus 142; and
e) installing the drawers 138 in each motor start-up module.

In practice, the order of steps a) to e) may be different. In particular, steps b), c) and d) may be reversed and step a) may be carried out at any other time. However, step e) is always subsequent to steps a) to c).

In particular, as a variant, the structure 202 of a motor start-up module is first attached to the framework 164 of the motor start-up column, and then the step b) of assembling the motor start-up module 200 is carried out.

The connection phase allowing the commissioning of the electrical enclosure 100 is carried out after the assembly phase and comprises steps consisting in:
a) connecting the front connectors 650 of the computer bus connector 650 to the communication module 134;
b) connecting the connection terminal blocks 510 of each input-output module 206 of each motor start-up module 200 to the electrical loads 104, so as to connect the sensors of the electrical load to the input-output module and to supply the electrical load with second auxiliary voltage; and
c) connecting the external connection modules 208 to the electrical loads 104 with the cables 139, so as to supply the electrical loads 104 with the main electrical power supply.

In practice, the connection of the main electrical power supply to the electrical loads 104 only requires the connection of the cables 139.

Thus, the electrical enclosure 100 described here, and more particularly the motor start-up column 110, is advantageous, since:
all of the connections required for the commissioning of the electrical enclosure 100 are made in the connection region 158. This is advantageous, since it simplifies the connections of the electrical enclosure. In particular, no connection is required in the functional region 156.
a large number of connections internal to the enclosure are made by slotting or plugging connectors in, which is simpler than setting up electrical connection cables.
the electrical cables connected in the electrical enclosure all come from the connection region 158. Thus, their management is simpler: when the electrical enclosure 100 comprises a cabling region 160, like in FIG. 3, all of these cables may be grouped together in a cable harness in this cabling region, and when the electrical enclosure 100 does not comprise a cabling region 160, like in FIG. 5, all of these cables may be grouped together in a cable harness which exits from the enclosure 100 via its back face F2.

The orientation of the elements in a motor start-up module 200 described above relates to a motor start-up module arranged in a connection column located to the right of an electrical distributing column, in FIGS. 1 to 5.

In practice, the motor start-up module 200 described above may also be arranged in a connection column located to the left of an electrical distributing column, in FIGS. 1 to 5. For that, the motor start-up module 200 is simply rotated by 180 degrees about an axis parallel to the transverse Y-axis.

Thus, a motor start-up module 200 has no favoured orientation: the protection unit 140, the segment of computer bus 204, each drawer 138, each input-output module 206 and each external connection module 208 are configured to operate regardless of their spatial orientation.

For example, a drawer 138 of a connection column located to the left of an electrical distributing column will be arranged such that its base 328 is arranged at the top and its cover at the bottom. Since all of the elements contained in a drawer 138 are attached to the base 328, this arrangement does not affect the operation of the drawer. This arrangement does not affect the cooling of the drawer by the air flow FL1 either, since the air flow FL1 is horizontal and is therefore not affected by a change in orientation. Such an arrangement is visible in FIG. 1.

This operation of a motor start-up module 200 regardless of the orientation of this module is advantageous for a number of reasons:
it makes it possible to use identical parts for a connection column located to the left or to the right of an electrical distributing column, which is economical and facilitates the design of an enclosure 100; and
it makes it possible to have two connection columns on each side of an electrical distributing column 108—so as to form a functional column 111—which makes it possible to share the electrical distributing column between two connection columns, which is economical and makes it possible to decrease the size of the enclosure 100.

Similarly, a communication module 134 has no favoured orientation and with respect to the orientation described in this disclosure, a module installed in a connection column located to the left of an electrical distributing column will be rotated by 180 degrees about an axis parallel to the transverse Y-axis, in the same way as the computer bus connector 650 which is attached thereto.

The interior arrangement of the left-hand and right-hand connection column of FIGS. 1 to 5 is therefore symmetrical in relation to the plane P2 visible in FIG. 2.

Additionally, the control circuit board 364 of a drawer 138 is configured to detect the orientation of the drawer 138, for example using a sensor integrated into the board, and to control the display 302 such that the information displayed thereon is oriented so as to be easily readable from the exterior of the enclosure 100. The display 302 is therefore configured to adapt the orientation of the information displayed thereon to the orientation of the drawer 138.

As a variant (not shown) of the invention, the electrical enclosure 100 does not comprise any motor start-up modules and the protection unit, the segment of computer bus, the monitoring-and-control drawers, the input-output modules and the external connection modules are directly arranged in the electrical enclosure 100, attached to the framework 164.

Figure 41:
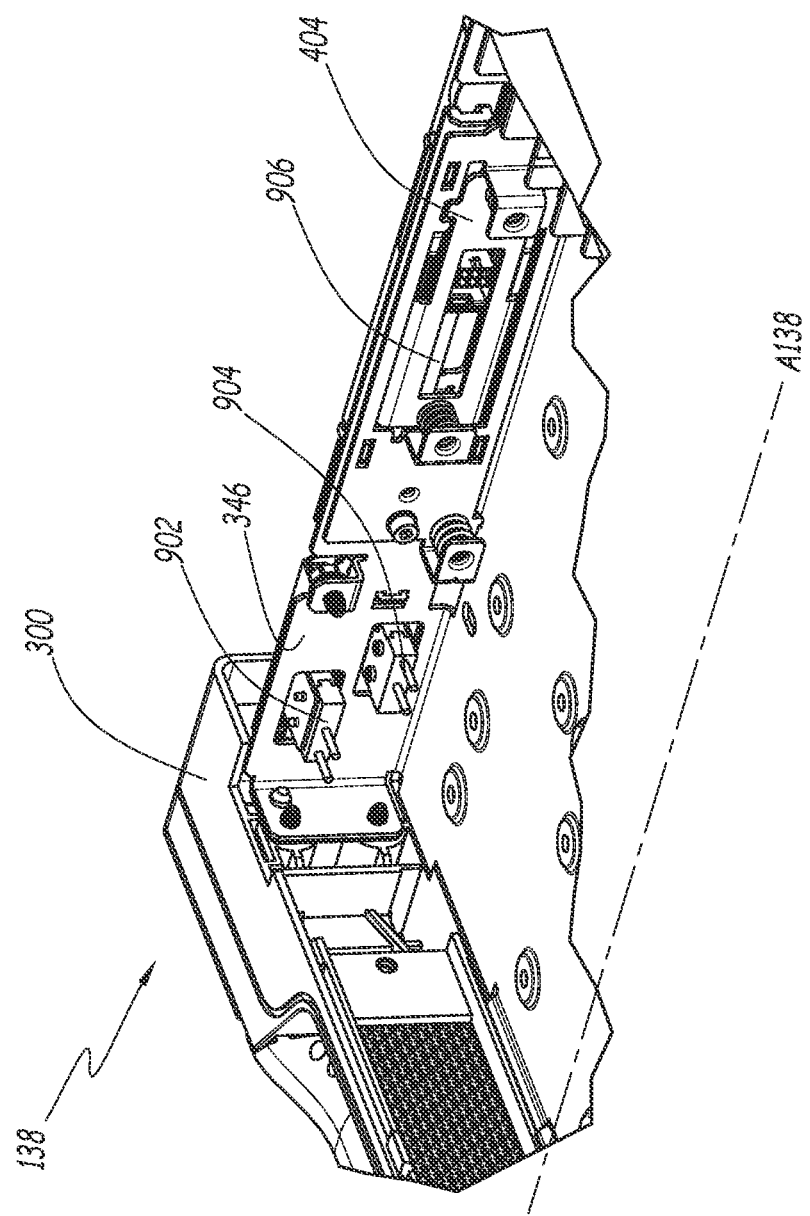
FIG. 41 is a perspective view of a third monitoring-and-control drawer belonging to an enclosure according to one of FIGS. 1 to 5, this third drawer being in accordance with the invention.
Figure 42:
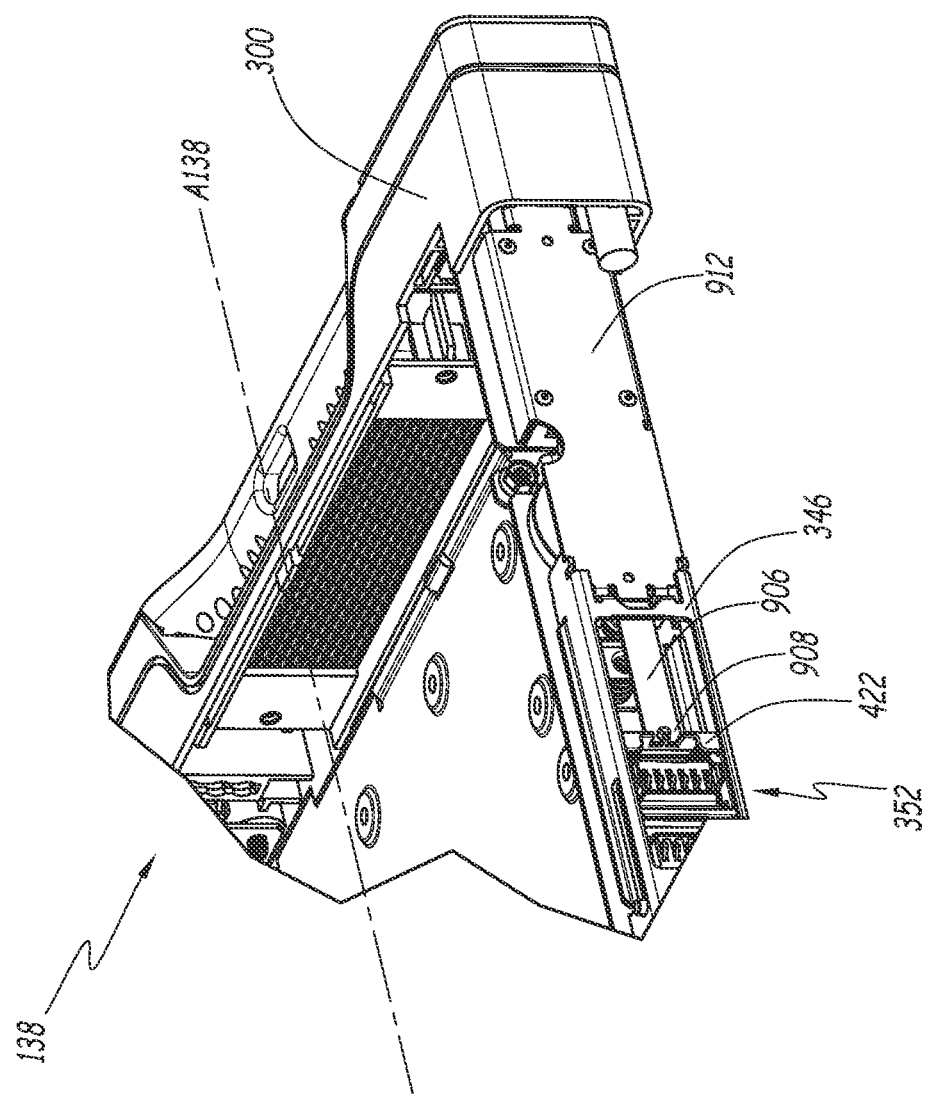
FIG. 42 is a perspective view of the monitoring-and-control drawer of FIG. 41, viewed from another angle.

In FIGS. 41 and 42, a drawer 138 of height equal to 1U is shown without its cover 330. This drawer is similar to the drawer shown in FIGS. 15 to 17 but comprises, in addition, a position detection module 900 which is shown alone in FIG. 43.

In what follows, those elements of the drawer 138 of FIGS. 41 and 42 which are analogous to those of the drawer 138 shown in FIGS. 15 to 17 bear the same references and operate in the same way. In what follows, mainly the differences between the drawer of FIGS. 15 to 17 and the drawer of FIGS. 41 and 42 are described. In addition, if a component is mentioned in the following description of the drawer 138 without being shown in FIGS. 41 and 42, it corresponds to the same element shown in FIGS. 1 to 40.

In FIGS. 41 and 42, the functional elements 362 and the control circuit board 364 of the drawer 138 are not shown.

The position detection module 900 is attached to the base 328 of the drawer 138. In this example, the position detection module 900 is attached to one of the two lateral structures 346, preferably to the lateral structure that does not comprise the mechanical lock 820. As a variant, the position detection module 900 is attached to the same lateral structure as the mechanical lock 820.

The position detection module 900 comprises detectors that are intended to detect when the drawer 138 is in the test position and to detect when the drawer is in the operating position. In this example, the position detection module comprises two detectors 902 and 904. The two detectors 902 and 904 are connected to the control circuit board 364, so as to transmit information on the position of the drawer 138 to the control circuit board.

The position detection module 900 also comprises an actuator 906, intended to actuate the detectors 902 and 904. The actuator 906 is, in this example, a control rod. The control rod 906 comprises a first end 908 and a second end 910.

The first end 908 is attached to the mobile contact 352 of the lateral structure 346 to which the position detection module 900 is attached. More precisely, the first end is attached to the frame 422 of the mobile contact 352. Thus, the first end 908 is secured to the frame 422 such that a translation of the frame 422 along the Y-axis leads to a translation of the control rod 906 along the Y-axis, i.e. along the longitudinal axis A138 of the drawer. In other words, the control rod 906 is mobile in translation with respect to the lateral structure 346 along the longitudinal axis A138 of the drawer.

The translation of the control rod 906 with respect to the lateral structure 346 is advantageously guided by a fixed structure 912 of the position detection module 900, which comprises in particular guides 914 at the level of the second end 910.

Figure 43:
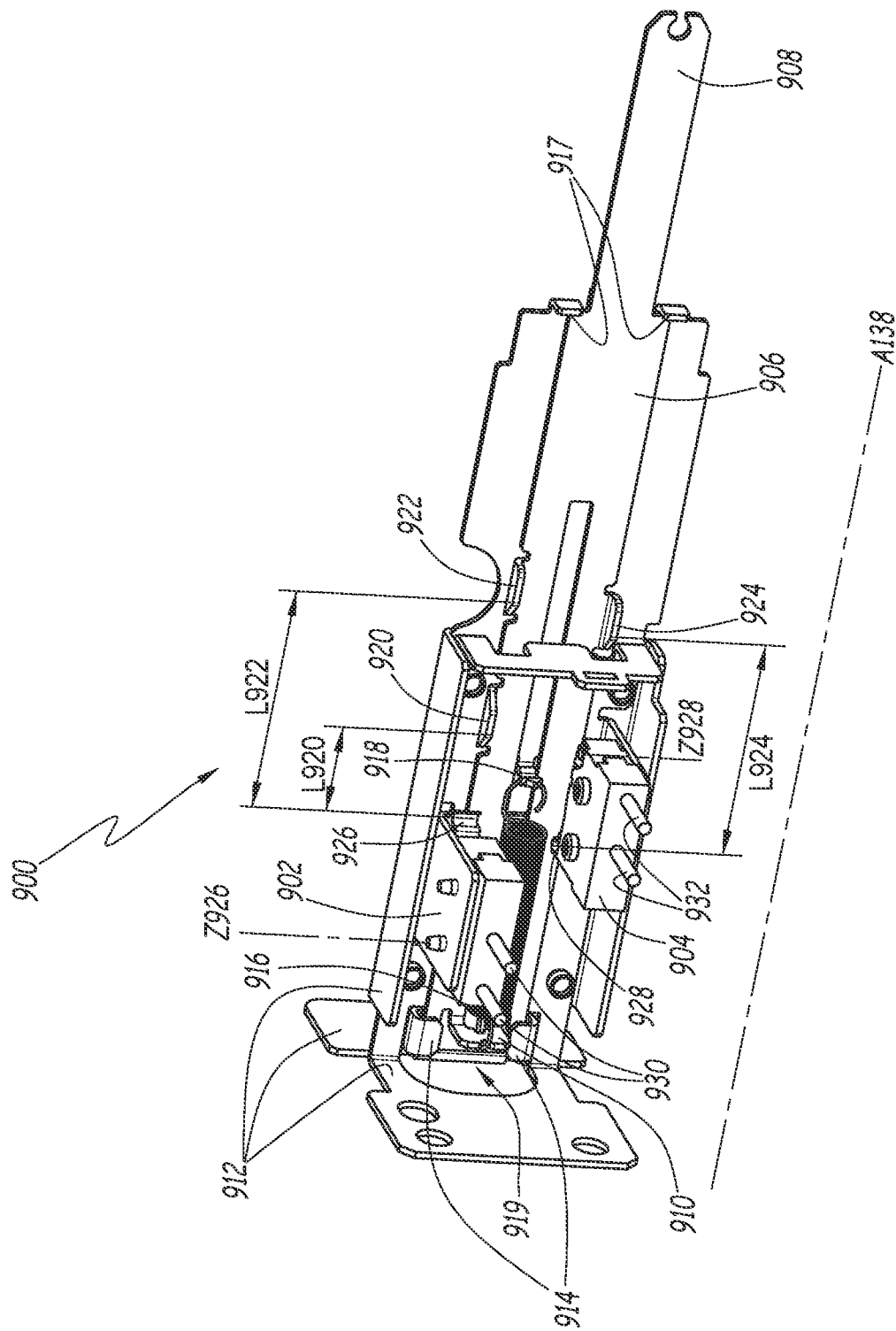
FIG. 43 is a perspective view of a position detection module belonging to the monitoring-and-control drawer of FIGS. 41 and 42.

The fixed structure 912 is attached to the lateral structure 346, for example by screwing. In addition, in this example, the fixed structure 912 comprises two portions joined to one another, for example by riveting. In FIG. 43, the various portions of the fixed structure are denoted by the same reference 912.

Advantageously, the position detection module 900 comprises an elastic return member 916. The elastic return member 916 connects the fixed structure 912 to the control rod 906 such that, in the absence of other forces being applied to the control rod, the control rod is returned to a position that corresponds to the position shown in FIG. 43. In other words, the control rod 906 has a stable position, or rest position, which is that shown in FIG. 43, and the elastic return member 916 tends to return the control rod to that stable position.

Here, the control rod 906 comprises a stop 917, which bears against the fixed structure 912 when the control rod is in the rest position, and which prevents the control rod from moving beyond its rest position. Here, the stop 917 is formed of two tongues folded at right angles with respect to the main portion of the control rod.

In this example, the elastic return member 916 is a tension spring, a first end of which is attached to a hook 918 of the fixed structure 912 and a second end of which is attached to the second end 910 of the control rod.

In practice, the control rod 906 is in the rest position when the drawer 138 is between its disconnected position and its engagement position, and the control rod moves along the axis A138 with respect to the lateral structure 346 when the drawer is between its engagement position and its operating position, the same as for the frame 422.

In this example, the position detection module 900 is oriented such that the second end 910 of the control rod 906 is located close to the frontal portion 300 of the drawer 138 and such that the first end 908 is at a distance from the frontal portion of the drawer. During the movement of the control rod 906, the second end 910 moves away from the detectors 902 and 904 and comes closer to the frontal portion 300, until it is located in the frontal portion, extending through a window 919 made in the fixed structure 912. In practice, an empty space is provided in the frontal portion 300 to accommodate the presence of the second end 910.

The control rod 906 comprises two top cams 920 and 922 and a bottom cam 924. The two top cams 920 and 922 are located in one and the same plane parallel to the axis A138, i.e. they are aligned along the Z-axis, and are offset from the bottom cam 924 along the Z-axis. The top cams 920 and 922 are provided to actuate the detector 902 and the bottom cam 924 is provided to actuate the detector 904.

L920 denotes a length between the top cam 920 and an actuating element 926 for the detector 902, L922 denotes a length between the top cam 922 and the actuating element 926, and L924 denotes a length between the bottom cam 924 and an actuating element 928 for the detector 904, the lengths L920, L922 and L924 being measured along the axis A138. Advantageously, the length L922 is equal to the length L924.

The lengths L920, L922 and L924 have their respective maximum values when the control rod 906 is in the rest position, i.e. when the drawer 138 is between its disconnected position and its engagement position.

The length L920 is zero when the drawer 138 is in the test position. Thus, when the drawer is in the test position, the top cam 920 is in contact with the actuating element 926 for the detector 902, which actuates the detector 902 and results in a detection signal being sent from the detector 902 to the control circuit board 364, thus informing the control circuit board that the drawer is in the test position. In other words, the control circuit board 364 detects that the drawer 138 is in the test position when it receives a signal from the detector 902 actuated by the top cam 920.

The lengths L922 and L924 are zero when the drawer 138 is in the operating position. Thus, when the drawer is in the operating position, the top cam 922 is in contact with the actuating element 926 for the detector 902 and the bottom cam 924 is in contact with the actuating element 928 for the detector 904, which simultaneously actuates the detectors 902 and 904 and results in two detection signals being sent from the detectors 902 and 904 to the control circuit board 364, thus informing the control circuit board that the drawer is in the operating position. In other words, the control circuit board 364 detects that the drawer 138 is in the test position when it simultaneously receives a signal from the detector 902 and from the detector 904 actuated by the top 922 and bottom 924 cams.

When the drawer 138 is in an intermediate position between the test position and the operating position, the top cams and the bottom cam are not in contact with the actuating elements for the detectors, and no detection signal is sent to the control circuit board 364.

In this example, the detectors 902 and 904 are dry contact switches and the actuating elements 926 and 928 are metal strips mounted so as to pivot about respective axes Z926 and Z928, which are parallel to the Z-axis.

The detector 902 is connected to the control circuit board 364 by two wires 930, which are shown in a simplified manner in FIGS. 41 to 43. The two wires 930 form a loop beginning and ending at the level of the control circuit board, and going via the detector 902 in such a way that the metal strip 926 of the detector may open or close this loop. In practice, the loop formed by the two wires 930 is closed when the metal strip 926 is in contact with the top cam 920 or the top cam 922, since the top cams then push the metal strip 926 and make it pivot about the axis Z926, and the loop is open when the metal strip is not in contact with a top cam. When the loop formed by the wires 930 is closed, the control circuit board 364 then receives a detection signal from the detector 902.

In the same way, the detector 904 is connected to the control circuit board 364 by two wires 932, shown in a simplified manner in FIGS. 41 to 43, which form a loop that is closed when the metal strip 928 is in contact with the bottom cam 924 and is open when the metal strip is not in contact with the bottom cam. When the loop formed by the wires 932 is closed, the control circuit board 364 then receives a detection signal from the detector 904.

In this example, the control circuit board 364 is configured to detect that the drawer 138 is in the test position when a detection signal from the detector 902 is received, and to detect that the drawer 138 is in the operating position when detection signals from the detectors 902 and 904 are received simultaneously.

The position detection module 900 is particularly advantageous because it allows the operation of the drawer 138 to be made more reliable. Specifically, by virtue of the detection of the position of the drawer 138 provided by the position detection module 900, the controlling of the functional elements 362 by the control circuit board 364 takes the actual position of the drawer into account. The controlling of the functional elements 362 is thereby improved.

In addition, the operation of the position detection module 900 is particularly reliable because the position detection module is fully integrated into the drawer 138, and because the position of the drawer is detected only on the basis of the position of one of the mobile lateral contacts 352, by detecting the position of this lateral contact with respect to the base 328 of the drawer. In other words, the detection of the position of the drawer does not require any interaction with a fixed structure of the motor start-up module 200 or of the electrical enclosure 100 and the position detection module 900 is isolated in the drawer 138. This is particularly advantageous because the detection of the position of the drawer 138 is then insensitive to potential disruptions in the position of the drawer 138 with respect to the electrical enclosure 100 around its test and operating positions, which might otherwise disrupt the detectors 902 and 904. Such disruptions are, for example, caused by vibrations or by impacts received by the drawer.

As a variant, the operating position is detected when the control circuit board 364 only receives a detection signal from the detector 904. In such a variant, the control rod 906 does not comprise a second top cam 922, because the actuation of the detector 902 in the operating position is not required.

As a variant, the orientation of the detectors 902 and 904 is different from the orientation shown in FIGS. 41 to 43, and the position of the top 920 and 922 and bottom 924 cams is adjusted accordingly.

As a variant, the position detection module 900 does not comprise an elastic return member 916. In such a variant, the control rod 906 is returned to its rest position by the tension springs 446, which tend to bring the frame 422, and therefore the control rod, into the rest position.

As a variant, the detectors 902 and 904 are induction switches, or Hall effect switches which detect the position of the top 920 and 922 and bottom 924 cams.

As a variant, the position detection module 900 comprises a single detector 902 or 904 for detecting the test and operating positions.

As a variant, the drawer 138 comprises mobile contacts 352 which are mobile only along the longitudinal axis A138 of the drawer. In such a variant, the communication interfaces 353 protrude, for example, from the input-output modules 206 and the protection units 140, so as to come into contact with the mobile contacts 352 when the drawer 138 is in the test position, and to drive the movement of the mobile contacts with respect to the base 328 when the drawer is moved from its test position to its operating position. In such a variant, the operation of the position detection module 900 is unchanged.

The embodiments and the variants envisaged above may be combined to create new embodiments of the invention.

The invention claimed is:
1. A functional module for an electrical connection enclosure, the functional module comprising:
   a support structure,
   a protection unit, attached to the support structure and configured to be supplied electricity by an electricity source,
   at least one monitoring-and-control drawer,
   at least one external connection module, each of the at least one external connection module being attached to the support structure and being associated with one of the at least one monitoring-and-control drawer,
   at least one pair of rails, each of the at least one pair of rails being associated with one of the at least one monitoring-and-control drawer to allow said at least one monitoring-and-control drawer to be inserted into and removed from the functional module and the electrical connection enclosure by sliding relative to the support structure,
   wherein:
   each of the at least one monitoring-and-control drawer comprises a frontal portion, a back portion and functional elements, the functional elements generating heat,
   the frontal portion of each of the at least one monitoring-and-control drawer comprises at least one ventilation grille;
   each of the at least one monitoring-and-control drawer comprises a back ventilation region formed at a level of the back portion;
   the heat generated by the functional elements of each of the at least one monitoring-and-control drawer is removed by an air flow flowing through said at least one monitoring-and-control drawer;

the air flow enters into each of the at least one monitoring-and-control drawer via each of the at least one ventilation grille in the frontal portion of said at least one monitoring-and-control drawer and exits from said at least one monitoring-and-control drawer via the back ventilation region of said at least one monitoring-and-control drawer;

each of the at least one monitoring-and-control drawer comprises a horizontal base on which the functional elements of said at least one monitoring-and-control drawer are attached, and a cover, the back portion of each of the at least one monitoring-and-control drawer is part of the horizontal base of said at least one monitoring-and-control drawer and comprises a group of upstream connectors, a group of downstream connectors and a ventilation orifice which is part of the back ventilation region of said at least one monitoring-and-control drawer, the upstream connectors of each of the at least one monitoring-and-control drawer are connected to the protection unit when said at least one monitoring-and-control drawer is in an operating position, so that said at least one monitoring-and-control drawer is configured to be supplied with first electrical power via the protection unit while being electrically protected by the protection unit, the downstream connectors of each of the at least one monitoring-and-control drawer are connected to a respective one of the at least one external connection module associated with said at least one monitoring-and-control drawer when said at least one monitoring-and-control drawer is in the operating position, so that said at least one monitoring-and-control drawer is configured to supply second electrical power to an electrical load via the respective one of said at least one external connection module, the functional elements of each of the at least one monitoring-and-control drawer are configured to control the electrical load electrically powered by said at least one monitoring-and-control drawer via the respective one of the at least one external connection module associated with said at least one monitoring-and-control drawer, and the ventilation orifice of each of the at least one monitoring-and-control drawer is located between the group of upstream connectors and the group of downstream connectors of said at least one monitoring-and-control drawer.

2. The functional module according to claim 1, wherein each of the at least one monitoring-and-control drawer is configured so that the air flow passes through said at least one monitoring-and-control drawer without significant change in direction.

3. The functional module according to claim 1, wherein each of the at least one monitoring-and-control drawer comprises at least one fan installed in order to force the air flow through said at least one monitoring-and-control drawer and arranged in the back ventilation region and/or on the at least one ventilation grille of the frontal portion of said at least one monitoring-and-control drawer.

4. The functional module according to claim 3, wherein each of the at least one monitoring-and-control drawer comprises a control circuit board and wherein the at least one fan of said at least one monitoring-and-control drawer are controlled by said control circuit board.

5. The functional module according to claim 1, wherein each of the at least one monitoring-and-control drawer comprises at least one radiator arranged on at least one of the functional elements of said at least one monitoring-and-control drawer and configured to improve exchange of the heat with the air flow.

6. The functional module according to claim 5, wherein each of the at least one monitoring-and-control drawer comprises at least one deflector configured to direct the air flow towards the at least one radiator of said at least one monitoring-and-control drawer.

7. An electrical connection enclosure, wherein the electrical connection enclosure comprises at least one of the functional module according to claim 1, wherein a back face of the electrical connection enclosure comprises ventilation grilles and wherein the air flow exiting from each of the at least one monitoring-and-control drawer of each of the at least one of the functional module exits from the electrical connection enclosure via the ventilation grilles of the back face of the electrical connection enclosure.

8. An electrical connection enclosure, wherein:
the electrical connection enclosure comprises at least one of the functional module according to claim 1;
the electrical connection enclosure comprises at least one chimney for escape of hot air;
the air flow from each of the at least one monitoring-and-control drawer of each of the at least one of the functional module exits into the at least one chimney for the escape of the hot air; and
the hot air from each of the at least one monitoring-and-control drawer of each of the at least one of the functional module escapes via an upper face of the at least one chimney.

9. The electrical connection enclosure according to claim 8, wherein the electrical connection enclosure comprises at least one extraction fan, each at least one extraction fan being arranged on the upper face of one of the at least one chimney.

* * * * *